(12) United States Patent
Kurihara et al.

(10) Patent No.: US 8,199,625 B2
(45) Date of Patent: Jun. 12, 2012

(54) LASER DRIVING DEVICE AND METHOD WITH CONTROL SIGNAL PATTERNS, REFERENCE PULSES, AND CHANGING PULSES

(75) Inventors: Tsutomu Kurihara, Kanagawa (JP); Motoi Kimura, Kanagawa (JP); Koichi Yokoyama, Kanagawa (JP)

(73) Assignee: Sony Corporation, Tokyo (JP)

(\*) Notice: Subject to any disclaimer, the term of this patent is extended or adjusted under 35 U.S.C. 154(b) by 33 days.

(21) Appl. No.: 12/659,318

(22) Filed: Mar. 4, 2010

(65) Prior Publication Data

US 2010/0260028 A1    Oct. 14, 2010

(30) Foreign Application Priority Data

Apr. 9, 2009    (JP) .................................. 2009-094634

(51) Int. Cl.
*G11B 7/00* (2006.01)
*G11B 7/0045* (2006.01)

(52) U.S. Cl. .................................................... 369/59.11

(58) Field of Classification Search .... 369/59.13–59.15, 369/59.23, 59.24, 59.26, 59.27, 124.04, 124.09
See application file for complete search history.

(56) References Cited

U.S. PATENT DOCUMENTS

| | | | |
|---|---|---|---|
| 2005/0025031 A1* | 2/2005 | Kodama et al. | 369/116 |
| 2005/0099917 A1* | 5/2005 | Nakajo | 369/53.2 |
| 2007/0206464 A1* | 9/2007 | Chang | 369/47.5 |
| 2008/0008066 A1* | 1/2008 | Rees et al. | 369/47.15 |
| 2010/0054102 A1* | 3/2010 | Kurihara et al. | 369/100 |
| 2010/0202273 A1* | 8/2010 | Kurihara et al. | 369/124.01 |
| 2010/0260029 A1* | 10/2010 | Kurihara et al. | 369/100 |
| 2010/0272138 A1* | 10/2010 | Chiba et al. | 372/30 |

FOREIGN PATENT DOCUMENTS

JP    2007-141406    6/2007

\* cited by examiner

*Primary Examiner* — Peter Vincent Agustin
*Assistant Examiner* — Mark Fischer
(74) *Attorney, Agent, or Firm* — Rader Fishman & Grauer, PLLC

(57) ABSTRACT

A laser driving system and method using a write strategy technique where a write strategy signal is generated based on a set of pulses that include timing information and power level information. The set of pulses originate from a set of transmission signals that embody spaces and marks for both starting and changing the set of pulses.

21 Claims, 41 Drawing Sheets

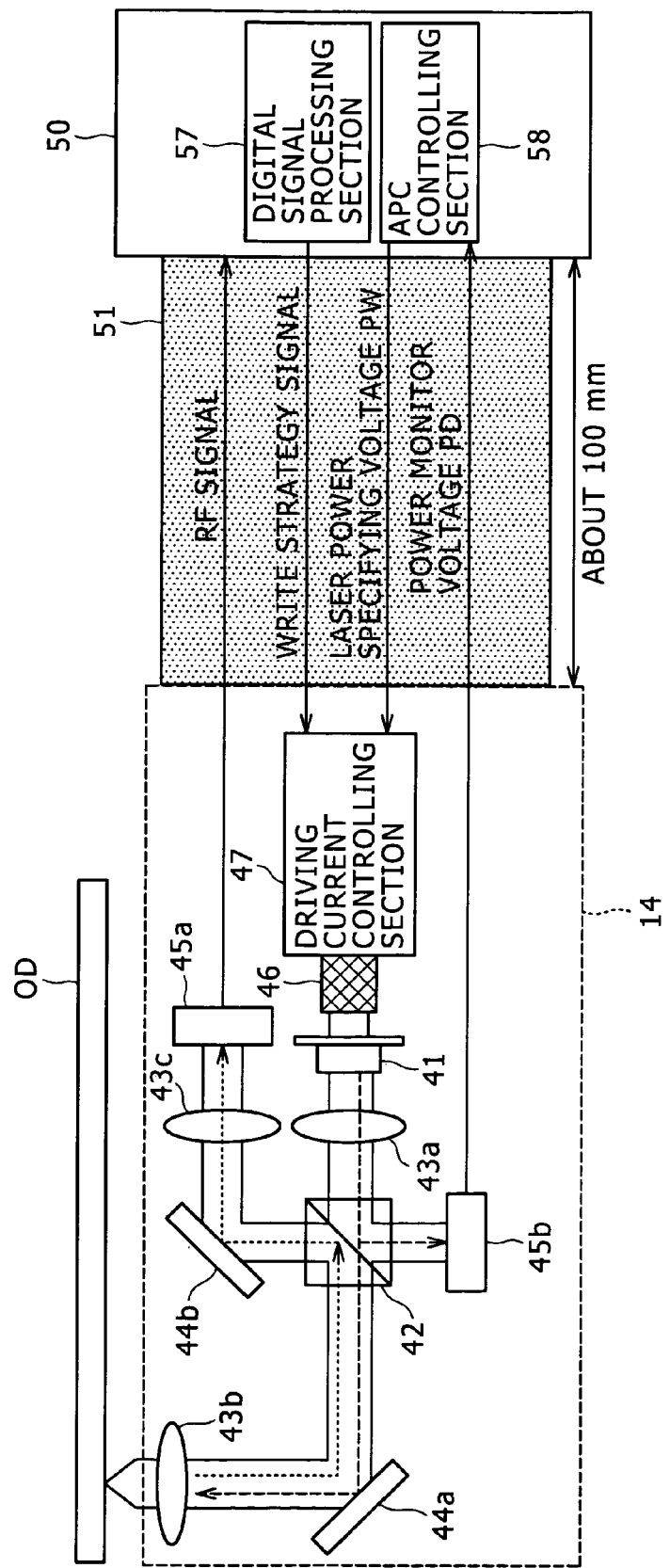

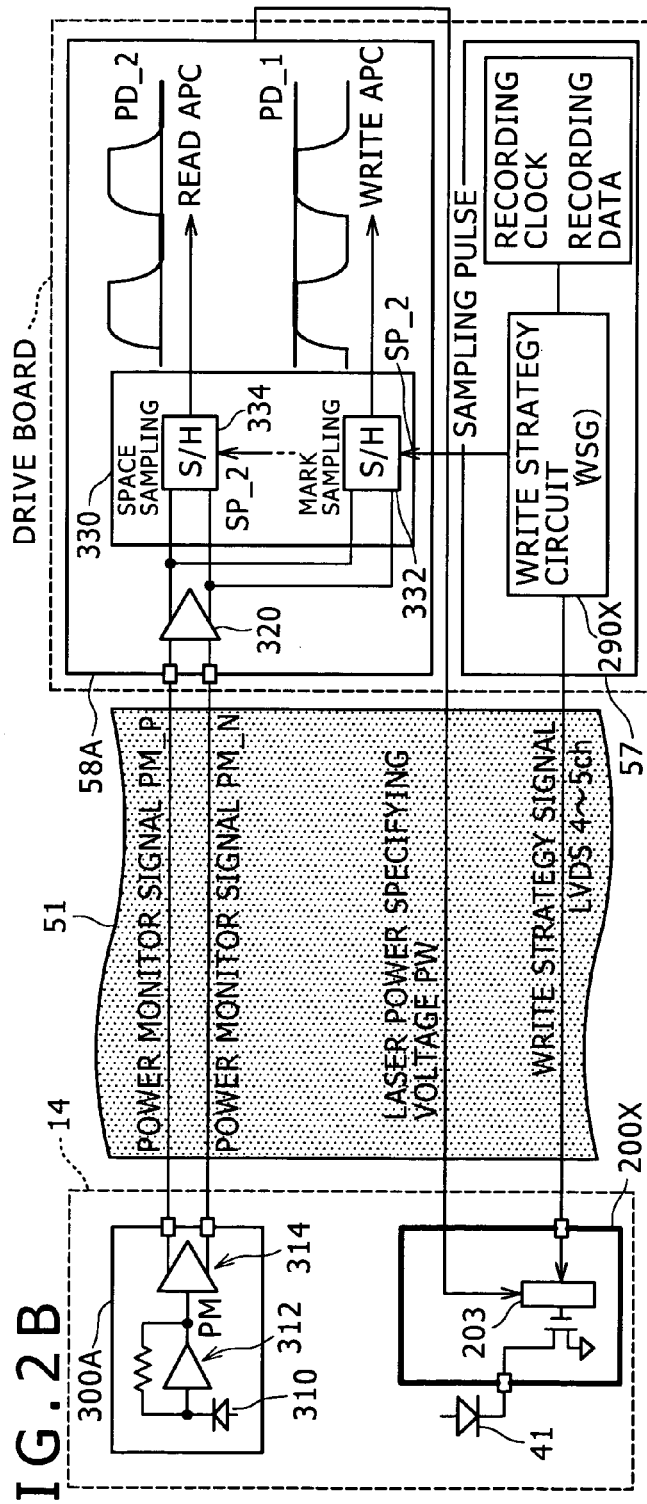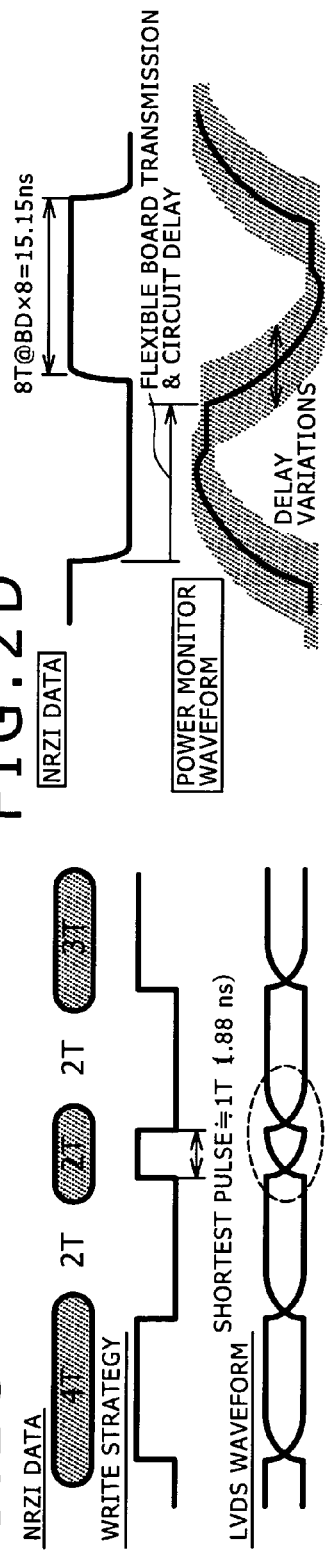

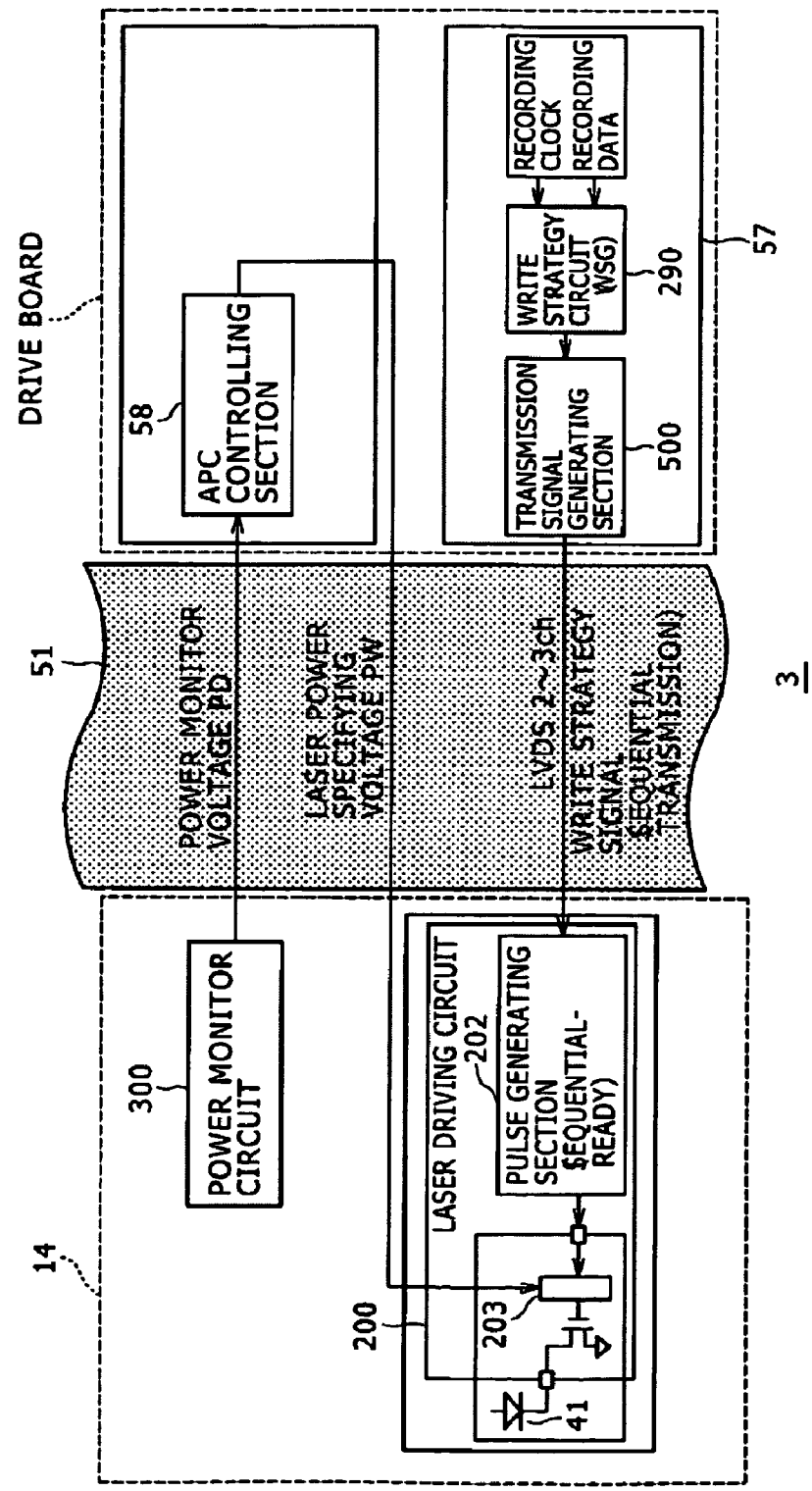

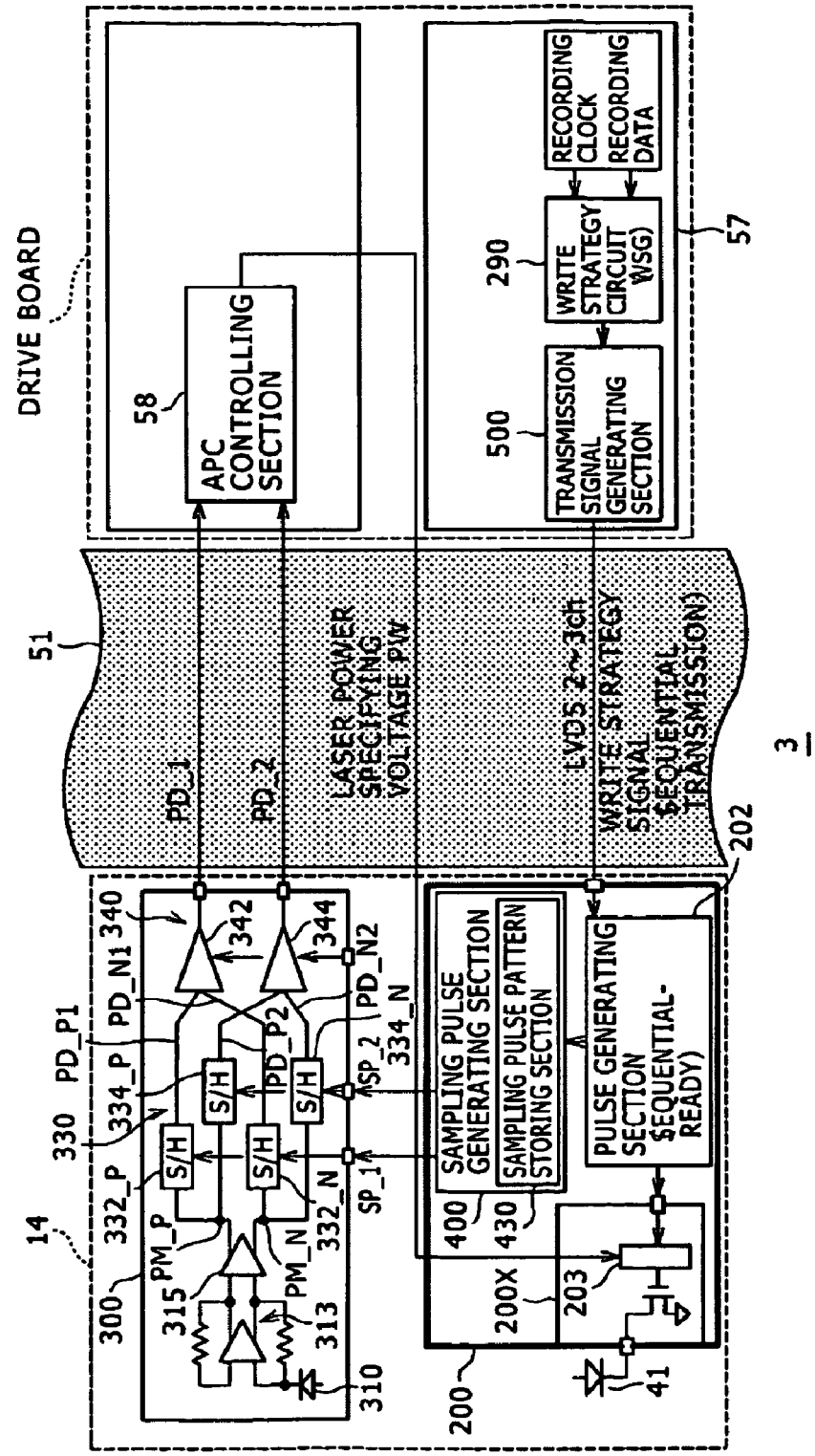

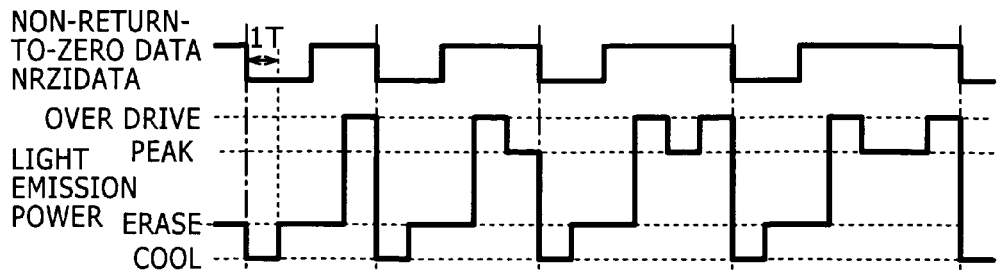
FIG.3C
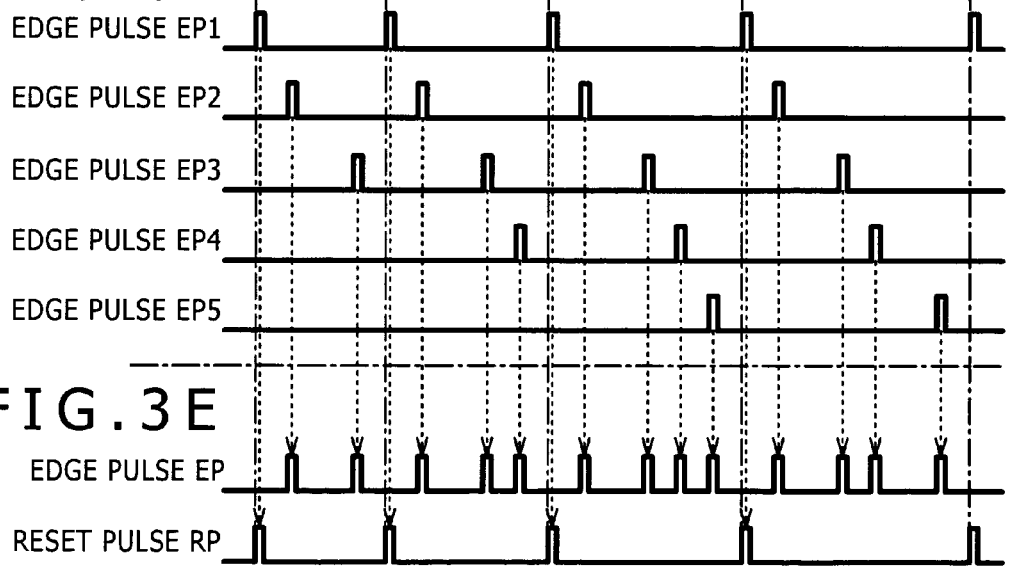
FIG.3D
FIG.3E
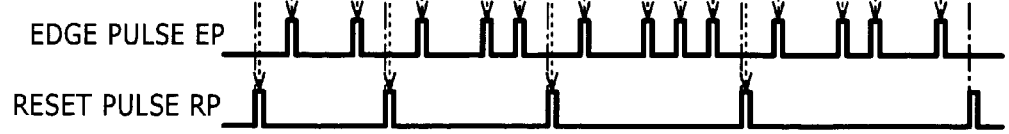
FIG.3F
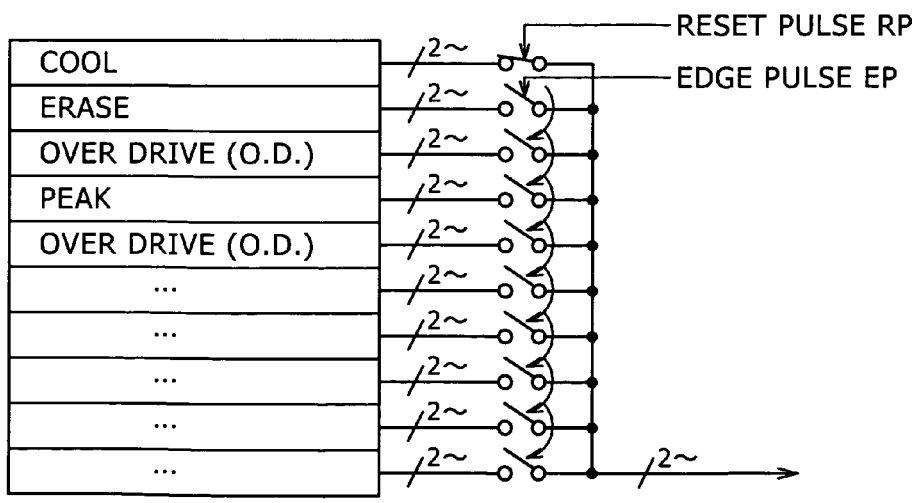

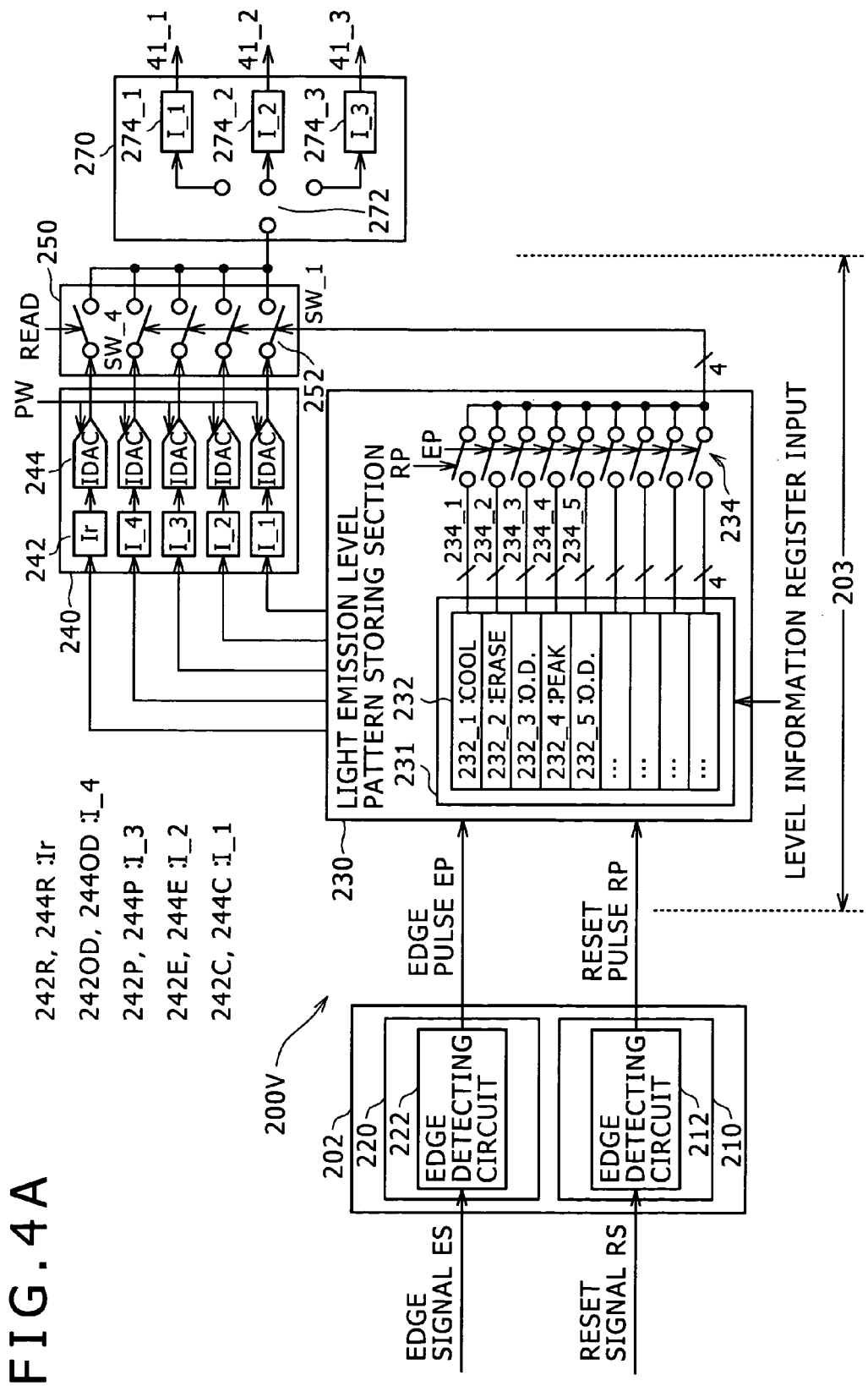

<SEQUENTIAL ACCESS MEMORY WITH RESET FUNCTION>

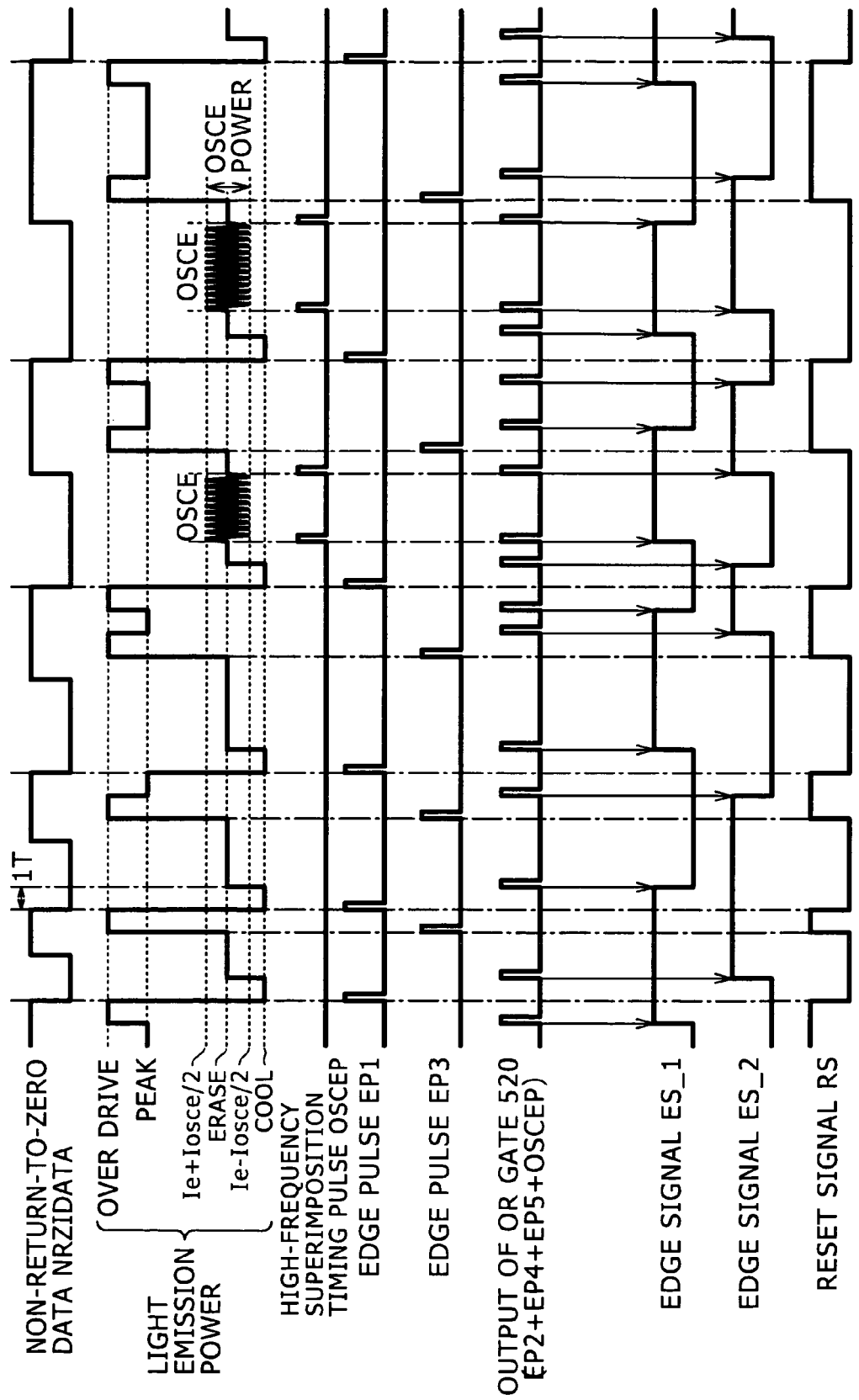

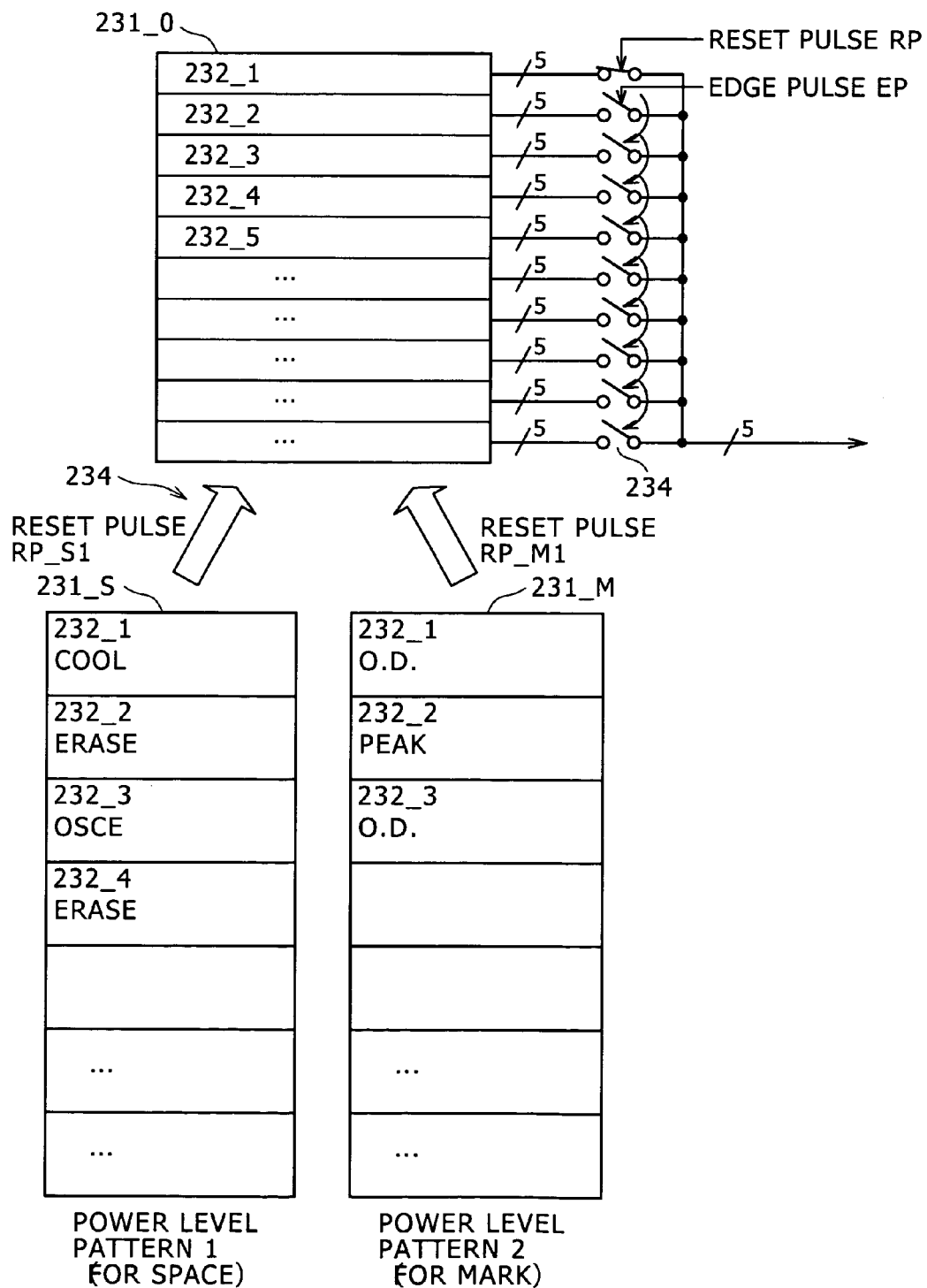

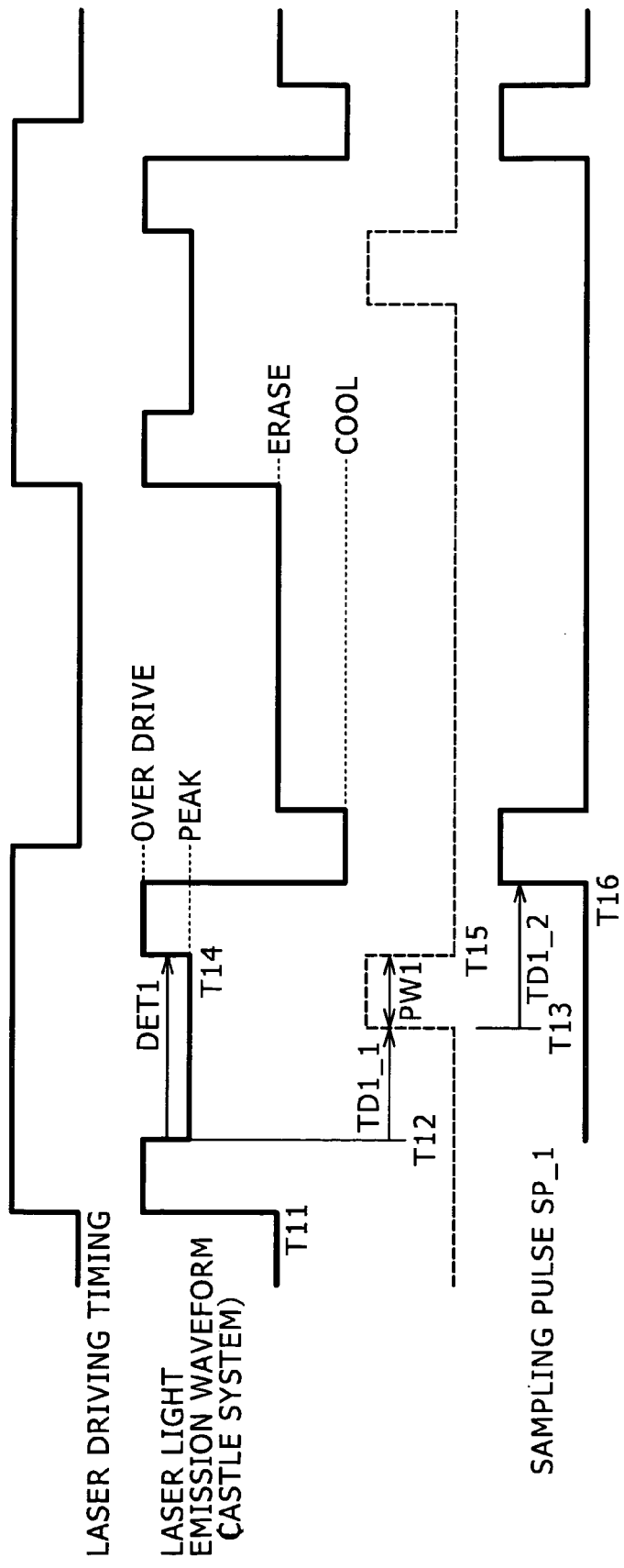

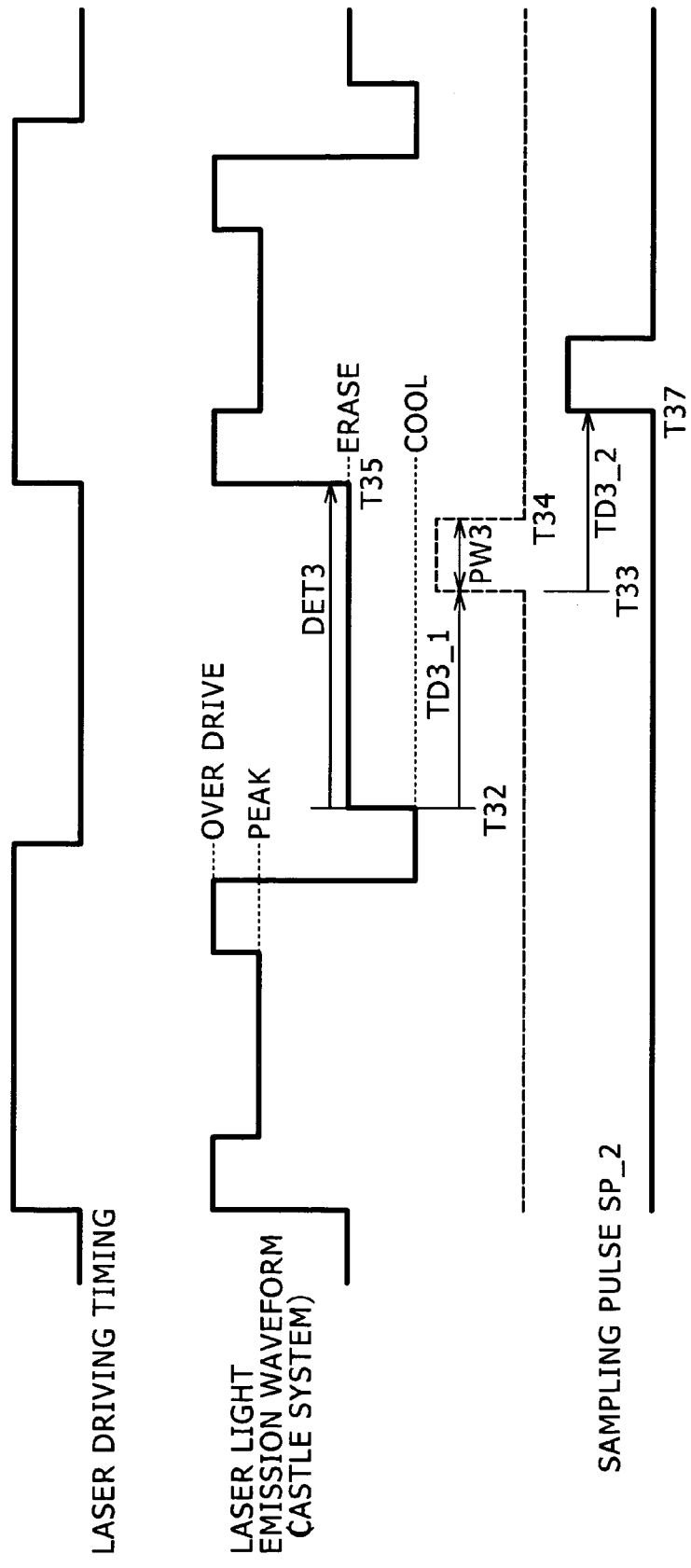

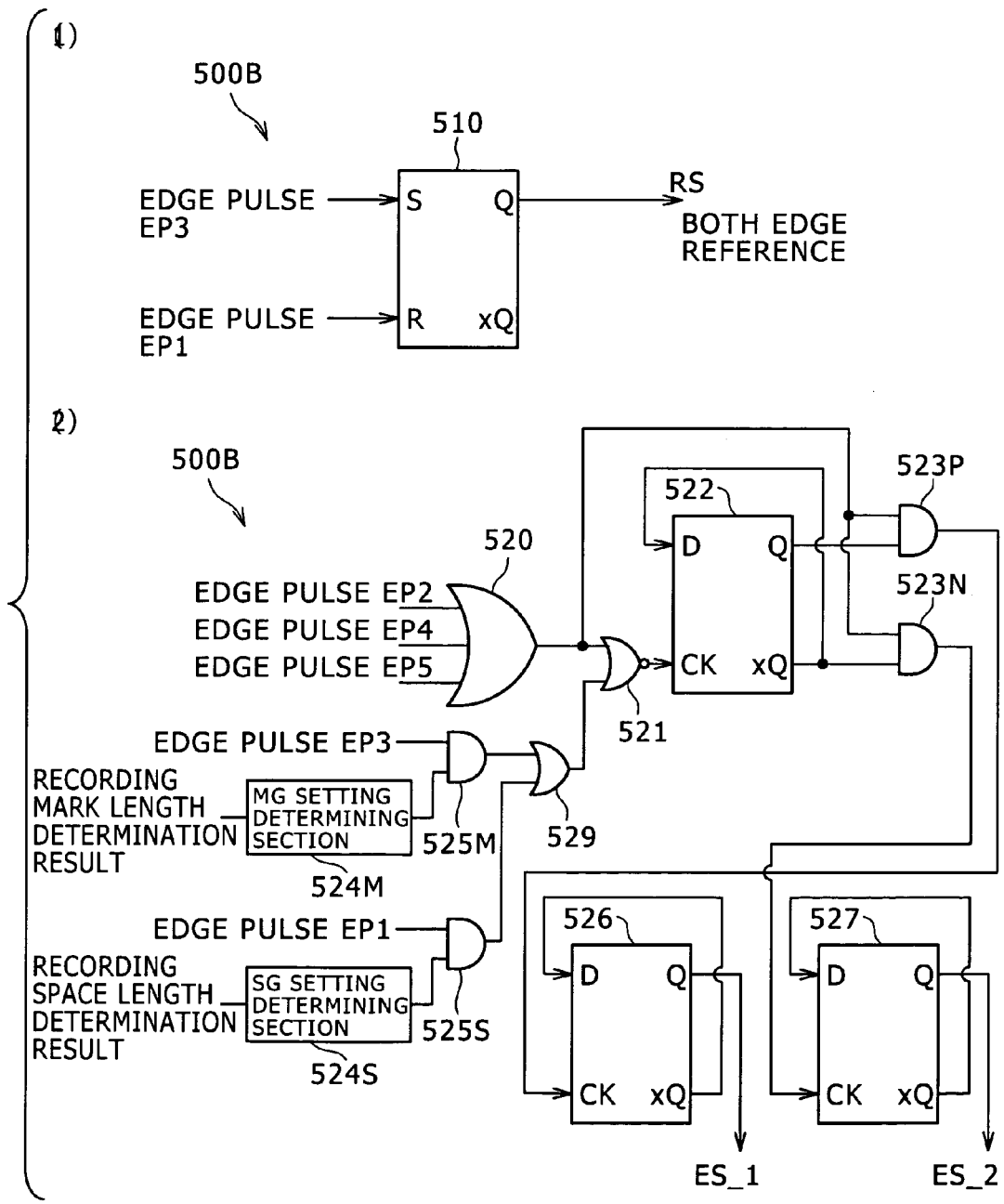

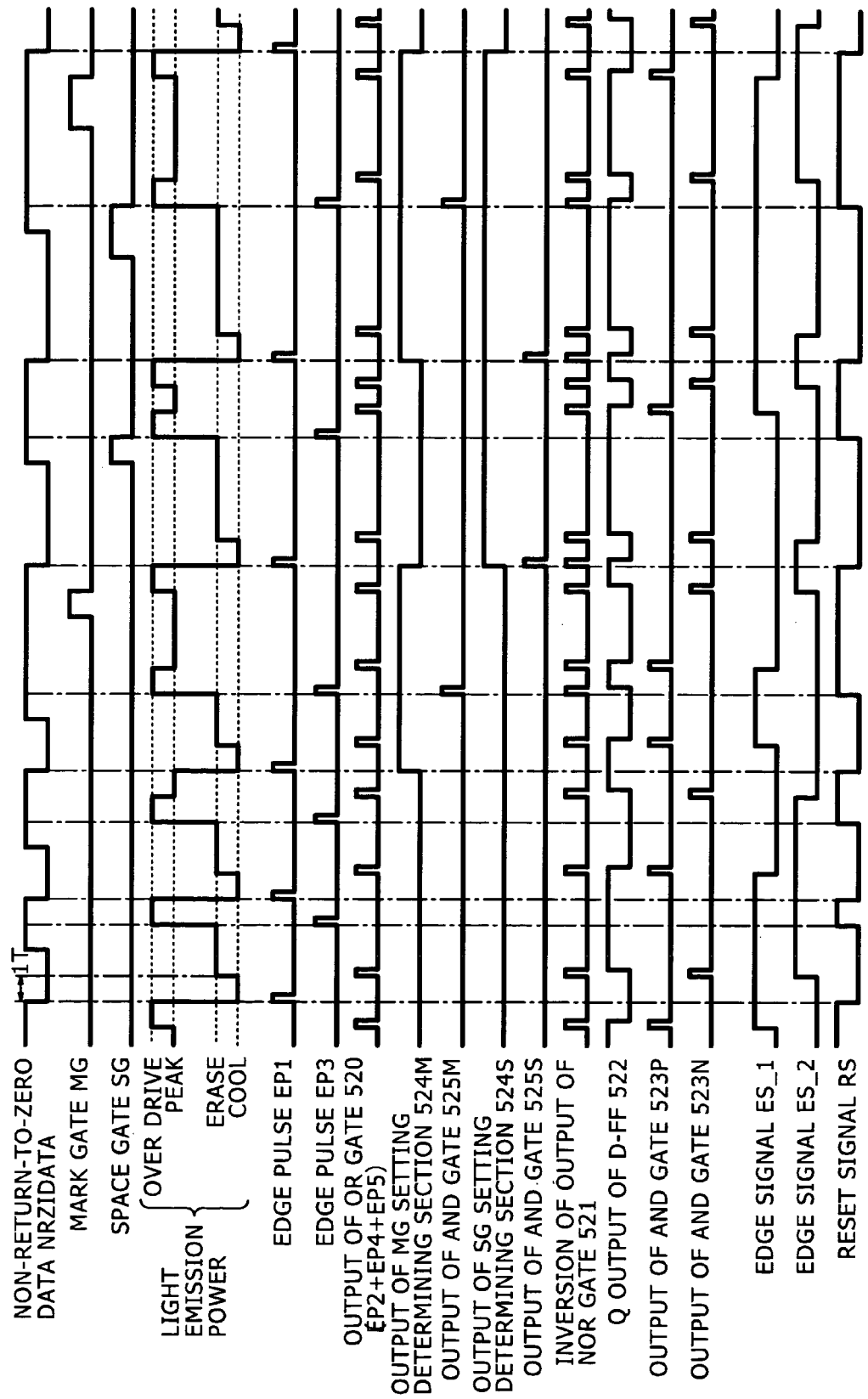

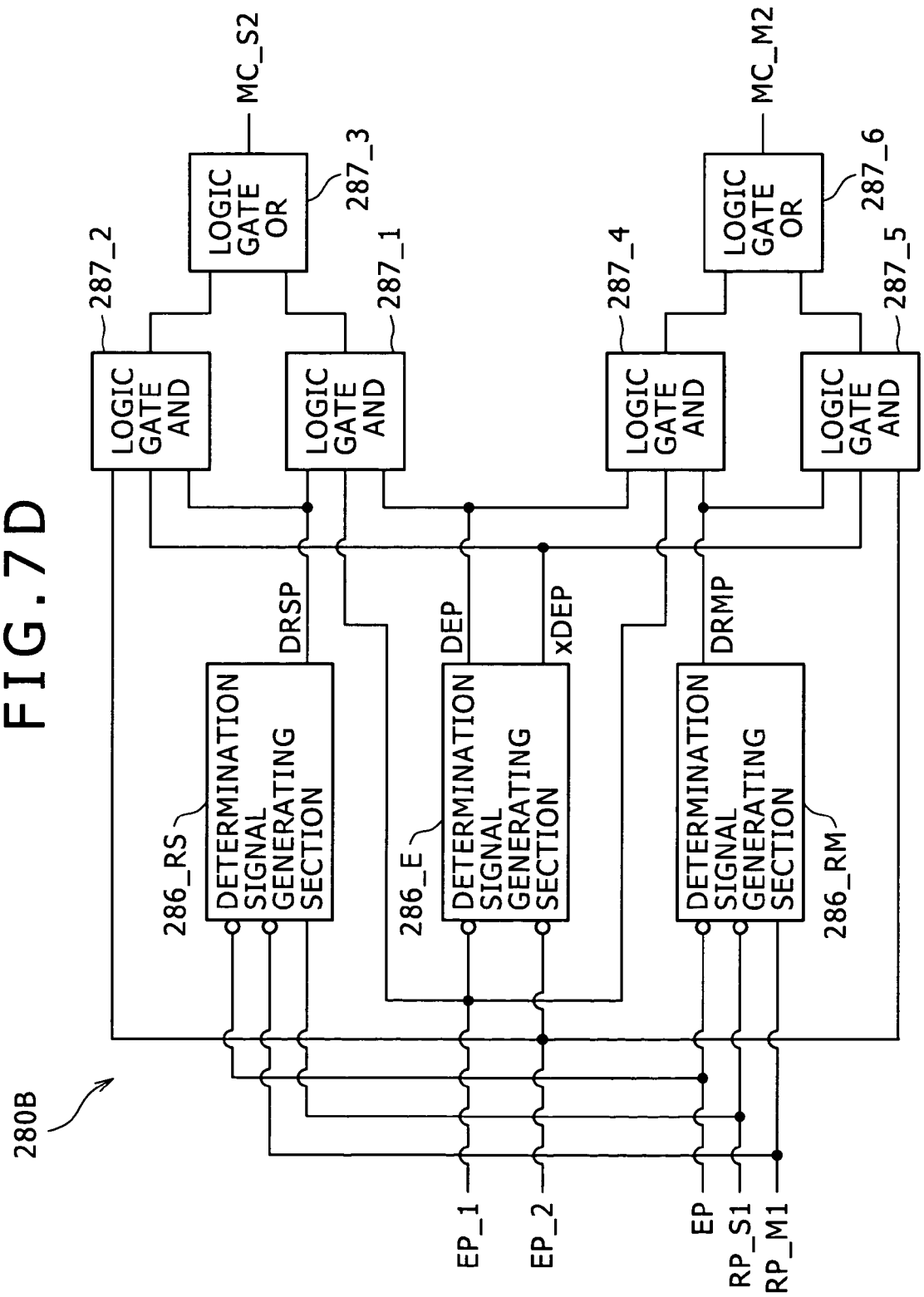

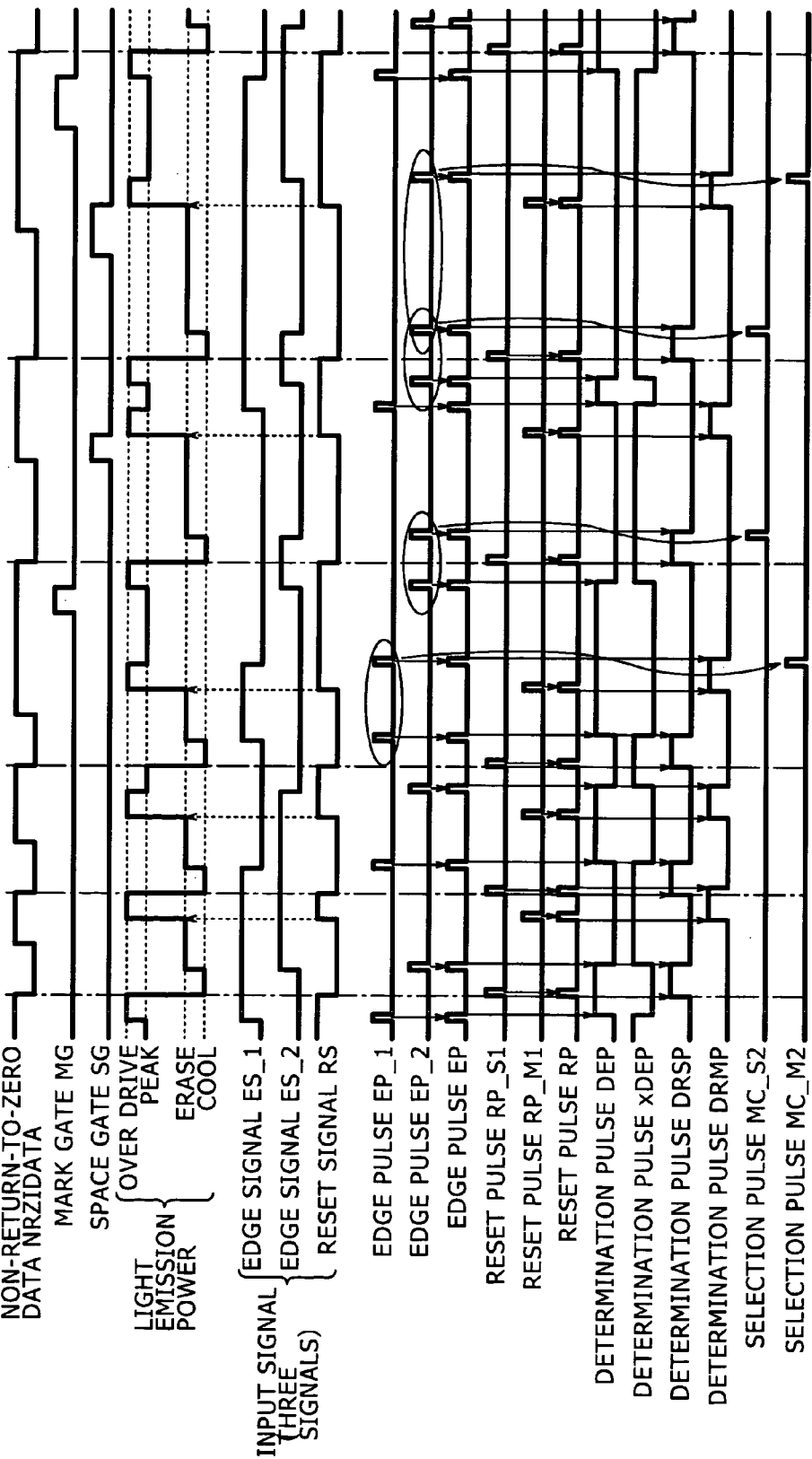

FIG.7H
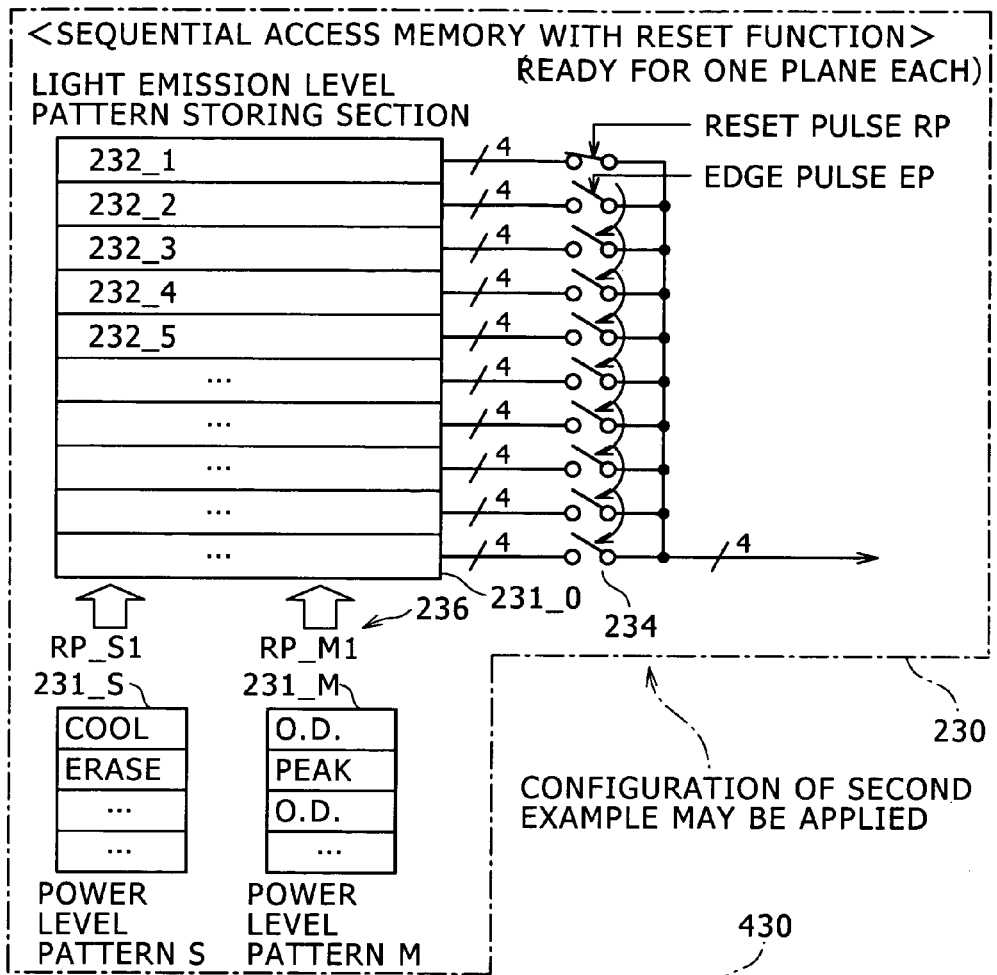
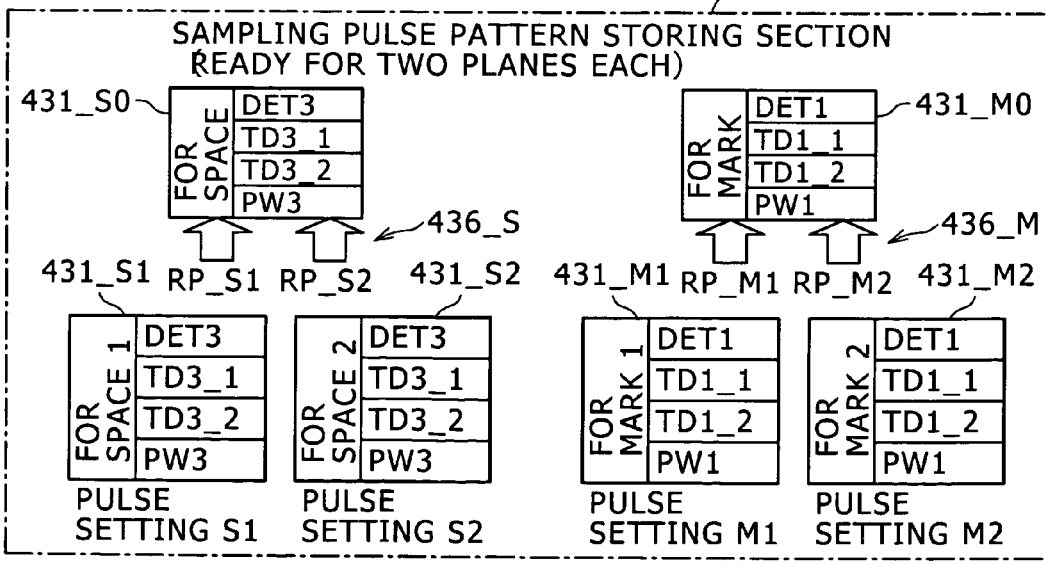

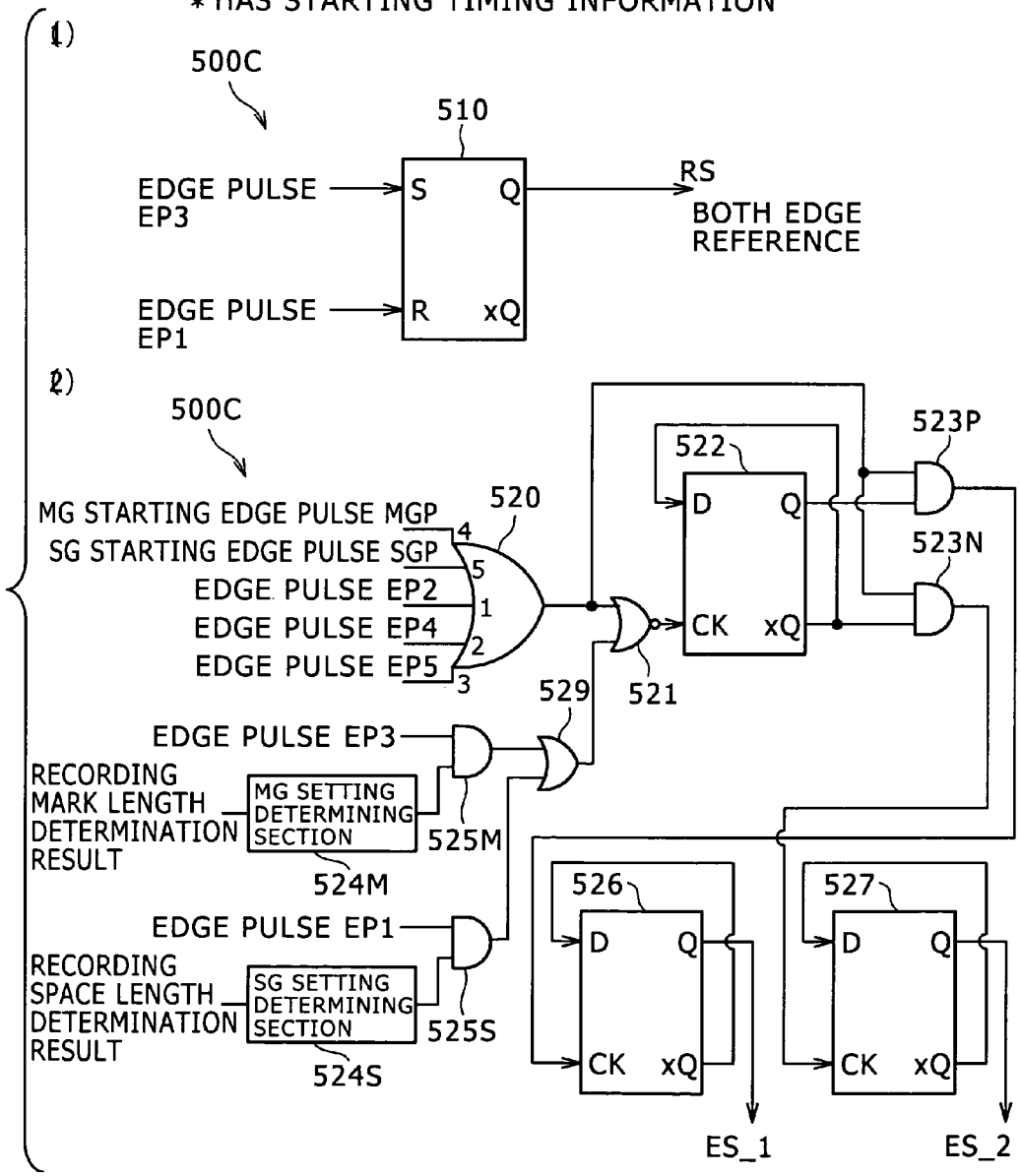

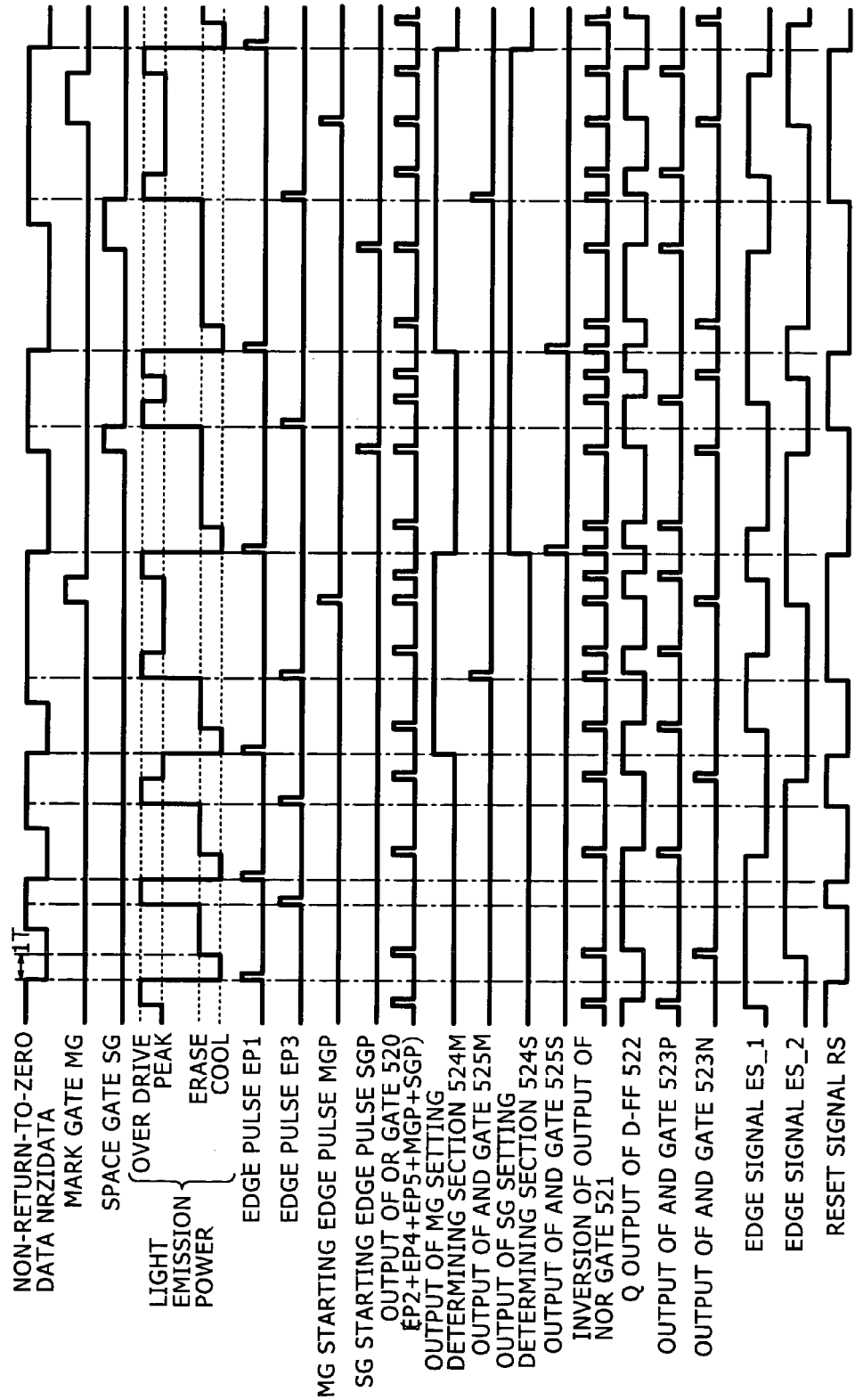

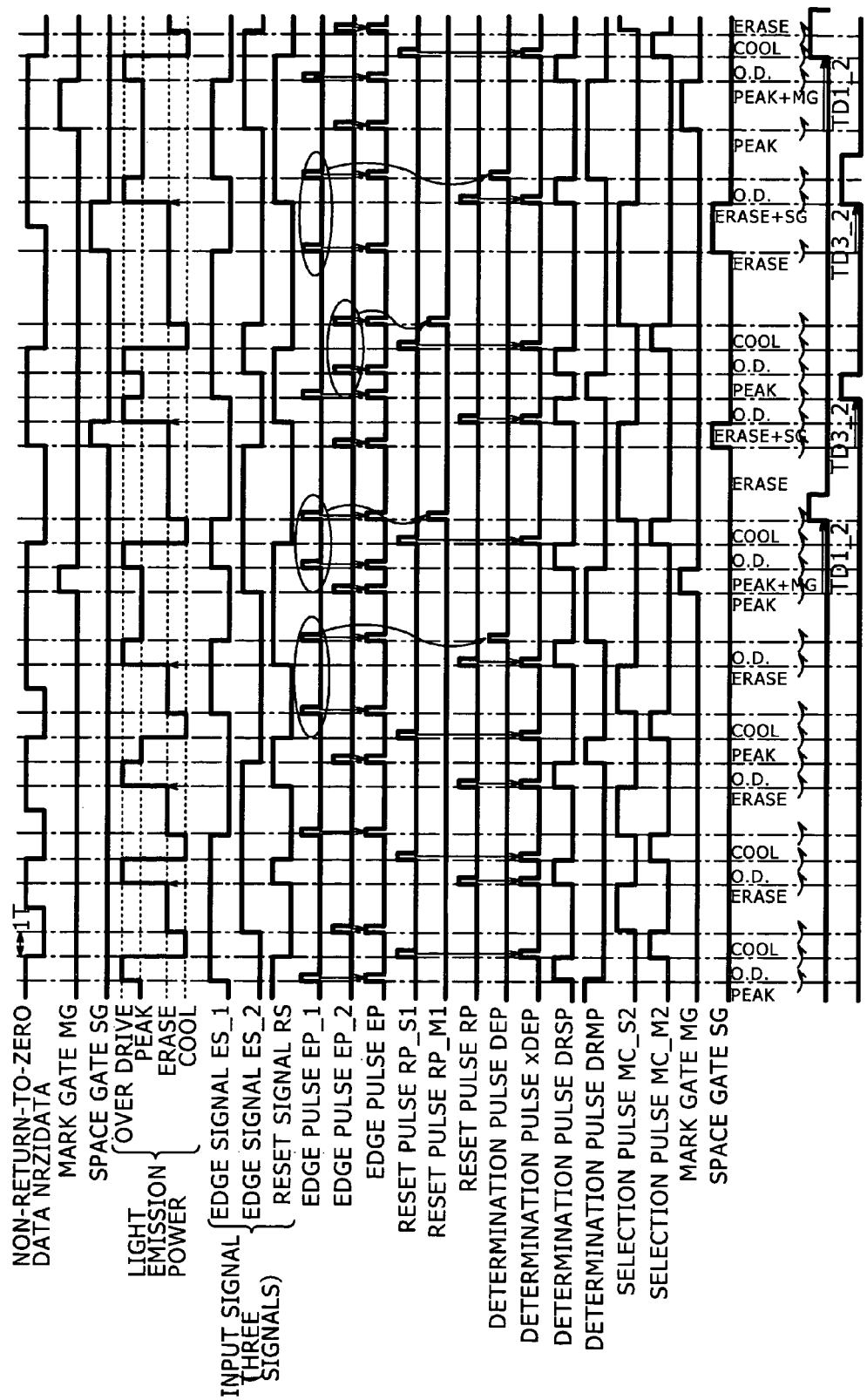

* ONLY SAMPLING PULSE STARTING TIMING IS SET IN REGISTERS TOGETHER WITH POWER LEVEL INFORMATION
* ENDING TIMING IS DEFINED BY TIMING OF CHANGING TO NEXT LEVEL (OVER DRIVE)

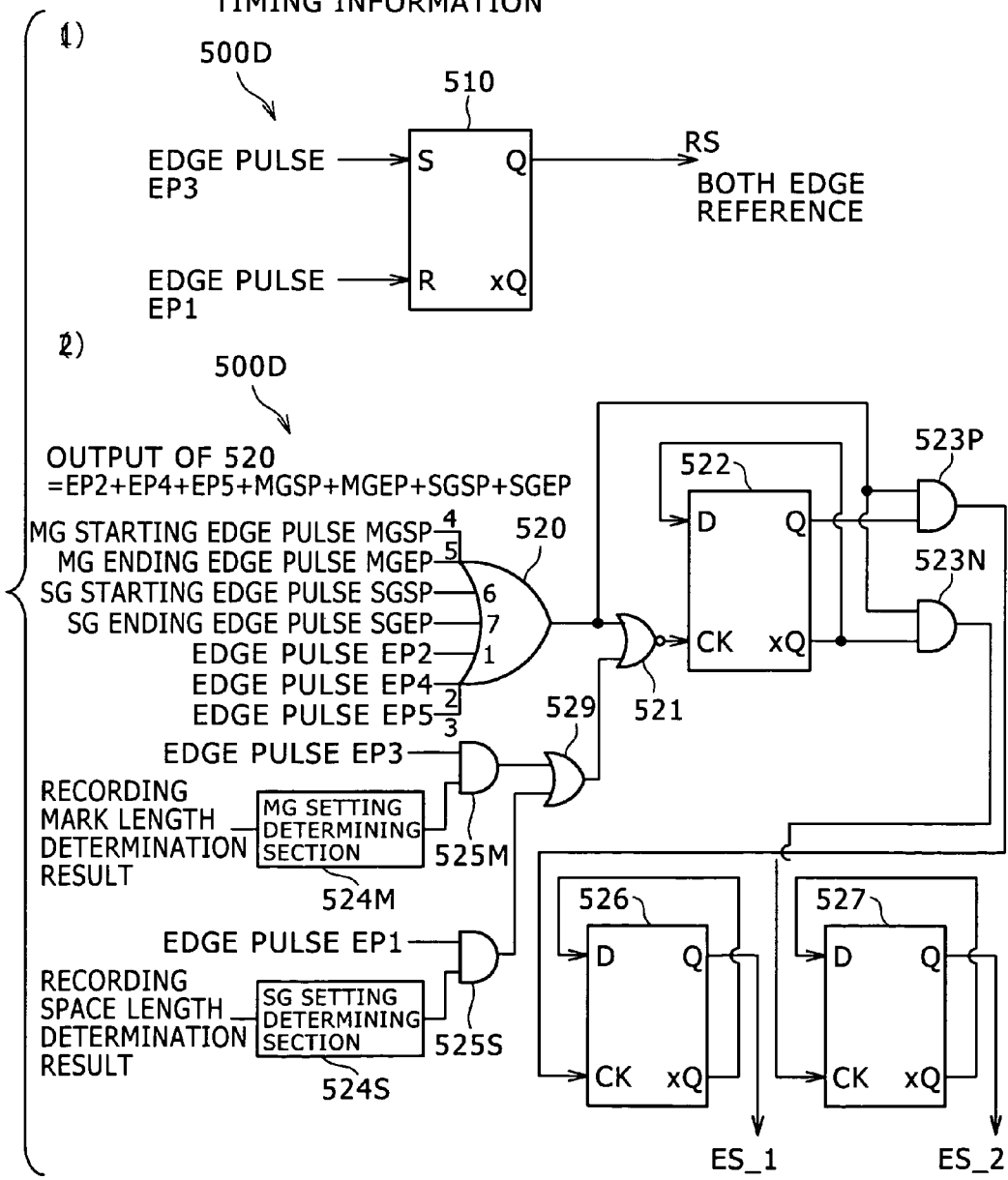

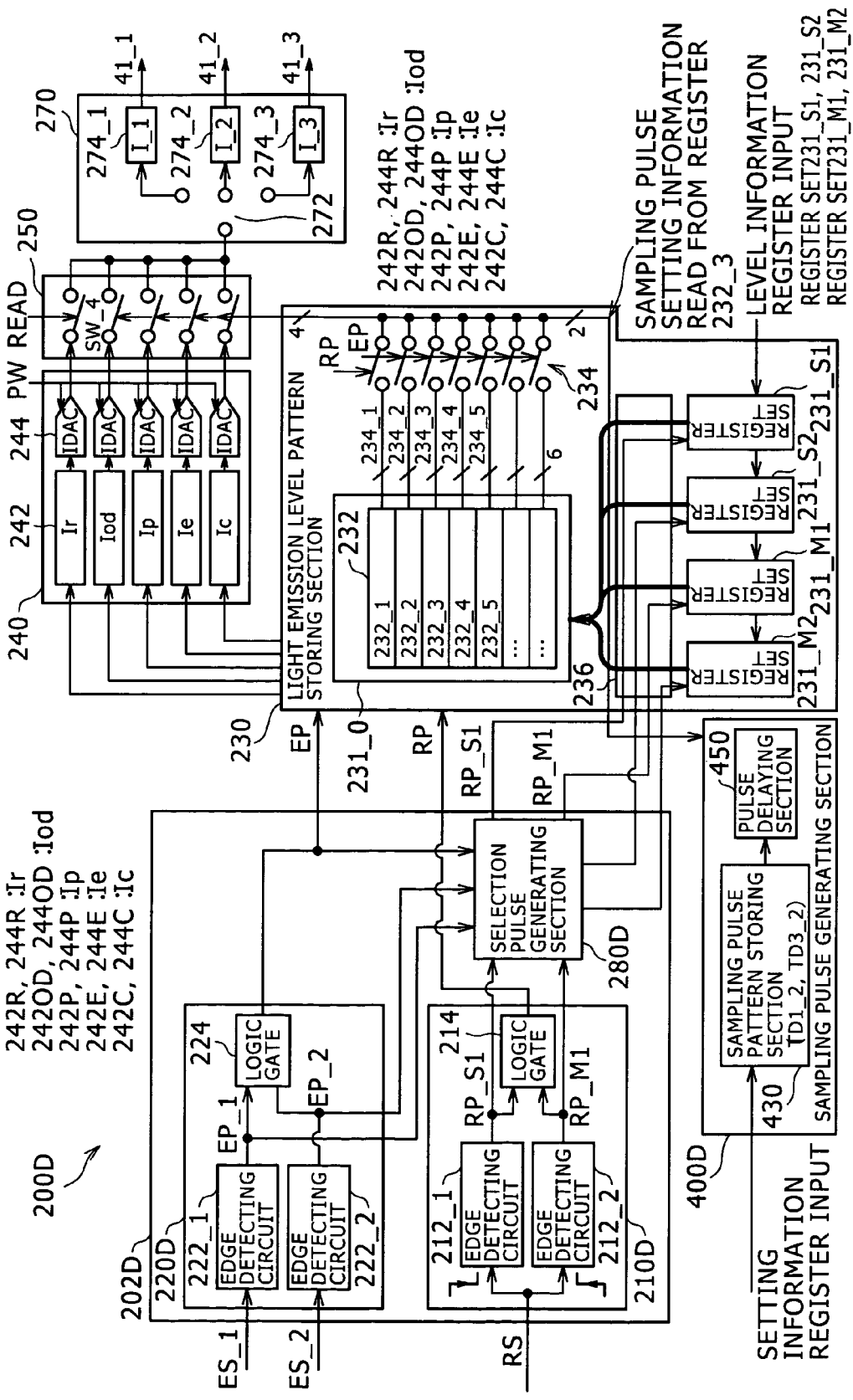

\* STARTING TIMING AND ENDING TIMING OF SAMPLING PULSE ARE SET IN REGISTERS TOGETHER WITH POWER LEVEL INFORMATION

LASER DRIVING DEVICE AND METHOD WITH CONTROL SIGNAL PATTERNS, REFERENCE PULSES, AND CHANGING PULSES

BACKGROUND OF THE INVENTION

1. Field of the Invention

The present invention relates to a laser driving device (laser driving circuit), a laser driving method, an optical unit, and a light device.

2. Description of the Related Art

Recording and reproducing devices using a laser as a light source are used in various fields. For example, attention is directed to optical disk recording and reproducing devices (hereinafter referred to simply as optical disk devices) using a laser driving device and an optical unit and using an optical disk as a recording and reproducing medium. As the laser used as light source, semiconductor lasers using semiconductor materials have recently been widely used in various devices because the semiconductor lasers are very small and respond to driving current at high speed.

As a writable optical disk used as a recording and reproducing medium, a phase change optical disk, a magneto-optical disk and the like are widely known. Recording, reproduction, and erasure are performed on these optical disks by changing the intensity of an applied laser beam. Generally, when information is recorded onto an optical disk, a so-called light intensity modulation system is used which forms marks and spaces on the recording medium by changing the intensity of a laser beam. At this time, the optical disk is irradiated with a laser beam of high intensity having a peak of 30 mW or more, for example. At a time of reproduction, the optical disk is irradiated with a laser beam of lower intensity (for example 1 mW) than at the time of recording so as to be able to read information without destroying recorded marks.

Mark edge recording, which provides information at positions of both edges of a recorded mark, has become mainstream on recent writable optical disks because of advantages in increasing the density of the optical disks. In the mark edge recording, a data error is caused by distortion of the shape of a mark. A write strategy technique is known in which recording power is pulse-divided, converted to multivalued levels, and controlled to perform recording with fewer errors (see for example Japanese Patent Laid-open No. 2007-141406 and "Low Noise and High-Speed Response at Highest Levels in the Field Overcoming Technological Barriers of Blu-ray Eight-Times Speed Recording and Reproduction," CX-PAL No. 74, [online], Sony Corporation, [retrieved on Aug. 18, 2008], Internet <URL: http://www.sony.co.jp/Products/SC-HP/cx_pal/vol74/pdf/featuring2_bd.pdf>).

SUMMARY OF THE INVENTION

An optical disk device includes a pickup as a movable part and a signal controlling system as a fixed part. In general, a laser driving section is disposed in the vicinity of a semiconductor laser mounted on the pickup, and connection from the signal controlling system to the laser driving system is established by a flexible printed board (flexible board). Generally, a write strategy circuit is included in the signal controlling system as a fixed part, and a light emission timing signal for each power level is transmitted to the pickup through the flexible board.

This configuration raises the frequency of the light emission timing signal transmitted through the flexible board as recording speed is improved. At this time, a transmission band is limited by the flexible board, and intervals of the light emission timing signal cannot be transmitted accurately, which hinders improvement in recording speed. Further, a write strategy tends to become complex toward achievement of high-density and high-speed recording. Not only an increase in transfer rate but also fragmentation of pulse dividing width or an increase in the number of power levels is desired.

With the existing configuration, as the number of power levels is increased, the number of lines for laser driving control is increased, the flexible board (width of the flexible board) becomes larger, and a problem of a reduction in transmission band which problem is caused by a length for securing an arrangement space and routing occurs. When the light emission power of a laser is controlled, there occurs another problem of how to transmit a feedback signal and a sampling pulse for controlling the light emission power.

The present invention has been made in view of the above situation. It is desirable to provide a mechanism that can solve the problems of the number of signal transmissions and a reduction in transmission band when the write strategy technique is adopted. In addition, it is desirable to provide a new mechanism of a method of generating and transmitting a signal (a feedback signal and a sampling pulse) for controlling light emission power while also considering application of the write strategy technique.

According to a first form of the present invention, there is provided a laser driving device including: a first pulse generating section configured to generate a reference pulse indicating timing of changing between a space and a mark by detecting an edge of a first transmission signal indicating, by the edge, information defining timing of obtaining the reference pulse; and a second pulse generating section configured to generate a changing pulse indicating changing timing of divided power levels of respective light emission waveforms of the space and the mark by detecting an edge of a second transmission signal indicating, by the edge, information defining timing of obtaining the changing pulse. The laser driving device further includes: a light emission waveform generating section configured to output reference level information as level information on a level at a position of the reference pulse, the level information being included in power level information on each power level of the light emission waveforms, for each the reference pulse, and output other level information following the reference level information in order for each the changing pulse; and a light emission level pattern storing section configured to store recording waveform control signal patterns indicating the power level information of the light emission waveforms for driving a laser element at the power levels of the respective light emission waveforms of the space and the mark separately for the space and the mark. In the laser driving device, the reference level information as level information on the level at the position of the reference pulse, the level information being included in the power level information of the respective light emission waveforms of the space and the mark, the power level information being stored in the light emission level pattern storing section, is read out for each the reference pulse, and the other level information following the reference level information is read out in order for each the changing pulse.

According to a second form of the present invention, there is provided a laser driving method including the steps of: storing recording waveform control signal patterns indicating power level information of light emission waveforms for driving a laser element at power levels of the respective light emission waveforms of a space and a mark separately for the space and the mark in a light emission level pattern storing section; and generating a reference pulse indicating timing of changing between the space and the mark by detecting an edge of a first transmission signal indicating, by the edge, information defining timing of obtaining the reference pulse. The laser driving method further includes the steps of: generating a changing pulse indicating changing timing of divided power levels of the respective light emission waveforms of the space and the mark by detecting an edge of a second transmission signal indicating, by the edge, information defining timing of obtaining the changing pulse; and setting the power levels of the light emission waveforms separately for the space and the mark by reading reference level information as level information on a level at a position of the reference pulse, the level information being included in the power level information of the respective light emission waveforms of the space and the mark, the power level information being stored in the light emission level pattern storing section, for each the reference pulse, and reading other level information following the reference level information in order for each the changing pulse.

According to a third form of the present invention, there is provided a light device including: a laser element; a driving section configured to drive the laser element; an optical member for guiding laser light emitted from the laser element; a light emission waveform pulse generating section configured to generate a plurality of pulse signals defining light emission waveforms formed by a combination of driving signals having different levels for a space and a mark on a, basis of a recording clock and recording data; and a transmission signal generating section configured to generate a first transmission signal indicating, by an edge, information defining timing of obtaining a reference pulse indicating changing timing of the space and the mark and a second transmission signal indicating, by an edge, information defining timing of obtaining a changing pulse indicating changing timing of the light emission waveforms on a basis of the plurality of pulse signals generated by the light emission waveform pulse generating section. The light device further includes: a pulse generating section including a first pulse generating section configured to generate the reference pulse on a basis of the edge of the first transmission signal and a second pulse generating section configured to generate the changing pulse on a basis of the edge of the second transmission signal; and a light emission waveform generating section configured to output reference level information as level information on a level at a position of the reference pulse, the level information being included in power level information on each power level of the light emission waveforms, for each the reference pulse, and output other level information following the reference level information in order for each the changing pulse. The light device further includes: a light emission level pattern storing section configured to store recording waveform control signal patterns indicating the level information for the light emission waveforms separately for the space and the mark; and a transmitting member for transmitting a signal, the transmitting member being interposed between a first mounting section in which the laser element, the driving section, the optical member, the pulse generating section, the light emission waveform generating section, and the light emission level pattern storing section are mounted and a second mounting section in which the light emission waveform pulse generating section and the transmission signal generating section are mounted.

According to a fourth form of the present invention, there is provided an optical unit including: a laser element; a driving section configured to drive the laser element; an optical member for guiding laser light emitted from the laser element; and a pulse generating section including a first pulse generating section configured to generate a reference pulse indicating changing timing of a space and a mark on a basis of a first transmission signal indicating, by an edge, information defining timing of obtaining the reference pulse and a second pulse generating section configured to generate a changing pulse indicating changing timing of a light emission waveform on a basis of a second transmission signal indicating, by an edge, information defining timing of obtaining the changing pulse. The optical unit further includes: a light emission waveform generating section configured to output reference level information as level information on a level at a position of the reference pulse, the level information being included in level information on each level of the light emission waveform, for each reference pulse, and output other level information following the reference level information in order for each changing pulse; and a light emission level pattern storing section configured to store a recording waveform control signal pattern indicating the level information for the light emission waveform.

According to a form of the present invention, there are a small number of kinds of signals being transmitted, so that the problems of the number of transmissions and a reduction in transmission band are solved. This is because the problem caused by a length for securing a signal line arrangement space and routing is alleviated.

In addition, separate light emission power levels can be set for a space and a mark by alternately reading in separate power level patterns for a space and a mark. It is possible to end one power level pattern at an arbitrary level, and read out the reference level information of the following other power level pattern. For both of spaces and marks, by controlling timing of generation of reference pulses indicating timing of changing between the spaces and marks, the ending level of light emission power can be selected arbitrarily from each piece of level information excluding the reference level information of the stored power level patterns.

BRIEF DESCRIPTION OF THE DRAWINGS

FIG. 1B is a diagram of assistance in explaining an example of configuration of an optical pickup;

FIGS. 2B to 2D are diagrams of assistance in explaining a first comparative example of a signal interface method;

FIG. 3A is a diagram showing a system configuration (first example) of a present embodiment;

FIG. 3B is a diagram showing a system configuration (second example) of the present embodiment;

FIGS. 3C to 3F are diagrams of assistance in explaining basic principles of the present embodiment to which the write strategy is applied;

FIG. 4A is a diagram of a laser driving circuit for implementing a laser driving system of a basic configuration;

FIG. 5B is a diagram of assistance in explaining operation of the transmission signal generating section according to the first embodiment;

FIG. 5F is a diagram of assistance in explaining register setting information of power levels according to the first embodiment;

FIG. 6A is a diagram of assistance in explaining a first example of setting of a sampling pulse;

FIG. 6B is a diagram of assistance in explaining a second example of setting of a sampling pulse;

FIG. 7A is a diagram of assistance in explaining an example of configuration of a transmission signal generating section according to a second embodiment;

FIG. 7B is a diagram of assistance in explaining operation of the transmission signal generating section according to the second embodiment;

FIG. 7D is a diagram showing a selection pulse generating section according to the second embodiment;

FIG. 7E is a diagram of assistance in explaining operation of the laser driving circuit according to the second embodiment;

FIG. 7H is a diagram (third example) of assistance in explaining register setting information of sampling pulses;

FIG. 8A is a diagram of assistance in explaining an example of configuration of a transmission signal generating section according to a third embodiment;

FIG. 8B is a diagram of assistance in explaining operation of the transmission signal generating section according to the third embodiment;

FIG. 8D is a diagram of assistance in explaining operation of the laser driving circuit according to the third embodiment;

FIG. 9A is a diagram of assistance in explaining an example of configuration of a transmission signal generating section according to a fourth embodiment;

FIG. 9C is a diagram of a laser driving circuit according to the fourth embodiment;

DETAILED DESCRIPTION OF THE PREFERRED EMBODIMENTS

Preferred embodiments of the present invention will hereinafter be described in detail with reference to the drawings. Incidentally, description will be made in the following order.
1. Outline of Configuration of Recording and Reproducing Device
2. Problems of Signal Interface and Principles of Method as Measure
3. System Configuration of Signal Interface
4. Basics of Sequential System (Power Level Change Interlocked with Spaces and Marks)
5. First Embodiment (Independent Power Level Change for Spaces and Marks)
6. Second Embodiment (Sampling Pulse Setting Change: Independent of Power Level Change)
7. Third Embodiment (Sampling Pulse Setting Change: Interlocked with Power Level Change/Superimposition of Only Start Timing on Edge Signal)
8. Fourth Embodiment (Sampling Pulse Setting Change: Interlocked with Power Level Change/Superimposition of Start and End Timing on Edge Signal)
<Outline of Configuration of Recording and Reproducing Device>

Figure 1A:
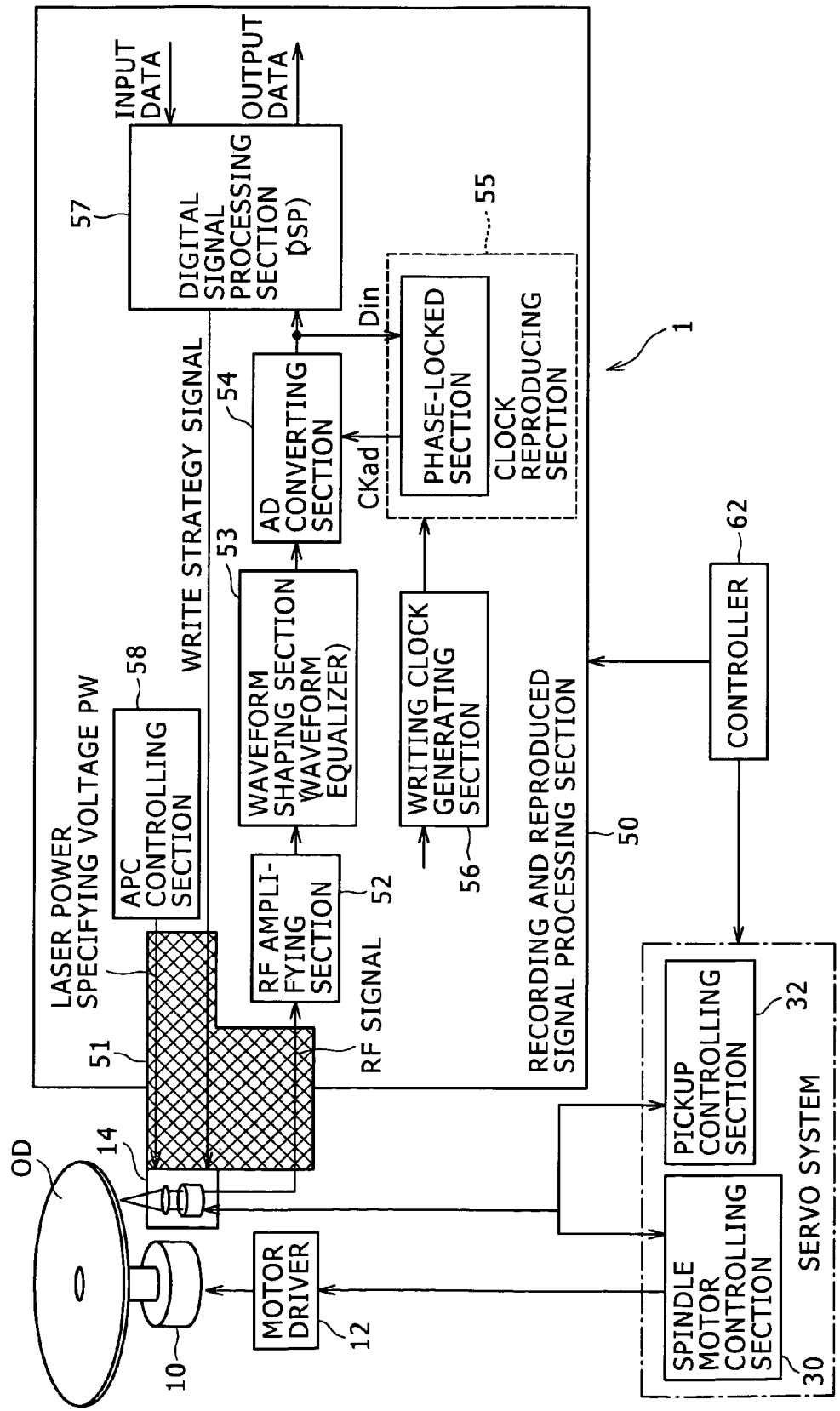
FIG. 1A is a diagram showing an example of configuration of a recording and reproducing device as an example of a light device.

FIG. 1A is a diagram showing an example of configuration of a recording and reproducing device (optical disk device) as an example of an optical device. FIG. 1B is a diagram of assistance in explaining an example of configuration of an optical pickup.

An optical disk OD may be not only a so-called reproduction-only optical disk such as a CD (Compact Disk), a CD-ROM (Read Only Memory), or the like but also for example a write-once optical disk such as a CD-R (Recordable) or the like or a rewritable optical disk such as a CD-RW (Rewritable) or the like. Further, the optical disk is not limited to CD-type optical disks, but may be an MO (magneto-optical disk), an ordinary DVD (Digital Video or Versatile Disk), or a DVD-type optical disk such as a next-generation DVD using a blue laser having a wavelength of about 405 nm, for example. A DVD system includes DVD-RAM/-R/+R/-RW/+RW, for example. In addition, the optical disk may be a so-called double-density CD (DDCD; DD=Double Density), CD-R or CD-RW having a recording density about twice that of a current CD format while following the current CD format.

The recording and reproducing device 1 according to the present embodiment includes an optical pickup 14 and a pickup controlling section 32. The optical pickup 14 records information onto the optical disk OD or reproduces information on the optical disk OD. The optical pickup 14 is controlled by the pickup controlling section 32. The pickup controlling section 32 controls the radial direction position (tracking servo) of a laser beam emitted from the optical pickup 14 with respect to the optical disk OD and the focal direction position (focus servo) of the laser beam emitted from the optical pickup 14 with respect to the optical disk OD.

The recording and reproducing device 1 includes a spindle motor 10, a motor driver 12, and a spindle motor controlling section 30 as a rotation controlling section (rotation servo system). The spindle motor 10 rotates the optical disk OD.

The rotational frequency of the optical disk OD is controlled by the spindle motor controlling section 30. The recording and reproducing device 1 includes a recording and reproduced signal processing section 50 as a recording and reproducing system, the recording and reproduced signal processing section 50 being an example of an information recording section for recording information via the optical pickup 14 and an information reproducing section for reproducing information recorded on the optical disk OD. Connection between the recording and reproduced signal processing section 50 and the optical pickup 14 is established via signal wiring that is pattern-formed in a flexible board 51 as an example of a transmitting member for transmitting a signal.

The recording and reproducing device 1 includes a controller 62, an interface section performing an interface function, the interface section being not shown in the figure, and the like as a controller system. The controller 62 is formed by a microprocessor (MPU: Micro Processing Unit). The controller 62 controls the operation of a servo system having the spindle motor controlling section 30 and the pickup controlling section 32 and the recording and reproduced signal processing section 50. The interface section performs a function of an interface (connection) with a personal computer (hereinafter referred to as a PC), which is an example of an information processing device (host device) performing various information processing using the recording and reproducing device 1. The interface section is provided with a host IF controller. The recording and reproducing device 1 and the PC form an information recording and reproducing system (optical disk system).

[Optical Pickup]

As shown in FIG. 1B, the optical pickup 14 includes a semiconductor laser 41, a beam splitter 42, a lens 43, a mirror 44, a light detecting section 45, and a driving current controlling section 47 as an example of a laser driving device. The driving current controlling section 47 is formed by a laser driving IC (LDD), for example. Connection between the semiconductor laser 41 and the driving current controlling section 47 is established via signal wiring that is pattern-formed in a flexible board 46, for example.

A recording pulse according to a write strategy is transmitted from a digital signal processing section 57 in the recording and reproduced signal processing section 50 to the driving current controlling section 47 via the flexible board 51, and a laser power specifying voltage PW is transmitted from an APC controlling section 58 to the driving current controlling section 47 via the flexible board 51. The driving current controlling section 47 generates a recording waveform by synthesizing the recording pulse according to the write strategy and the laser power specifying voltage PW for APC control, amplifies the recording waveform, and drives the semiconductor laser 41.

The semiconductor laser 41 emits laser light for recording additional information onto the optical disk OD or reading information recorded on the optical disk OD. The beam splitter 42 transmits or reflects the laser light from the semiconductor laser 41 or reflected light from the optical disk OD. The mirror 44 reflects the laser light or the reflected light in a direction of about 90 degrees.

The light detecting section 45 has a first light detecting section 45a and a second light detecting section 45b. The first light detecting section 45a is formed by a photodetector IC (PDIC). The second light detecting section 45b is formed by a front monitor photodetector IC (FMPDIC), for example. The first light detecting section 45a obtains an RF signal for reproduced signal processing (including servo processing). The second light detecting section 45b obtains a power monitor signal PM for APC control. Though not shown in the figure, the first light detecting section 45a and the second light detecting section 45b each have a light receiving element, a current/voltage converting section, and an amplifying section. As will be described later in detail, the second light detecting section 45b according to the present embodiment also has a sample-hold circuit for sampling and holding the power monitor signal PM output from the amplifying section and obtaining a power monitor voltage PD.

The laser light emitted from the semiconductor laser 41 passes through a lens 43a and the beam splitter 42, is reflected to the optical disk OD side by a mirror 44a, is condensed by a lens 43b, and then irradiates the optical disk OD. The reflected light reflected by the optical disk OD passes through the lens 43b, is reflected to the beam splitter 42 side by the mirror 44a, reflected to a mirror 44b side by the beam splitter 42, and further reflected by the mirror 44b, and then enters the first light detecting section 45a. The first light detecting section 45a converts this incident light into an electric signal, amplifies the electric signal, and thereby obtains an RF signal. The RF signal is transmitted to the recording and reproduced signal processing section 50 via the flexible board 51.

A part of the laser light emitted from the semiconductor laser 41 is reflected to the second light detecting section 45b side by the beam splitter 42, and then enters the second light detecting section 45b. The second light detecting section 45b converts the incident light into an electric signal, amplifies the electric signal, and thereby obtains a power monitor signal PM. Further, the second light detecting section 45b samples and holds the power monitor signal PM and thereby obtains a power monitor voltage PD. The power monitor voltage PD is transmitted to the APC controlling section 58 in the recording and reproduced signal processing section 50 via the flexible board 51.

[Recording and Signal Processing Section]

The recording and reproduced signal processing section 50 includes an RF amplifying section 52, a waveform shaping section 53 (waveform equalizer), and an AD converting section 54 (ADC; Analog-to-Digital Converter). In addition, the recording and reproduced signal processing section 50 includes a clock reproducing section 55, a writing clock generating section 56, a digital signal processing section 57 formed by a DSP (Digital Signal Processor), and an APC controlling section 58 (Automatic Power Control).

The RF amplifying section 52 amplifies a minute RF (high-frequency) signal (reproduced RF signal) read by the optical pickup 14 to a predetermined level. The waveform shaping section 53 shapes the reproduced RF signal output from the RF amplifying section 52. The AD converting section 54 converts the analog reproduced RF signal output from the waveform shaping section 53 into digital reproduced RF data Din.

The clock reproducing section 55 has a data recovery type phase-locked circuit (PLL circuit) for generating a clock signal synchronous with the reproduced RF data Din output from the AD converting section 54. In addition, the clock reproducing section 55 supplies the reproduced clock signal as an AD clock CKad (sampling clock) to the AD converting section 54, and supplies the reproduced clock signal to other functional parts.

The digital signal processing section 57 for example includes a data detecting section and a demodulation processing section as a functional part for reproduction. The data detecting section performs processing such as PRML (Partial Response Maximum Likelihood) and the like, and thereby detects digital data from the reproduced RF data Din.

The demodulation processing section performs digital signal processing such for example as demodulating a digital data string and decoding digital audio data and digital video data and the like. For example, the demodulation processing section has a demodulating section, an error correcting code (ECC) correcting section, an address decoding section and the like. The demodulation processing section performs demodulation and ECC correction as well as address decoding. The data after the demodulation is transferred to the host device via the interface section.

The writing clock generating section 56 generates a writing clock for modulating data at a time of recording onto the optical disk OD on the basis of a reference clock supplied from a crystal oscillator or the like. The digital signal processing section 57 has an ECC encoding section and a modulation processing section as a functional part for recording. The digital signal processing section 57 generates recording data, and further generates a light emission timing signal for each power level according to the write strategy.

The APC controlling section 58 of the recording and reproduced signal processing section 50 has a function of controlling the light emission power of the semiconductor laser 41 to a fixed level on the basis of the power monitor voltage PD, and supplies a laser power specifying voltage PW to the driving current controlling section 47 of the optical pickup 14. During the recording or reproducing operation of the optical disk OD, APC is generally performed to adjust the light emission power of the laser. Because for example the light emission characteristic of the semiconductor laser 41 has a temperature dependence and thus the light emission power of the semiconductor laser 41 can be changed even with a same driving current, APC calculates a relation between the current and an amount of light emission, and adjusts the driving current to obtain a predetermined amount of light emission.

APC during recording operation monitors a light emission waveform by a light receiving element, samples and holds the light emission waveform in timing in which a mark part and a space part of the monitored waveform becomes statically determinate, and thereby obtains a power monitor voltage PD. The power monitor voltage PD is transmitted to the APC controlling section 58, and a laser power specifying voltage PW is supplied to the driving current controlling section 47 so as to obtain a predetermined amount of light emission. Thereby the driving current is adjusted.

The recording and reproducing device 1 records digital data output from an information source onto the optical disk OD and reproduces information recorded on the optical disk OD by laser light applied from the semiconductor laser 41. The driving current controlling section 47 generates a recording waveform by synthesizing a recording pulse according to the write strategy and the laser power specifying voltage PW for APC control, amplifies the recording waveform, and drives the semiconductor laser 41.

<Problems of Signal Interface and Principles of Method as Measure>

Figure 2A:
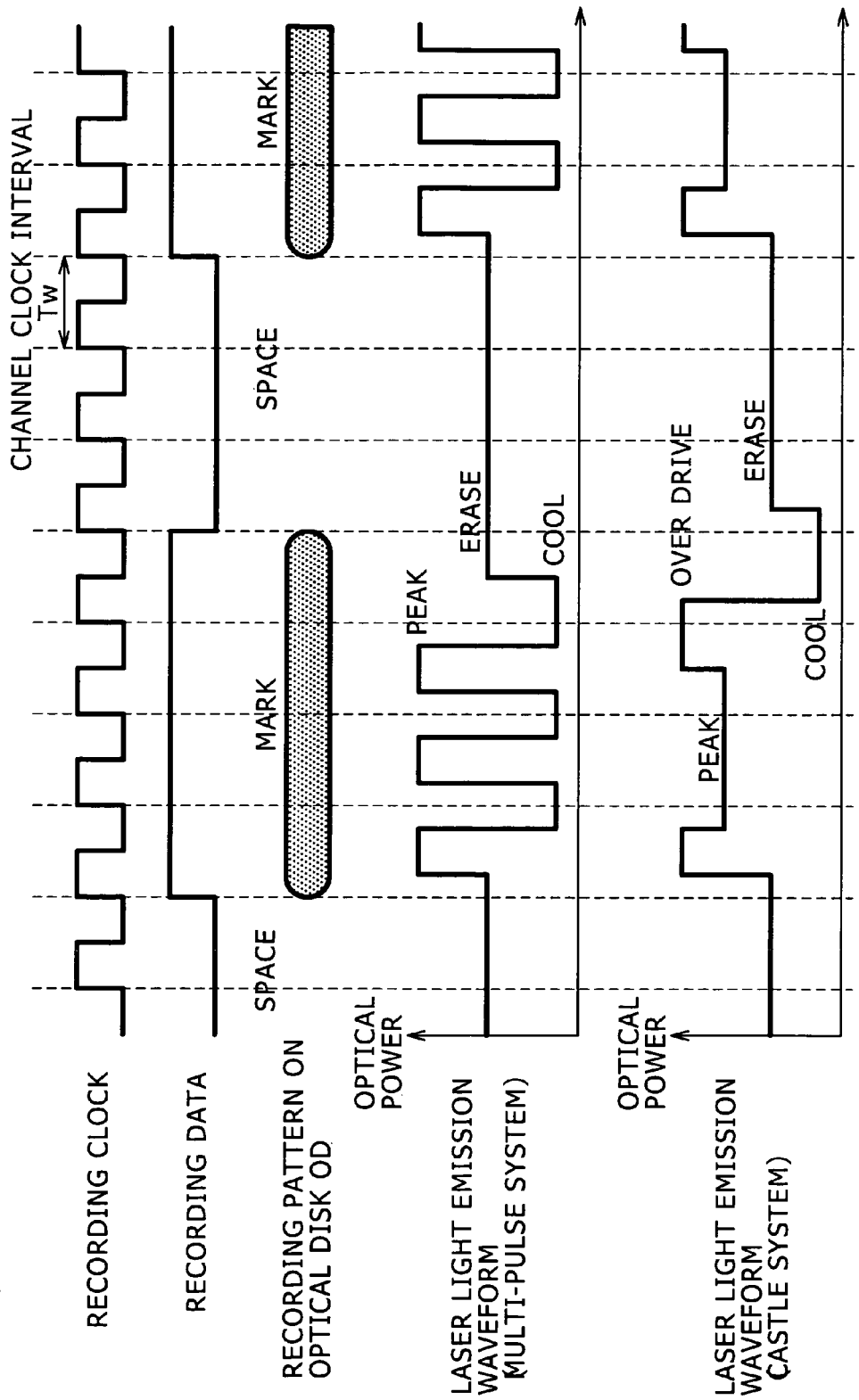
FIG. 2A is a diagram of assistance in explaining a write strategy.

FIGS. 2A to 2E are diagrams of assistance in explaining problems of a signal interface and basic principles of a method as a measure against the problems. FIG. 2A is a diagram of assistance in explaining an example of a laser driving system to which a write strategy technique is applied. FIGS. 2B to 2E are diagrams of assistance in explaining a first to a third comparative examples of a signal interface method when the write strategy technique is applied and the semiconductor laser 41 is driven.

As an optical disk recording system, a so-called light intensity modulating system that forms marks and spaces on the recording medium by changing the strength of optical power when recording information onto the optical recording medium is adopted to perform recording. In order to perform recording with fewer errors, a waveform as shown in FIG. 2, for example, is used for changing the strength of the optical power, rather than recording data itself.

A multi-pulse system divides a recording clock, and effects pulse light emission. In this example, the multi-pulse system has three power levels of Cool, Erase, and Peak. A castle system is used mainly in high-speed recording. The castle system does not effect pulse light emission in recording clock units, but increases laser power at a start and an end of a mark. In this example, the castle system has four power levels of Cool, Erase, Peak, and Over Drive, which number is increased as compared with the multi-pulse system. In addition, timing of each edge is adjusted in a unit smaller than a channel clock interval (Tw). For example, the unit is Tw/40, Tw/32, Tw/16 or the like. The device of this light emission pattern is referred to as a recording compensation (write strategy technique), and a recording compensation circuit (write strategy circuit) generates the timing of each edge according to recording data.

In each of the following embodiments, description will be made of a case where the castle system is applied to laser light emission waveforms unless otherwise specified. This is because the castle system is common in high-speed recording. However, the mechanism of each of the embodiments to be described later is also applicable to the multi-pulse system. This is because the castle system and the multi-pulse system differ from each other only in set value of a power level in timing of each pulse and have a commonality in that "recording power is pulse-divided, converted to multivalued levels, and controlled."

On the other hand, as shown in FIGS. 2B to 2F, for example, a laser driving system 3 of an optical disk device is divided into an optical pickup 14 (optical head) including a semiconductor laser 41 and optical parts and a drive board including a control circuit. Because the optical pickup 14 is movable along the radius of the optical disk OD, the optical pickup 14 and the drive board are connected to each other by a flexible board 51.

Figure 2B:
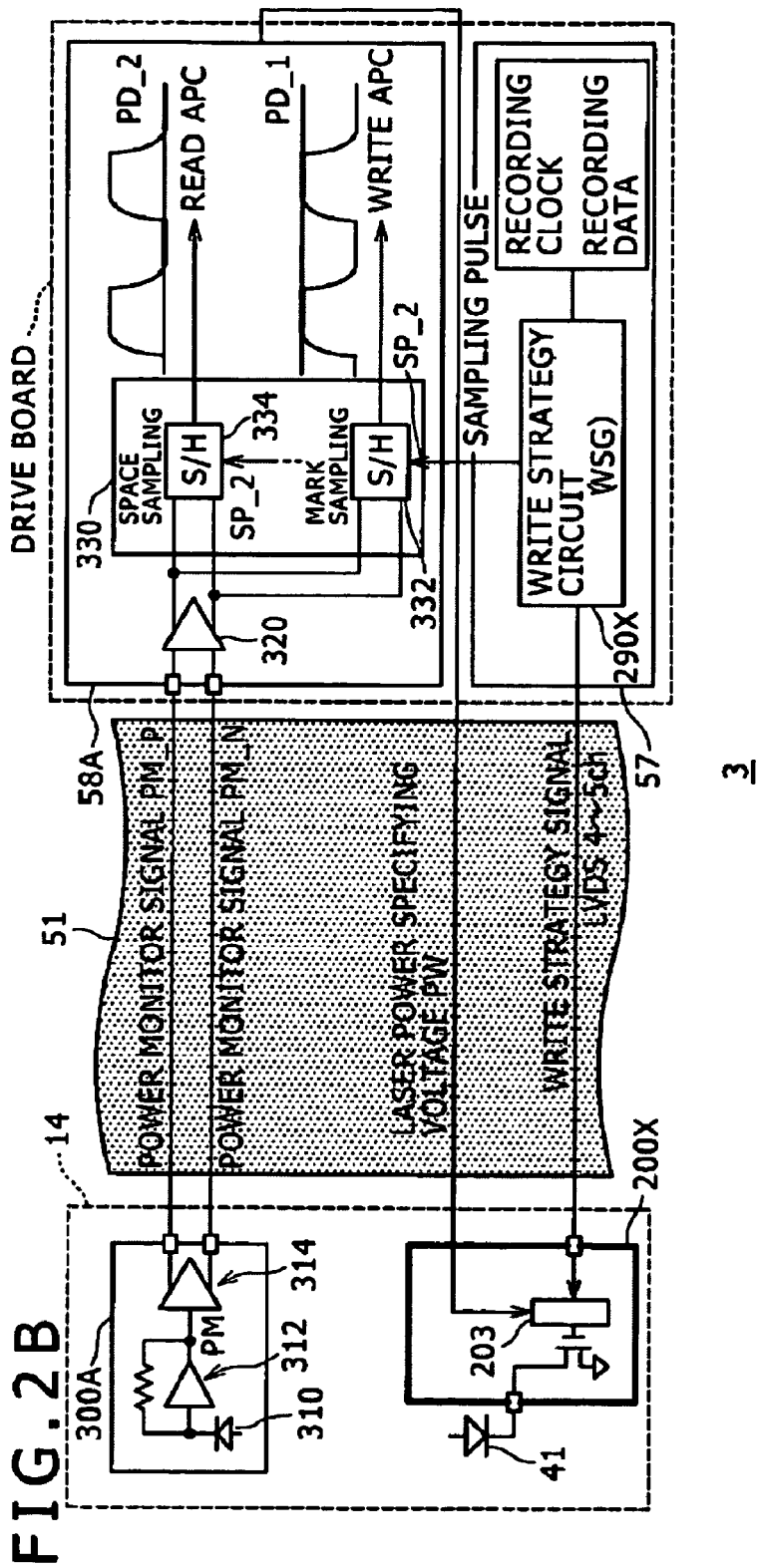

In the first comparative example shown in FIGS. 2B to 2D, a write strategy circuit 290X (light emission waveform pulse generating section) is mounted on a drive board. In this case, the drive board supplies a laser driving circuit 200X mounted in an optical pickup 14 with a write strategy signal (referred to also as a recording pulse signal or a laser driving timing signal) defining light emission timing corresponding to each power level and a laser power specifying voltage PW. The laser driving circuit 200X has a light emission waveform generating section 203 for generating a light emission waveform by synthesizing the write strategy signal and the laser power specifying voltage PW. The light emission waveform generating section 203 makes a semiconductor laser 41 emit light by generating a driving current while increasing and decreasing power according to the laser power specifying voltage PW.

Directing attention to an APC controlling system, though detailed description of each part will be omitted, a power monitor circuit 300A (corresponding to the second light detecting section 45b in FIG. 1B) on the optical pickup 14 side converts a current signal obtained by photoelectric conversion by a light receiving element 310 into a voltage signal, and thereby generates a power monitor signal PM. The power monitor signal PM is supplied to the side of an APC controlling section 58 as differential signals (PM_P and PM_N) as a feedback signal for APC. The APC controlling section 58A on the drive board side samples and holds the values of the power monitor signal PM in a writing period (mark position) and a bias period (space position), and thereby obtains power monitor voltages PD_1 and PD_2. The APC controlling section 58A determines an optimum recording output level for the semiconductor laser 41 on the basis of the power monitor voltages PD_1 and PD_2, generates a laser power specifying voltage PW for holding the emission power of the semiconductor laser 41 constant, and then supplies the laser power specifying voltage PW to the light emission waveform generating section 203.

In the first comparative example, the write strategy signal sent from the write strategy circuit 290X has finer timing information than a channel clock, but the following problems involved in recent improvement in recording speed are presented. First, an increase of power levels increases the number of transmissions of signal lines of a recording system. For example, this is indicated by 4 to 5 ch provided for LVDS (Low Voltage Differential Signal) in the figure. Second, it is difficult to transmit the write strategy signal accurately because of degradation in frequency characteristic (transmission band reduction) due to the flexible board 51. Intervals of the write strategy signal cannot be transmitted accurately, which hinders improvement in recording speed. In addition, as shown in FIG. 2C, an edge shift is caused by intersymbol interference at a shortest pulse (for example about 1 T).

The power monitor signal PM is obtained by detecting laser light corresponding to the write strategy signal sent from the write strategy circuit 290X. Hence, the power monitor signal PM also has problems caused by the flexible board 51 as with the write strategy signal. As shown in FIG. 2D, due to the frequency characteristic of the flexible board 51, the power monitor signal PM is degraded, and is difficult to transmit accurately. In addition, delay variations occur, and a sampling gate cannot be opened because of a shorter pulse due to an increase in speed.

Figure 2E:
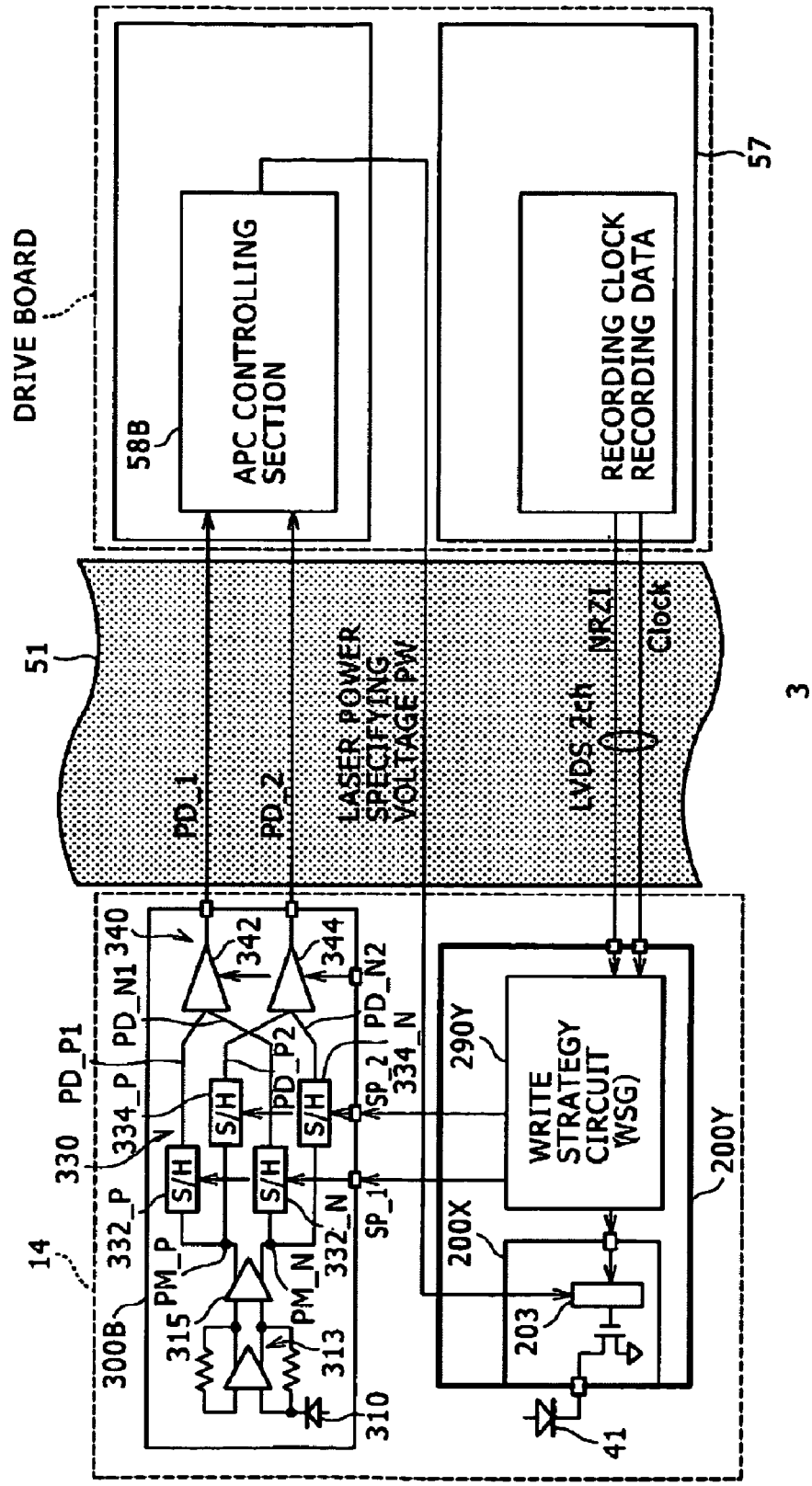
FIG. 2E is a diagram of assistance in explaining a second comparative example of the signal interface method.

In the second comparative example shown in FIG. 2E, a write strategy circuit 290Y (light emission waveform pulse generating section) is mounted in a laser driving circuit 200Y including a similar circuit to the laser driving circuit 200X in the first comparative example rather than in a drive board. The write strategy circuit 290Y generates a timing signal for controlling optical power from a recording clock and recording data. The timing signal has smaller units than a channel clock interval (Tw), and is generated for each power level so that the power level and timing are set in a one-to-one correspondence with each other. The write strategy circuit 290Y for realizing this includes a phase-locked circuit, a memory, an address encoder, and a timing generating circuit. The phase-locked circuit generates a multiphase clock for generating a unit smaller than the channel clock interval (Tw). The memory stores level information. The address encoder determines recording data length, and generates a memory address. The timing generating circuit converts timing information read from the memory according to the recording data length into a timing signal.

Directing attention to an APC controlling system, though detailed description of each part will be omitted, the second comparative example samples and holds the values of a power monitor signal PM in a writing period and a bias period on the side of an optical pickup 14 rather than on the side of drive board. Then, sampled and held power monitor voltages PD_1 and PD_2 are supplied to an APC controlling section 58B. The power monitor voltages PD_1 and PD_2 are sent as a feedback signal for APC to the APC controlling section 58 via a flexible board 51.

In the second comparative example, the signal of the recording system which signal is transmitted by the flexible board 51 is the recording clock and the recording data, and thus problems of strategy transmission in the first comparative example are solved. For example, the number of LVDS channels for write strategy transmission is reduced, and neither of the recording clock and the recording data, which are signals in channel clock units, is easily affected by the transmission characteristic of the flexible board 51. In addition, the APC controlling system includes a sample-hold circuit 330 in a power monitor circuit 300B on the optical pickup 14 side, and is thereby able to make transmission of the power monitor voltage. PD. Therefore the problem of the first example due to the transmission of the power monitor signal PM through the flexible board 51 is solved. However, because the write strategy circuit 290Y includes the phase-locked circuit, the memory, the address encoder, and the timing generating circuit, there are problems of the large scale of the laser driving circuit 200Y, an increase in power consumption, and heat generation.

Figure 2F:
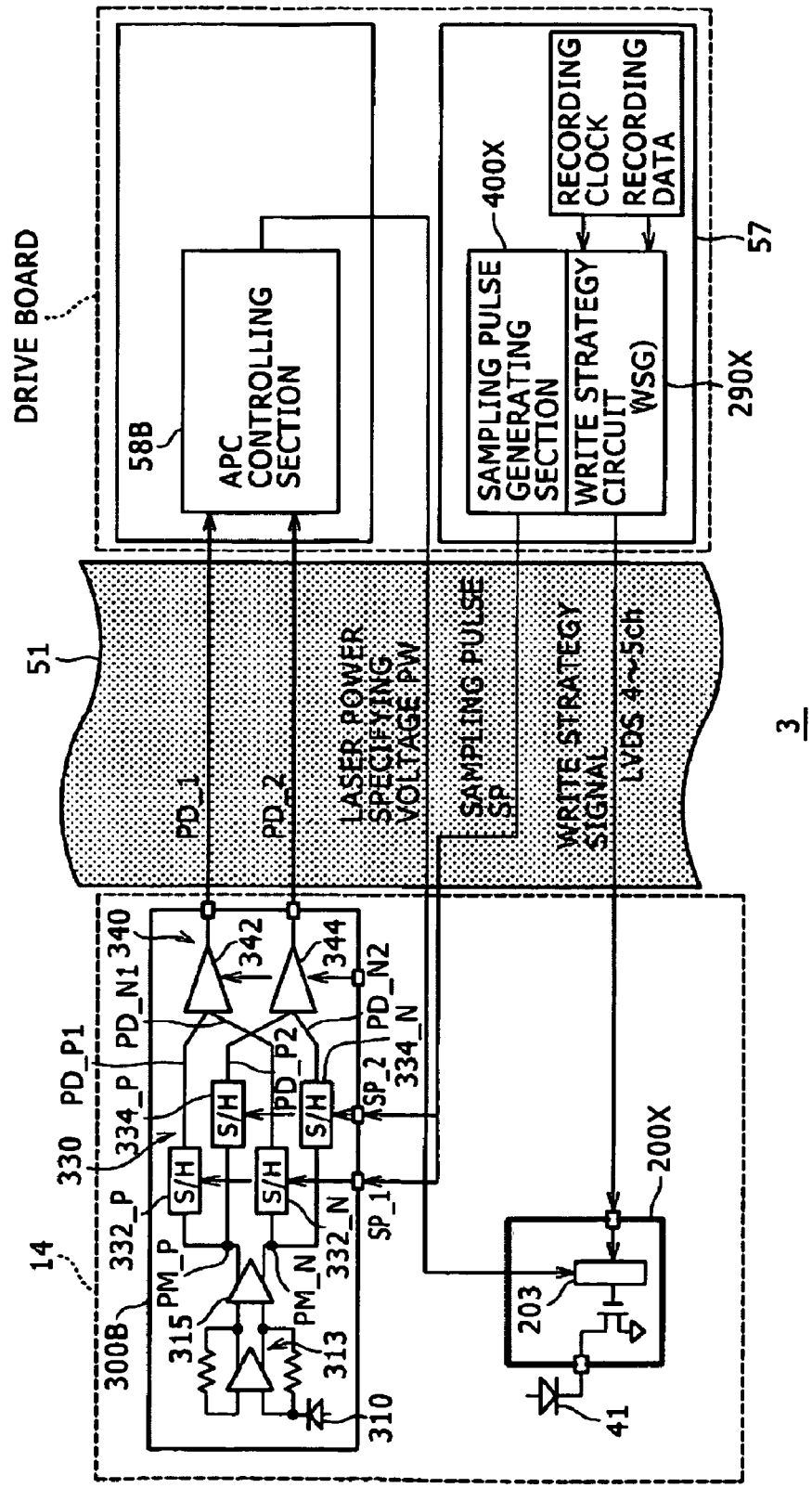
FIG. 2F is a diagram of assistance in explaining a third comparative example of the signal interface method.

In the third comparative example shown in FIG. 2F, a write strategy circuit 290X is disposed in a recording and reproduced signal processing section 50 as in the first comparative example, and a sample-hold circuit 330 is disposed in a power monitor circuit 300B as in the second comparative example. In this case, a recording system has similar problems to those of the first comparative example. In addition, a sampling pulse SP for sampling and holding is generated by a sampling pulse generating section 400X attached to the write strategy circuit 290X, and the sampling pulse SP is transmitted to the sample-hold circuit 330 via a flexible board 51. Thus, an increase in the number of pieces of flexible board wiring and signal degradation of the sampling pulse SP due to flexible board transmission become new problems. Further, for high-speed transmission of the sampling pulse SP, in consideration of LVDS provision, the sample-hold circuit 330 needs to have an LVDS-ready input circuit for the sampling pulse SP, so that the number of terminals is increased.

Thus, the first to third comparative examples have drawbacks in terms of the number of signal transmissions and a reduction in transmission band or the circuit scale when the write strategy circuit 290 is disposed in the laser driving circuit 200 in the signal transmission of the recording system and the signal transmission of the APC controlling system.

<Signal Interface: System Configuration>

FIGS. 3A to 3F are diagrams of assistance in explaining a signal interface system according to the present embodiment. FIG. 3A is a diagram showing a system configuration (first example) for implementing the signal interface system according to the present embodiment. FIG. 3B is a diagram showing a system configuration (second example) for implementing the signal interface system according to the present embodiment. FIGS. 3C to 3F are diagrams of assistance in explaining basic principles of a laser driving system according to the present embodiment to which the write strategy technique is applied.

A laser driving system 3 according to the present embodiment has a mechanism that can solve the problems of the number of transmissions and the transmission band as a method for solving the problems of the number of transmissions and the transmission band without increasing the circuit scale of a laser driving circuit to the degree of the second comparative example. In addition, the laser driving system 3 according to the present embodiment preferably has a mechanism that can solve the problems of the first to third comparative examples in methods of generating and transmitting a signal for APC control and a sampling pulse SP while application of the write strategy technique is also taken into consideration.

In the application of the write strategy technique, as a basic idea of the method, power level information (recording waveform control signal pattern) for laser light emission in each timing when the write strategy technique is applied is stored first. In addition, a first transmission signal including information defining timing of obtaining a reference pulse indicating changing timing in repetition of spaces and marks and a second transmission signal including information defining timing of obtaining a changing pulse indicating timing of changing laser light emission level are used. The first transmission signal and the second transmission signal are treated as a write strategy signal (recording pulse) in FIG. 1A and FIG. 1B.

A reference pulse and a plurality of changing pulses are generated using two kinds of pulse signals. An initial level of the recording waveform control signal pattern is set by the reference pulse, and thereafter the level is changed to each light emission power level to which the write strategy technique is applied at each changing pulse according to the recording waveform control signal pattern. Then, each time a reference pulse is generated, a similar process to the above-described process is performed again. Such a system will be referred to as a sequential system in the present specification.

In regard to a recording system, the present embodiment is based on adoption of a signal interface system similar to that of the first comparative example in which the write strategy circuit 290 is disposed on the drive board side, and makes transmission with kinds of signal lines reduced. The first example shown in FIG. 3A is an example of a configuration when attention is directed to only a signal interface in the application of the write strategy technique. The second example shown in FIG. 3B is an example of a configuration when attention is directed also to methods of generating and transmitting a signal for APC control and a sampling pulse SP.

In the first example shown in FIG. 3A, a drive board has a sequential-ready transmission signal generating section 500 in a stage subsequent to a write strategy circuit 290. The transmission signal generating section 500 generates a first transmission signal and a second transmission signal on the basis of a write strategy signal (for example 4 to 5 ch) from the write strategy circuit 290. The first transmission signal includes information defining timing of obtaining a reference pulse indicating changing timing in repetition of spaces and marks. The second transmission signal includes information defining timing of obtaining a changing pulse indicating changing timing of a divided driving signal. The transmission signal generating section 500 supplies the first and second transmission signals to a laser driving circuit 200 via a flexible board 51.

The laser driving circuit 200 on an optical pickup 14 side has a pulse generating section 202 matched to the transmission signal generating section 500 of a digital signal processing section 57, a light emission waveform generating section 203, and a power monitor circuit 300. The pulse generating section 202 generates a reference pulse and a changing pulse on the basis of the first and second transmission signals transmitted via the flexible board 51. The light emission waveform generating section 203 generates a current signal according to a recording waveform control signal pattern using the reference pulse and the changing pulse. The power monitor circuit 300 obtains a power monitor voltage PD as a feedback signal for APC control by subjecting a part of laser light emitted from a semiconductor laser 41 to photoelectric conversion and performing sampling and holding. The power monitor circuit 300 then sends the power monitor voltage PD to an APC controlling section 58.

In the second example shown in FIG. 3B, a write strategy circuit is disposed on a fixed circuit board side, and a sampling pulse SP is generated on the side of an optical pickup 14 on the basis of a signal defining a light emission power pattern (waveform control signal pattern) for a write strategy. That is, the sampling pulse SP is generated on the side of the optical pickup 14 on the basis of the laser driving timing signal received by a laser driving circuit 200 without a write strategy circuit 290 (light emission waveform pulse generating section).

A sampling pulse generating section 400 has a sampling pulse pattern storing section 430 for storing setting information (pulse pattern) at a time of generating the sampling pulse SP on the basis of a write strategy signal. The sampling pulse generating section 400 may be disposed either within the laser driving circuit 200 or within a power monitor circuit 300, or may be disposed separately from the laser driving circuit 200 and the power monitor circuit 300. The sampling pulse generating section 400 generates sampling pulses SP_1 and SP_2 on the basis of an LVDS-ready write strategy signal (2 to 3 ch) transmitted from a recording and reproduced signal processing section 50 via a flexible board 51.

As shown in FIG. 3E, the sequential system generates a reset pulse RP as a reference pulse and an edge pulse EP as a changing pulse using two kinds of input signals, that is, a reset signal RS as a first transmission signal and an edge signal ES as a second transmission signal.

The first transmission signal (reset signal RS) indicates the same edge as a start edge (edge pulse EP1 in FIG. 3D) of the recording waveform control signal pattern in the laser driving circuit 200Y of the second comparative example, the laser driving circuit 200Y including a write strategy circuit. The second transmission signal (edge signal ES) indicates the same edges as obtained by synthesizing other edge timing (edge pulses EP2, EP3, EP4, and EP5 in FIG. 3D).

As shown in FIG. 3F, information on each light emission power level indicating a recording waveform control signal pattern is stored in order in each register of a memory circuit. The information on a reference power level is read out on the basis of the reset pulse RP. The information on a light emission power level in each timing following the information on the reference power level is read out in order on the basis of the edge pulse EP.

That is, a sequential access memory having a reset function operating at high speed is provided within the laser driving circuit 200, and each piece of power level information is retained in order of readout. Then, each time a changing pulse (edge pulse EP) is generated, the information on a light emission power level is selected and read out in order from information next to the information on the reference power level. Further, regardless of which light emission power level is selected, by the reset function of the reference pulse (reset pulse RP), the information of a first area (information on the reference power level) is read out in timing of generation of the reference pulse.

As shown in FIGS. 3D and 3E, of the edge pulses EP1 to EP5 defining the recording waveform control signal pattern generated in the write strategy circuit 290, the edge pulse EP1 corresponds to the reset pulse RP. Accordingly, the transmission signal generating section 500 generates the reset signal RS on the basis of the edge pulse EP1. In addition, because the edge pulses EP2 to EP5 correspond to the edge pulse EP, the transmission signal generating section 500 generates the edge signal ES on the basis of the edge pulses EP2 to EP5.

At this time, an idea of defining the reset pulse RP by one edge of the reset signal RS and an idea of defining the reset pulse RP by both edges of the reset signal RS can both be adopted. Similarly, an idea of defining the edge pulse EP by one edge of the edge signal ES and an idea of defining the edge pulse EP by both edges of the edge signal ES can both be adopted. The frequency of output of the edge pulse EP is higher than that of the reset pulse RP. Accordingly, in the present embodiment, at least the edge pulse EP is defined by both edges of the edge signal ES.

In the following, description will first be made of a basic mechanism of the sequential system in order to facilitate understanding of mechanisms of the present embodiment, and thereafter concrete mechanisms of the present embodiment will be described.

<Laser Driving System: Basics of Sequential System>

Figure 4B:
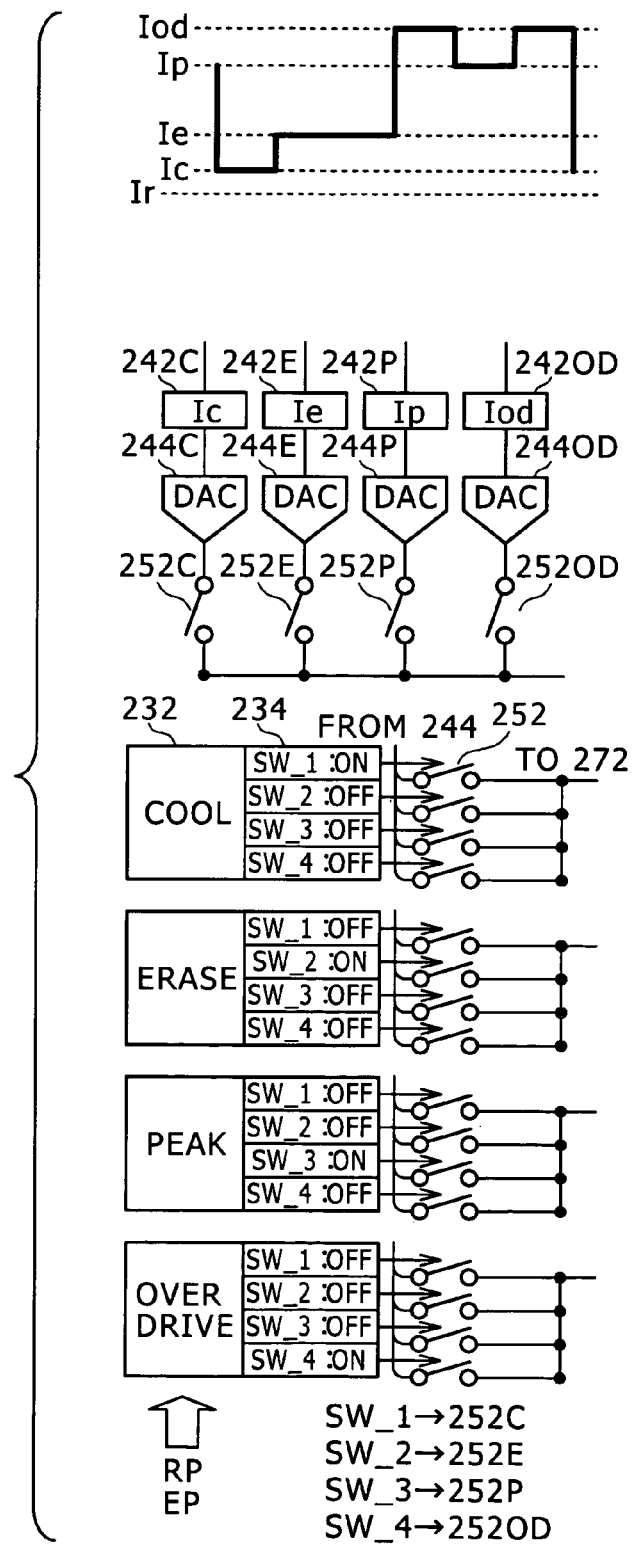
FIG. 4B is a diagram of assistance in explaining relation between information stored in a memory circuit and a current switch used in the laser driving circuit of the basic configuration.
Figure 4C:
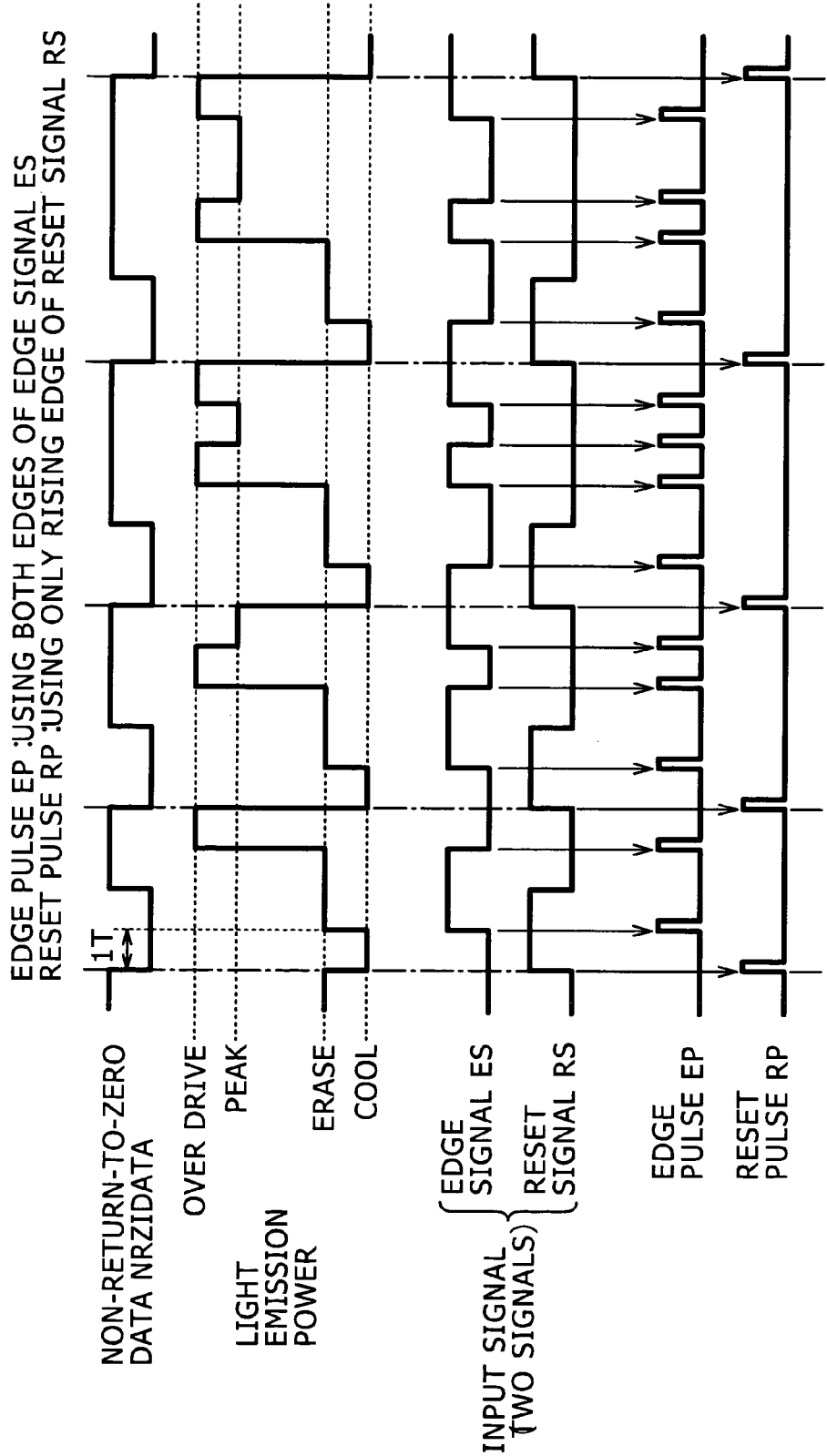
FIG. 4C is a diagram (first example) of assistance in explaining operation of the laser driving circuit of the basic configuration.
Figure 4D:
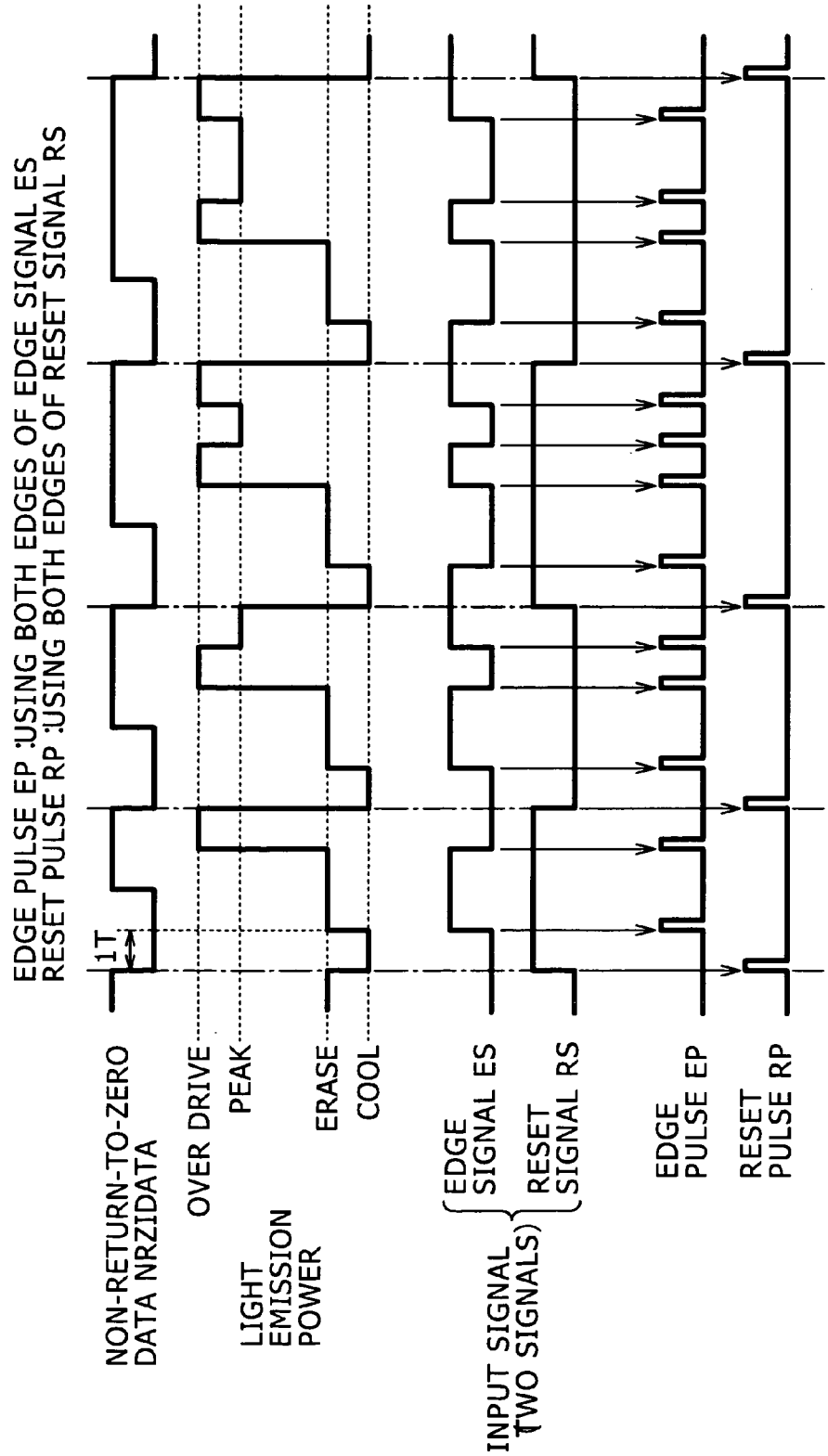
FIG. 4D is a diagram (second example) of assistance in explaining operation of the laser driving circuit of the basic configuration.
Figure 4E:
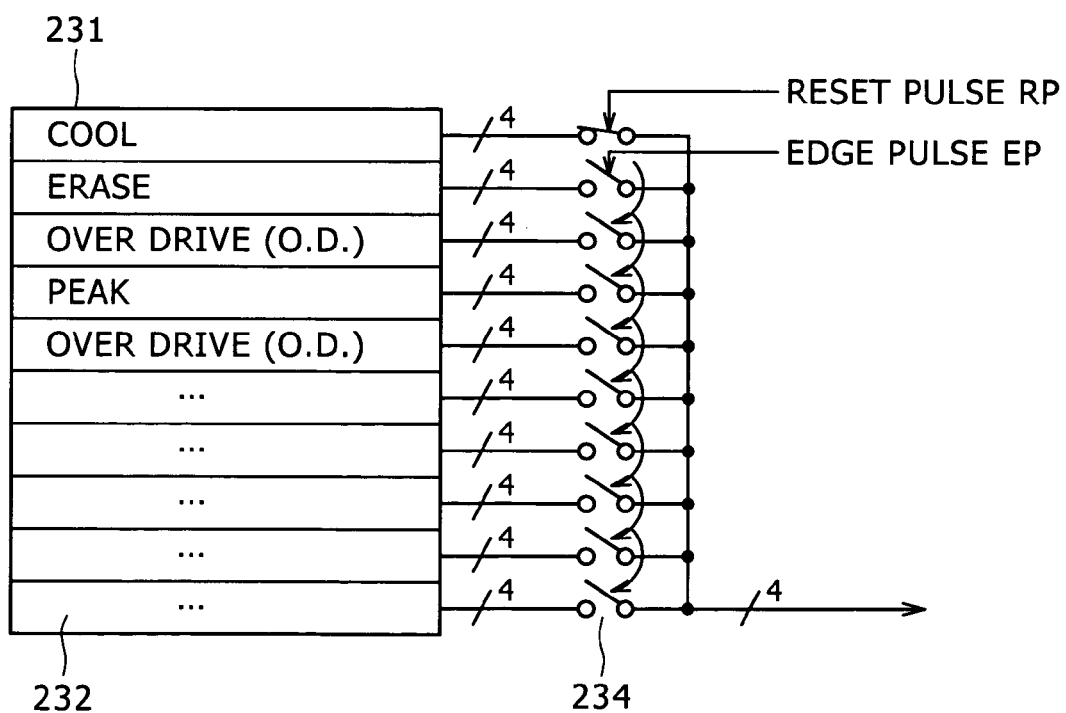
FIG. 4E is a diagram of assistance in explaining register setting information of power levels of the basic configuration.

FIGS. 4A to 4E are diagrams of assistance in explaining a basic mechanism of a laser driving system employing the sequential system. FIG. 4A is a diagram showing a laser driving circuit (corresponding particularly to the driving current controlling section 47 in FIG. 1B) for implementing a laser driving system of a basic configuration. FIG. 4B is a diagram of assistance in explaining relation between information stored in a memory circuit (light emission level pattern storing section) used in the laser driving circuit of the basic configuration and current switches. FIG. 4C and FIG. 4D are diagrams of assistance in explaining the operation of the laser driving circuit of the basic configuration. FIG. 4E is a diagram of assistance in explaining register setting information of the memory circuit corresponding to a recording waveform control signal pattern shown in FIG. 4C and FIG. 4D.

The basic configuration in a recording mode supplies one first transmission signal and one second transmission signal to a laser driving circuit 200, and drives a semiconductor laser 41 by the write strategy technique. As the first transmission signal, a reset signal RS indicating, by an edge, timing of obtaining a reference pulse indicating changing timing in repetition of spaces and marks is used. As the second transmission signal, an edge signal ES indicating, by an edge, timing of obtaining a changing pulse indicating timing of changing laser light emission level is used.

[Circuit Configuration: Basic Configuration]

As shown in FIG. 4A, a laser driving circuit 200V of a basic configuration includes a pulse generating section 202 having a reset pulse generating section 210 and an edge pulse generating section 220, a light emission level pattern storing section 230, a current source section 240, a current switch section 250, and a laser driving section 270. The reset pulse generating section 210 is an example of a first pulse generating section. The edge pulse generating section 220 is an example of a second pulse generating section. The light emission level pattern storing section 230 is an example of a second storing section, and is of a configuration in which the second storing section is used also as a light emission level pattern storing section.

Parts excluding the pulse generating section 202 and the laser driving section 270 in the laser driving circuit 200V correspond to a recording waveform generating section. The laser driving circuit 200V is supplied with a reset signal RS as a first transmission signal and an edge signal ES as a second transmission signal from a transmission signal generating section 500 provided in a digital signal processing section 57 on a drive board side.

The pulse generating section 202 generates a reset pulse RP and an edge pulse EP using the reset signal RS and the edge signal ES. For example, the reset pulse generating section 210 generates the reset pulse RP on the basis of the reset signal RS. The edge pulse generating section 220 generates the edge pulse EP on the basis of the edge signal ES. That is, timing of generation of the reset pulse RP is made synchronous with an edge of the reset signal RS, and timing of generation of the edge pulse EP is made synchronous with an edge of the edge signal ES. Suppose in this case that the reset pulse RP and the edge pulse EP are both an active-H pulse signal.

The reset pulse generating section 210 has an edge detecting circuit 212 as an example of a first edge detecting section. The edge pulse generating section 220 has an edge detecting circuit 222 as an example of a second edge detecting section. It suffices to apply publicly known techniques such for example as using a gate circuit such as a NAND (or AND) gate, a NOR (or OR) gate, an inverter, an EX-OR gate and the like to the edge detecting circuits 212 and 222. For example, when a non-inverting type logic gate is used as a delay element, and an input pulse signal and an output of the delay element are input to an EX-OR gate, both edges can be detected as an active H. When an inverting type logic gate is used as a delay element, and an input pulse signal and an output of the delay element are input to an AND gate, a rising edge can be detected as an active H, and when the input pulse signal and the output of the delay element are input to a NOR gate, a falling edge can be detected as an active H.

The reset pulse generating section 210 detects one of a rising edge and a falling edge of the input reset signal RS (a rising edge in this case) by the edge detecting circuit 212, generates the reset pulse RP, and supplies the reset pulse RP to the light emission level pattern storing section 230 (see FIG. 4C). As an example of modification, both of a rising edge and a falling edge of the reset signal may be detected to generate the reset pulse RP (see FIG. 4D).

The edge pulse generating section 220 detects both of a rising edge and a falling edge of the input edge signal ES by the edge detecting circuit 222, generates the edge pulse EP, and supplies the edge pulse EP to the light emission level pattern storing section 230. While it suffices to generate one reset pulse RP per cycle of repetition of spaces and marks, a plurality of edge pulses EP need to be generated per cycle of repetition of spaces and marks. Thus, the frequency of the edge signal ES is controlled to a low frequency by generating the edge pulses EP from both edges of the edge signal ES.

The light emission level pattern storing section 230 stores power level information (recording waveform control signal pattern) for laser light emission in each timing in a case where the write strategy technique is applied. For example, the light emission level pattern storing section 230 includes a plurality of registers 232_1 to 232_k (referred to collectively as a register set 231) and readout switches 234_1 to 234_k provided to outputs of the respective registers 232_1 to 232_k.

The register set 231 functions as a main storing section. Output lines of the respective registers 232_1 to 232_k and the corresponding readout switches 234_1 to 234_k are plural so that multivalued levels of laser power when the write strategy technique is applied can be set. The number of multivalued levels and the number of output lines of the registers 232_1 to 232_k and readout switches 234_1 to 234_k may be the same, or may be different from each other by using a decoder. Suppose that in the basic configuration, the number of multivalued levels and the number of output lines of the registers 232_1 to 232_k and readout switches 234_1 to 234_k are the same.

According to the recording waveform control signal pattern, the light emission level pattern storing section 230 stores information on each light emission power level with an initial level of the recording waveform control signal pattern first and information defining a changing mode of the current switch section 250, which information corresponds to the information on each light emission power level, in the registers 232_1 to 232_k in order. An example of the recording waveform control signal pattern will be described later. The control input terminal of the readout switch 234_1 in a first stage which switch is connected to the register 232_1 in the first stage which register retains information on the initial level is supplied with the reset pulse RP from the reset pulse generating section 210. The control input terminals of the readout switches 234_2, ..., and 234_k connected to the registers 232_2, ..., and 232_k in the second and subsequent stages are supplied with the common edge pulse EP from the edge pulse generating section 220. The readout switches 234_2 to 234_k are sequential switches for selecting outputs of the registers 232_2 to 232_k in order for each edge pulse EP.

The light emission level pattern storing section 230 in a recording mode outputs a plurality of current changing pulses SW for turning on/off each current switch of the current switch section 250 on the basis of the reset pulse RP, the edge pulse EP, and the power level information stored in the registers 232. Specifically, the light emission level pattern storing section 230 reads the power level information (particularly the current changing pulses SW for controlling the current switch section 250 in the present example) stored in the registers 232_2 to 232_k in order in timing of the edge pulse EP. Then, a return is made to the reading of the register 232_1 storing the initial level (reference level) information in timing of the reset pulse RP.

The current source section 240 includes a reference current generating section 242 and a current output type DA converting section 244 (IDAC). The reference current generating section 242 generates respective digital reference current values corresponding to multivalued power levels in a recording mode and a Read power level in a reproduction (readout) mode in the light emission pulse waveform of the semiconductor laser 41 on the basis of the information of the light emission level pattern storing section 230. For example, current information corresponding to each light emission power level is set as multi-bit digital data in the light emission level pattern storing section 230, and each part of the reference current generating section 242 corresponding to each light emission power level takes in the current information.

The DA converting section 244 converts the current information (digital data) generated in the reference current generating section 242 to an analog signal, and outputs the analog signal. Each part of the DA converting section 244 is supplied with a laser power specifying voltage PW from the APC controlling section 58 via the flexible board 51. Each part of the DA converting section 244 adjusts a DA conversion gain on the basis of the laser power specifying voltage PW. The light emission power of the semiconductor laser 41 is feedback-controlled to a fixed value according to the laser power specifying voltage PW.

The current switch section 250 has a current switch 252 (Current SW) to set one or an arbitrary combination (superimposition) of the power reference currents converted to an analog signal in the DA converting section 244 in the recording mode. The current switch section 250 controls light emission power by turning on/off the current switch 252 on the basis of a plurality of pieces of level information (specifically the current changing pulses SW) read from the light emission level pattern storing section 230.

In the present example, four values of Cool, Erase, Peak, and Over Drive are employed as multivalued levels in the recording mode (see FIG. 4B and FIG. 4C). In correspondence with this, the reference current generating section 242 includes separate reference current generating sections 242C, 242E, 242P, and 242OD for generating the four levels of reference current and a reference current generating section 242R for Read. The DA converting section 244 includes DA converting sections 244C, 244E, 244P, 244OD, and 244R in order to convert the reference currents generated in the reference current generating section 242 to an analog signal. The current switch 252 includes separate current switches 252C, 252E, 252P, 252OD, and 252R.

As shown in FIG. 4B, for example, the reference currents generated by the reference current generating section 242 are separate reference currents Ic, Ie, Ip, and Iod corresponding to the four values of Cool, Erase, Peak, and Over Drive, respectively. According to the employed configuration, the output pattern information of the current changing pulses SW for controlling the current switch 252 is also stored in the light emission level pattern storing section 230. In the recording mode, four kinds of current changing pulses SW_1 to SW_4 are output from each register 232 in the light emission level pattern storing section 230 to control the levels of the four values. In the present example, the reference currents Ic, Ie, Ip, and Iod are supplied to the corresponding current switches 252C, 252E, 252P, and 252OD for Cool, Erase, Peak, and Over Drive, respectively. Thus, it suffices to turn on one current switch 252 by activating one of the four kinds of current changing pulses SW_1 to SW_4.

The laser driving section 270 has a laser changing circuit 272 and a driver circuit 274. The laser changing circuit 272 for example has a switch of a three-input-one-output type for selecting three systems of a first semiconductor laser 41_1 for a CD system, a second semiconductor laser 41_2 for a DVD system, and a third semiconductor laser 41_3 for a next-generation DVD system. The driver circuit 274 has a first driver circuit 274_1 for driving the first semiconductor laser 41_1, a second driver circuit 274_2 for driving the second semiconductor laser 41_2, and a third driver circuit 274_3 for driving the third semiconductor laser 413. The laser driving section 270 has provisions for the semiconductor lasers 41_1, 41_2, and 41_3 for the three kinds of recording media, which are CD, DVD, and next-generation DVD. The laser driving section 270 changes the semiconductor laser 41 according to a recording medium.

With such a configuration, the laser driving circuit 200V generates the light emission waveform of multivalued power to which the write strategy technique is applied by a combination of a bias current providing the threshold current of the semiconductor laser 41 and a plurality of current pulses. A laser power controlling system (APC controlling system) not shown in the figure controls the multivalued power such that the laser power of the semiconductor laser 41 becomes the light emission waveform of the multivalued power.

[Operation: Basic Configuration]

Suppose that as shown in FIG. 4C and FIG. 4D, data input for writing is non-return-to-zero data NRZIDATA. Suppose that space length is 2 T, and that mark length is 2 T or more (2 T, 3 T, 4 T, and 5 T are illustrated in the figures). A highest-speed signal performs a 2-T repetition.

When the write strategy technique is applied, in the present example, in each space length of 2 T, a Cool level is set during the first half of 1 T and an Erase level is set during the second half of 1 T. In a mark length of 2 T, the Erase level is set during the first half of 1 T and an Over Drive level is set during the second half of 1 T. In a mark length of 3 T, the Erase level is set during the first period of 1 T, the Over Drive level (O.D.) is set during the second period of 1 T, and a Peak level is set during the third period of 1 T.

In a mark length of 4 T, the Erase level is set during the first period of 1 T, the Over Drive level is set during the second period of 1 T, the Peak level is set during the third period of 1 T, and the Over Drive level is set during the fourth period of 1 T. In a mark length of 5 T, the Erase level is set during the first period of 1 T, the Over Drive level is set during the second period of 1 T, the Peak level is set during the third period of 1 T, the Peak level is set during the fourth period of 1 T, and the Over Drive level is set during the fifth period of 1 T. That is, in the mark length of 5 T, the Peak level is maintained during the third and fourth periods of 2 T, and a transition is made to the Over Drive level during the subsequent fifth period of 1 T.

Irrespective of mark length, the Erase level is maintained during 2 T from the second half of a space to the first period of a mark, and a transition is made to the Over Drive level during the subsequent period of 1 T. The light emission power levels have a relation O.D.>Peak>Erase>Cool.

In correspondence with such a recording waveform control signal pattern, as shown in FIG. 4E, information on the Cool level is stored as initial level in the register 232_1 in the first stage. Information on the Erase level is stored in the register 232_2 in the second stage. Information on the Over Drive level is stored in the register 232_3 in the third stage. Information on the Peak level is stored in the register 232_4 in the fourth stage. Information on the Over Drive level is stored in the register 232_5 in the fifth stage.

One reset signal RS and one edge signal ES are used as an input pulse signal. A reset pulse RP is generated on the basis of a rising edge of the one reset signal RS or a rising edge and a falling edge of the one reset signal RS. An edge pulse EP is generated on the basis of both edges of the one edge signal ES. Then, the pieces of power level information stored in the respective registers 232_1 to 232_5 of the light emission level pattern storing section 230 are read in order from a first area (Cool in the present example). For example, the readout switch 234_1 is turned on to read the power level information of the register 232_1 in the first stage when the reset pulse RP is an active H. Thereafter, each time the edge pulse EP becomes an active H, the readout switches 234_2 to 234_5 of a sequential switch configuration are sequentially turned on to read the power level information of the registers 232_2 to 232_5 in order.

For example, when all the power level information is read in order at a time of recording of a mark length of 4 T or a mark length of 5 T, the laser light emission power is changed in order of Cool→Erase→Over→Drive→Peak→Over Drive.

Depending on the mark length of the non-return-to-zero data NRZIDATA, not all the levels are output. At a time of recording of a mark length of 2 T, power needs to be changed from Over Drive to Cool. In this case, the reset signal RS is supplied such that the reset pulse RP becomes an active H in timing immediately after Over Drive that is desired to be changed to Cool. Thereby information on Cool is read following Over Drive. Similarly, at a time of recording of a mark length of 3 T, it suffices to supply the reset signal RS such that the reset pulse RP becomes an active H in timing immediately after Peak desired to be changed to Cool so as to change power from Peak to Cool.

Laser Driving System

First Embodiment

Figure 5A:
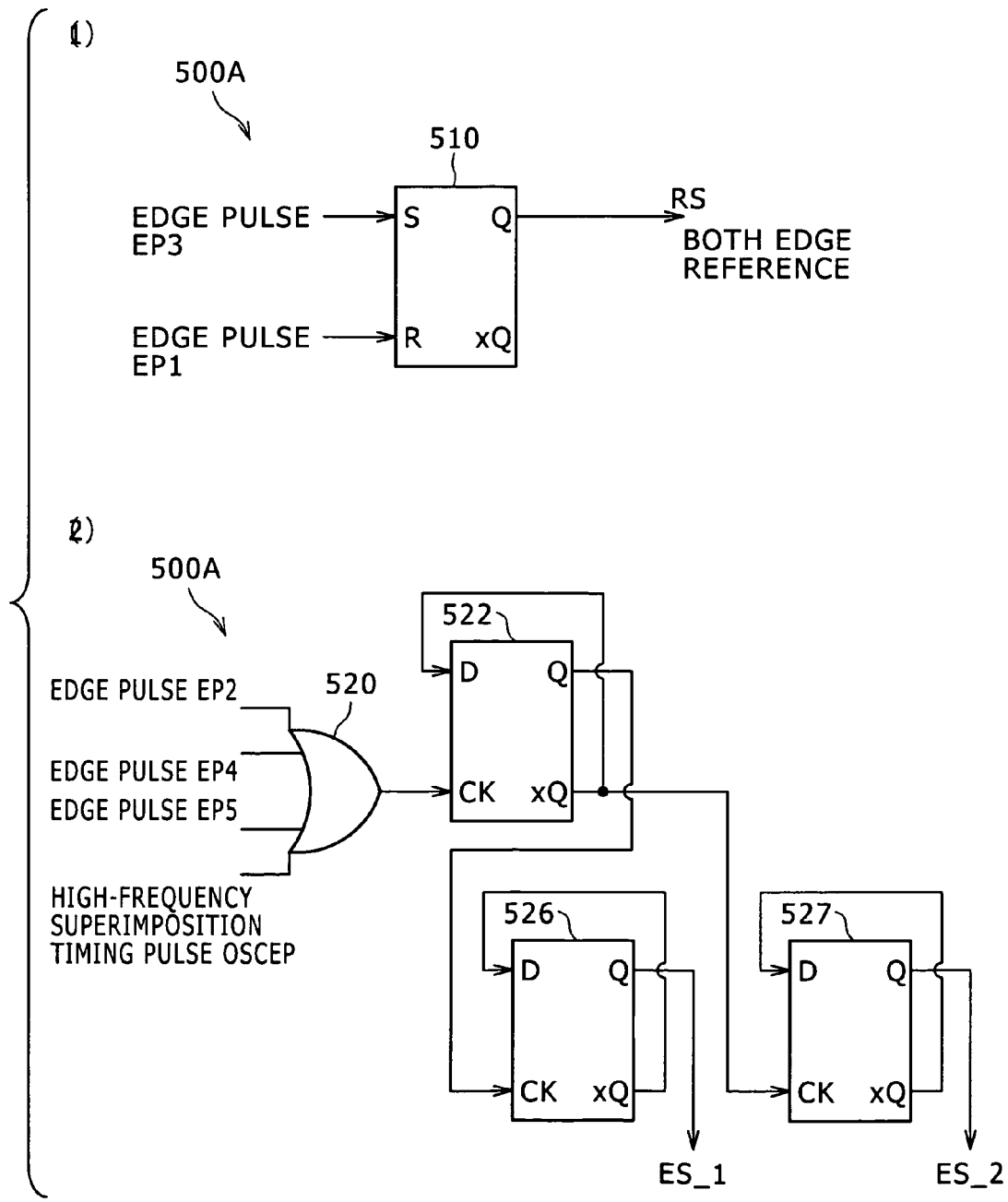
FIG. 5A is a diagram of assistance in explaining an example of configuration of a transmission signal generating section according to a first embodiment.
Figure 5C:
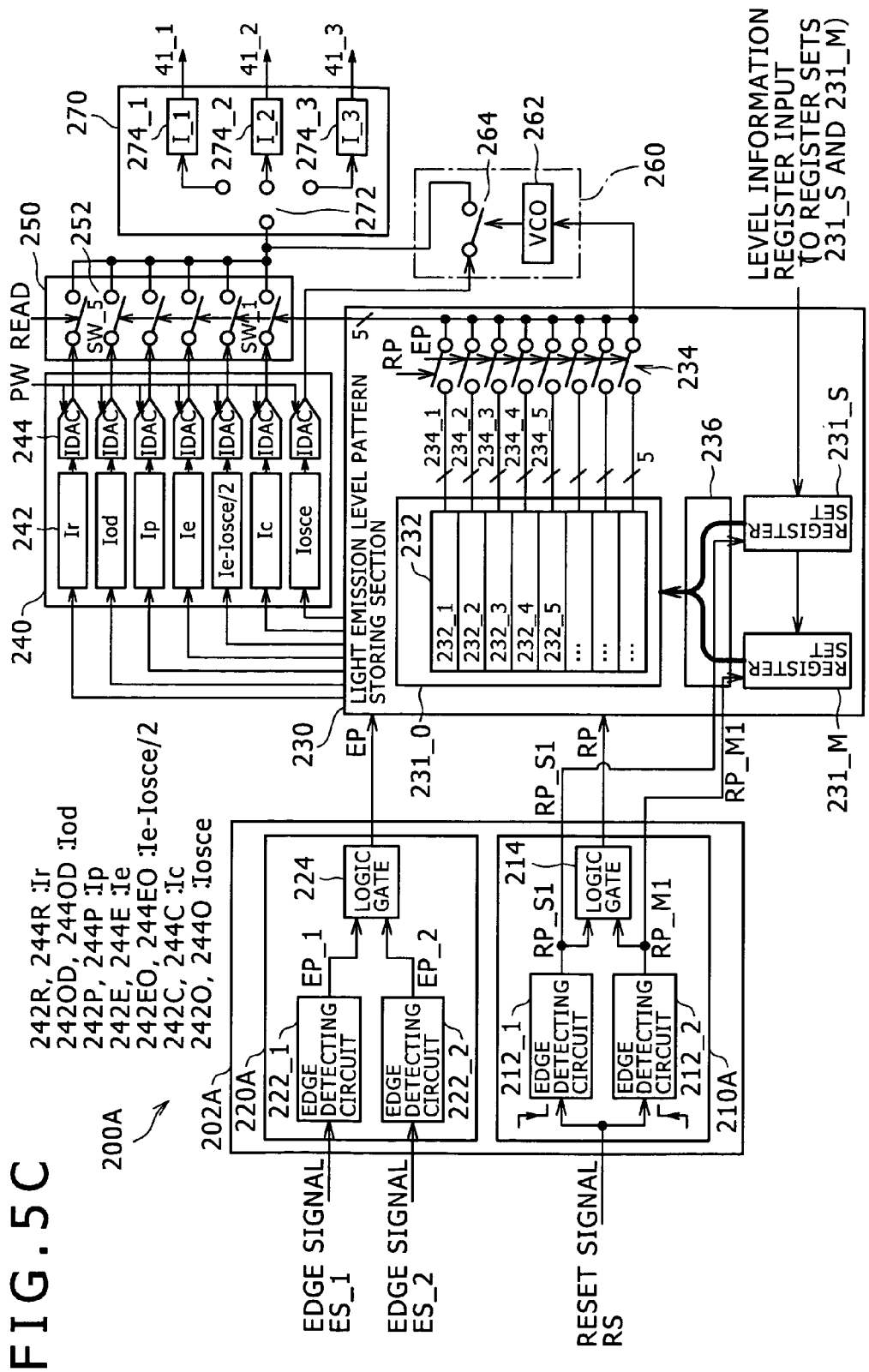
FIG. 5C is a diagram showing a laser driving circuit according to the first embodiment.
Figure 5D:
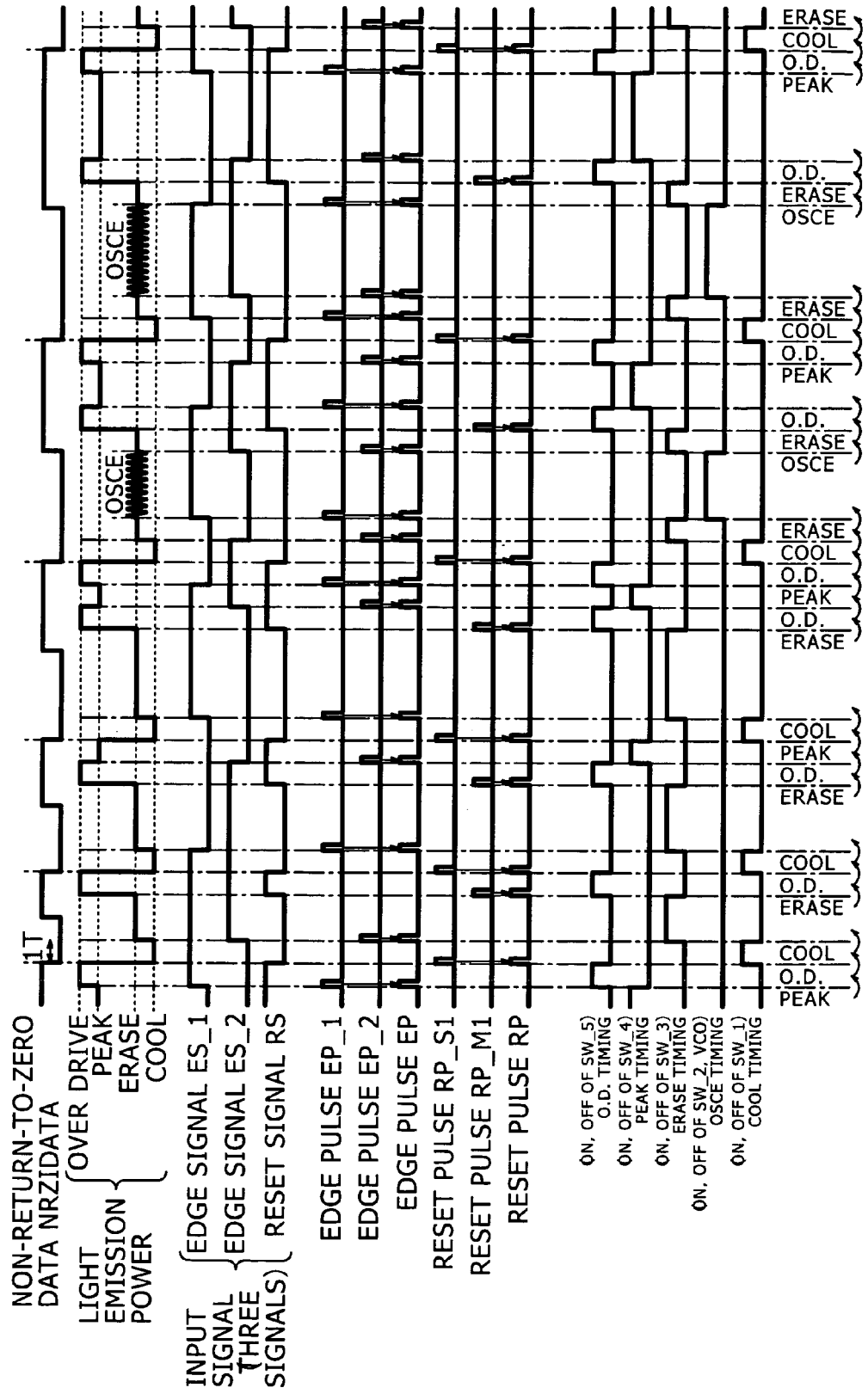
FIG. 5D is a diagram of assistance in explaining operation of the laser driving circuit according to the first embodiment.
Figure 5E:
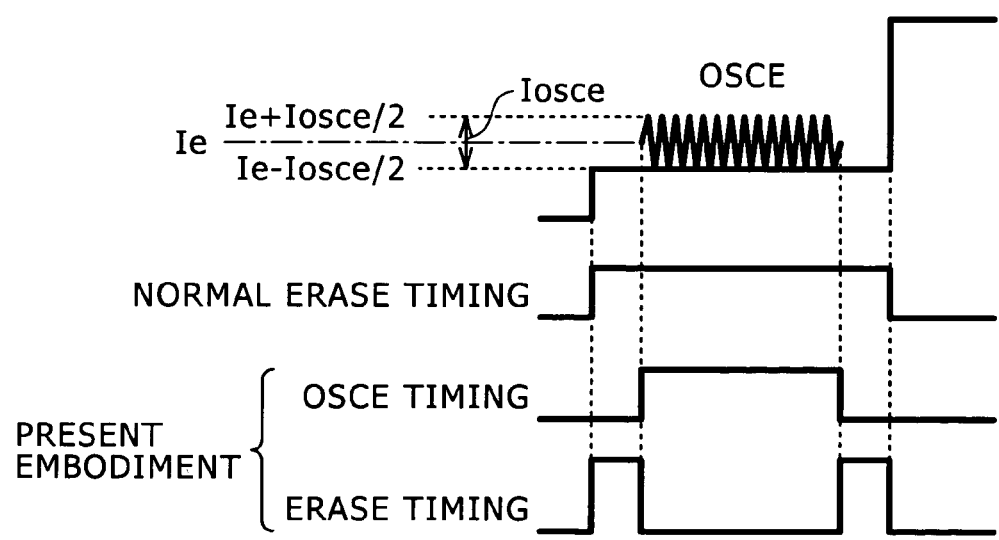
FIG. 5E is a diagram of assistance in explaining operation of the laser driving circuit according to the first embodiment.

FIGS. 5A to 5F are diagrams of assistance in explaining a first embodiment of a sequential system. FIG. 5A is a diagram of assistance in explaining an example of configuration of a transmission signal generating section 500A according to a first embodiment. FIG. 5B is a diagram of assistance in explaining operation of the transmission signal generating section 500A according to the first embodiment. FIG. 5C is a diagram showing a laser driving circuit 200A according to the first embodiment. FIG. 5D and FIG. 5E are diagrams of assistance in explaining operation of the laser driving circuit 200A according to the first embodiment. FIG. 5F is a diagram of assistance in explaining register setting information of a light emission level pattern storing section 230 corresponding to a recording waveform control signal pattern shown in FIG. 5D.

In the basic system shown earlier, a level pattern for a set of a space and a mark is stored, and levels are read in order starting with the space. Thus, for mark levels, even in the middle of a stored level, a transition can be made to an initial level of the space by performing reset. However, a space period has a constant Erase level, and no provision is made for level variation in the middle. When reset is performed in the middle of a space, a return is made to the initial level of the space, and thus a mark level following the space is not output. That is, an ending level of a space cannot be selected arbitrarily.

In order to deal with this, the first embodiment drives the semiconductor laser 41 while changing a recording power level independently for each of spaces and marks. Thus, level patterns of a space and a mark are separately stored in register sets 231, and reset is performed at starting edges of a space and a mark. In reset timing of a start of a space, a mark is ended, and the read-in of the level pattern of the space and the readout of an initial level (reference level) are performed. The initial level of a space in the present embodiment employing the castle system is a Cool level. In addition, in reset timing of a start of a mark; a space is ended, and the read-in of the level pattern of the mark and the readout of an initial level (reference level) are performed. The initial level of a mark in the present embodiment employing the castle system is an Over Drive level. Thus, by alternately reading the level patterns of spaces and marks, it is possible to end the level pattern of one of a space and a mark at an arbitrary level, and read out the initial level of the following other.

Incidentally, while the following measures are further taken in the first embodiment, these measures are not essential. In a recording mode, one first transmission signal and N (N is a positive integer of two or more) second transmission signals are supplied to the laser driving circuit 200A, and the semiconductor laser 41 is driven by the write strategy technique. Though the number of signal lines is increased, N second transmission signals are provided to enable high-speed transmission, and timing is transmitted by 2N edges of rising edges and falling edges of the second transmission signals, whereby a function of reducing a transmission band is achieved. The plurality of second transmission signals including information defining timing of obtaining a changing pulse are transmitted to solve problems in the transmission band more easily and make provision for high-speed recording. Edge timing may be transmitted by one signal as in the basic configuration.

As for a circuit configuration, the laser driving circuit 200A on an optical pickup 14 side is provided with a storing section for storing power level patterns (level information patterns). Suppose that the storing section includes a plurality of auxiliary storing section (each referred to as an auxiliary storing section) for storing respective different patterns and a main storing section for selectively storing one of the power level patterns stored in the plurality of respective auxiliary storing sections. For example, the power level pattern of one auxiliary storing section is stored in the main storing section, one reset signal RS is used to read a reference level of a repetitive pattern at the same time, and N edge signals ES are used to read levels subsequent to the reference level in order.

As for the reset signal RS, a falling edge and a rising edge of the reset signal RS are distinguished from each other, reset timing of a space is defined by one of the falling edge and the rising edge, and reset timing of a mark is defined by the other. Then, a power level change is effected by reading a power level pattern of an auxiliary storing section into the main storing section in synchronism with each edge (reset timing).

By performing reset at not only a starting edge of a space but also a starting edge of a mark, different patterns can be provided to the space and the mark. Ending level selection is thereby possible not only for a mark level but also for a space level. As with control of whether or not to generate the respective levels of Over Drive and Peak according to mark length, control of whether or not to generate a specific power level of a space according to space length can be performed.

That is, reset is triggered for marks and spaces separately. Thus, even when reset is performed in the middle of a space level to return to the reference level of a space, a mark level can be output for a space following the space on the basis of reset for the space. The ending level of each of a space and a mark can be selected arbitrarily without being affected by the other.

Description in the following will be made supposing that N=2 and centering on differences from the basic configuration. Incidentally, in the first embodiment, high-frequency superimposition that enables effective control by having different levels for spaces and marks will be taken as an example.

[Circuit Configuration: First Embodiment]

As shown in FIG. 5A, a transmission signal generating section 500A on a drive board side has an RS-type flip-flop 510 to generate a reset signal RS. The RS-type flip-flop 510 has a reset input terminal R supplied with an edge pulse EP1 defining timing of a start of a space, and has a set input terminal S supplied with an edge pulse EP3 defining timing of a start of a mark. Thus, a reset signal RS set to an L-level in synchronism with the edge pulse EP1 and set to an H-level in synchronism with the edge pulse EP3 is output from the non-inverting output terminal Q of the RS-type flip-flop 510.

In the present example, the reset signal RS defines a reset pulse RP_S1 for a space by a falling edge of the reset signal RS, and defines a reset pulse RP_M1 for a mark by a rising edge of the reset signal RS. When a signal from the inverting output terminal xQ of the RS-type flip-flop 510 is used as the reset signal RS, the reset signal RS defines a reset pulse RP_S1 for a space by a rising edge of the reset signal RS, and defines a reset pulse RP_M1 for a mark by a falling edge of the reset signal RS.

The transmission signal generating section 500A has a four-input type OR gate 520 and D-type flip-flops 522, 526, and 527 (a flip-flop may be described as an FF) to generate edge signals ES_1 and ES_2. Three input terminals of the OR gate 520 are first supplied with edge pulses EP2, EP4, and EP5 excluding a mark starting edge (edge pulse EP3 in this case). Further, one remaining input terminal is supplied with a high-frequency superimposition timing pulse OSCEP defining starting timing and ending timing of high-frequency superimposition. The output terminal of the OR gate 520 is connected to the clock input terminal CK of the D-type flip-flop 522. The inverting output terminal xQ of the D-type flip-flop 522 is connected to the D-input terminal of the D-type flip-flop 522, so that a ½ frequency divider circuit is formed.

The non-inverting output terminal Q of the D-type flip-flop 522 is connected to the clock input terminal CK of the D-type flip-flop 526. The inverting output terminal xQ of the D-type flip-flop 526 is connected to the D-input terminal of the D-type flip-flop 526, so that a ½ frequency divider circuit is formed. The inverting output terminal xQ of the D-type flip-flop 522 is connected to the clock input terminal CK of the D-type flip-flop 527. The inverting output terminal xQ of the D-type flip-flop 527 is connected to the D-input terminal of the D-type flip-flop 527, so that a ½ frequency divider circuit is formed.

Thus, the non-inverting output terminal Q and the inverting output terminal xQ of the D-type flip-flop 522 change to an L or an H in order in synchronism with the rising edge of one of the edge pulses EP2, EP4, and EP5 and the high-frequency superimposition timing pulse OSCEP. Then, the non-inverting output terminal Q and the inverting output terminal xQ of the D-type flip-flop 526 change to an L or an H in order in synchronism with the rising edge of the non-inverting output terminal Q of the D-type flip-flop 522. In addition, the non-inverting output terminal Q and the inverting output terminal xQ of the D-type flip-flop 527 change to an L or an H in order in synchronism with the rising edge of the inverting output terminal xQ of the D-type flip-flop 522.

Hence, supposing that the output pulse of the non-inverting output terminal Q or the inverting output terminal xQ of the D-type flip-flop 526 is an edge signal ES_1, an edge pulse EP_1 is defined by both edges of the edge signal ES_1. In addition, supposing that the output pulse of the non-inverting output terminal Q or the inverting output terminal xQ of the D-type flip-flop 527 is an edge signal ES_2, an edge pulse EP_2 is defined by both edges of the edge signal ES_2.

As shown in FIG. 5C, the laser driving circuit 200A (pulse generating section 202A) according to the first embodiment has a reset pulse generating section 210A and an edge pulse generating section 220A.

As in the basic configuration, a reset pulse generating section 210A generates a reset pulse RP by detecting edges of the reset signal RS. A difference from the basic configuration lies in that the reset pulse generating section 210A distinguishes a falling edge and a rising edge of the reset signal RS from each other and extracts the reset pulse RP_S1 for a space and the reset pulse RP_M1 for a mark. In relation to the transmission signal generating section 500A, the reset pulse generating section 210A has an edge detecting circuit 212_1 for generating the reset pulse RP_S1 for a space at the falling edge and an edge detecting circuit 212_2 for generating the reset pulse RP_M1 for a mark at the rising edge.

The reset pulses RP_S1 and RP_M1 are not used to control a readout switch 234_1 as they are, but are used to select a plurality of kinds of power level patterns. That is, while the reset pulses RP_S1 and RP_M1 are pulses defining timing of repetition of marks and spaces, the reset pulses RP_S1 and RP_M1 have only a function of selecting a register set 231 unlike the reset pulse RP.

The reset pulse generating section 210A has a logic gate 214 as an example of a pulse synthesizing section in a stage succeeding the edge detecting circuits 212_1 and 212_2. The logic gate 214 generates the reset pulse RP by making a logic synthesis of the reset pulses RP_S1 and RP_M1 output from the respective edge detecting circuits 212_1 and 212_2. Suppose that the reset pulses RP_S1 and RP_M1 are active-H pulse signals. In correspondence with this, an OR gate obtaining a logical sum of the reset pulses RP_S1 and RP_M1 is used as the logic gate 214.

When the reset signal RS is output from the inverting output terminal xQ of the RS-type flip-flop 510, it suffices to make the edge detecting circuit 212_1 generate the reset pulse RP_S1 at the rising edge of the reset signal RS and make the edge detecting circuit 212_2 generate the reset pulse RP_M1 at the falling edge of the reset signal RS.

The edge pulse generating section 220A generates an edge pulse EP on the basis of the two edge signals ES_1 and ES_2 as a second transmission signal. Thus, the edge pulse generating section 220A has two edge detecting circuits 222_1 and 222_2 and a logic gate 224 as an example of a pulse synthesizing section. The edge detecting circuit 222_1 detects both edges of the edge signal ES_1 and generates an edge pulse EP_1. The edge detecting circuit 222_2 detects both edges of the edge signal ES_2 and generates an edge pulse EP_2. The logic gate 224 generates an edge pulse EP by performing logic synthesis of the edge pulses EP_1 and EP_2 output from the respective edge detecting circuits 222_1 and 222_2. Suppose that the edge pulses EP_1 and EP_2 are active-H pulse signals. In correspondence with this, an OR gate obtaining a logical sum of the edge pulses EP_1 and EP_2 is used as the logic gate 224.

For power level setting at the time of high-frequency superimposition, a reference current generating section 242O and 244O for Iosce and a reference current generating section 242EO and 244EO for "Ie−Iosce/2" are added to a current source section 240. Thus, a current switch section 250, registers 232 of the register sets 231, and the like are configured so as to correspond to five kinds of current changing pulses SW_1 to SW_5. Further, a high-frequency changing section 260 for changing current between an H-level and an L-level at high frequency is added as well as a light emission level pattern storing section 230, the current source section 240, the current switch section 250, and a laser driving section 270. The high-frequency changing section 260 has a high-frequency oscillating section 262 such as a voltage-controlled oscillator (VCO) or the like and a changing switch 264. The changing switch 264 has an input terminal connected to the output of the DA converting section 244O, has an output terminal connected to a node of connection between the current switch section 250 and the laser driving section 270, and has a control input terminal connected to the output of the high-frequency oscillating section 262. The oscillation frequency of the high-frequency oscillating section 262 is register-input, and the setting of the oscillation frequency of the high-frequency oscillating section 262 is not changed by reset or the like.

[Memory Circuit: First Embodiment]

As shown in FIG. 5D, a recording waveform control signal pattern is different from that of the basic configuration, and high-frequency superimposition (OSCE) is selectively applied according to space length. When space length is 2 T, 3 T, or 4 T, a transition is made to Over Drive as a start of a mark part in timing of the reset signal RS without high-frequency superimposition being applied. When space length is 5 T or 6 T, a transition is made following Erase to high-frequency superimposition and then Erase in timing of the edge signals ES_1 and ES_2, and thereafter a transition is made to Over Drive as a start of a mark part in timing of the reset signal RS.

In order to selectively apply high-frequency superimposition according to space length, a light emission level pattern storing section 230 according to the first embodiment has a register set 231_0 functioning as a main storing section, register sets 231_S and 231_M functioning as auxiliary storing sections, and a stored information controlling section 236. The register sets 231_S and 231_M separately store two kinds of respective recording waveform control signal patterns according to an instruction of level information register input from a main controlling section not shown in the figure. The register set 231_0 corresponds to the register set 231 in the basic configuration. The stored information controlling section 236 reads information stored in one of the register sets 231_S and 231_M on the basis of the reset pulse RP and the selection pulse MC, and makes the register set 231_0 retain the information.

[Operation: First Embodiment]

As shown in FIG. 5D, one reset signal RS and two edge signals ES_1 and ES_2 are used as input pulse signals, and therefore a total of three input pulse signals are used. The reset pulses RP_S1 and RP_M1 and the reset pulse RP are generated on the basis of the reset signal RS.

Specifically, an edge pulse generating section 220A generates the edge pulses EP_1 and EP_2 from both edges of the respective edge signals ES_1 and ES_2 on the basis of the edge signals ES_1 and ES_2, obtains a logical sum of the edge pulses EP_1 and EP_2, and sets the logical sum as an edge pulse EP.

The reset pulse generating section 210A generates the reset pulse RP_S1 from the falling edge of the reset signal RS and generates the reset pulse RP_M1 from the rising edge of the reset signal RS on the basis of the reset signal RS, obtains a logical sum of the reset pulses RP_S1 and RP_M1, and sets the logical sum as a reset pulse RP.

As shown in FIG. 5F, a register set 231_S for a space has a Cool level as an initializing level set in a register 232_1, has an Erase level set in registers 232_2 and 232_4, and has a high-frequency superimposition level (OSCE) set in a register 232_3. A register set 231_M for a mark has an Over Drive level as an initializing level set in registers 232_1 and 232_3, and has a Peak level set in a register 232_2.

When the reset pulse RP_S1 is an active H, a stored information controlling section 236 reads out stored information stored in the register set 231_S for a space and sets the stored information in a register set 231_0. When the reset pulse RP_M1 is an active H, the stored information controlling section 236 reads out stored information stored in the register set 231_M for a mark and sets the stored information in the register set 231_0. That is, in timing in which the reset pulse RP_S1 or RP_M1 becomes an active H, the stored information controlling section 236 rewrites the memory information of the register set 231_0 with a corresponding power level pattern. That is, a rising edge and a falling edge of the reset signal RS are distinguished from each other, a power level pattern for a space is read into the main storing section at one edge, and a power level pattern for a mark is read into the main storing section at the other edge.

Further, as in the basic configuration, the reset pulse RP output from the logic gate 214 is supplied to the readout switch 234_1 of the light emission level pattern storing section 230. The rest is the same as in the basic configuration. A return is made to an initial level set in the register 232_1 with the reset pulse RP, and the respective levels of the register 232_2 and subsequent registers are thereafter read out in order with the edge pulse EP.

Thus, it is possible not only to change the ending level of a mark according to mark length by performing reset at a starting edge of a space (=an ending edge of the mark) but also change the ending level of a space by performing reset at a starting edge of a mark (=an ending edge of the space). The transmission band of the reset signal RS is similar to that of non-return-to-zero data NRZIDATA, and a 2-T mark and a 2-T space represent a shortest cycle, thus presenting no problem.

For example, on CD-R and DVD-R media, high-frequency superimposition on light emission power is performed to reduce noise of the semiconductor laser 41 in a read section and a space section during write. High-frequency superimposition is selectively performed in long space sections, and the period of the superimposition needs to avoid interference with an adjacent mark area. In related art, timing of high-frequency superimposition is transmitted by a separate signal.

In the first embodiment, the ending timing and power level of a space area can be changed independently of a mark area, and thus a high-frequency superimposition (OSCE) can be output selectively. Specifically, a high-frequency superimposition level is handled as one level, and is stored in the level pattern of the register set 231_S. When "a high-frequency superimposition level is handled as one level," it suffices to define the high-frequency superimposition level as an amplitude (peak-to-peak amplitude or the like) at the time of the high-frequency superimposition.

For a short space, reset for starting a mark is put in after a first Erase level without inputting an edge corresponding to a high-frequency superimposition, whereby a transition can be made to an Over Drive level as the reference level of a mark without outputting the high-frequency superimposition. That is, by performing reset at not only a starting edge of a space but also a starting edge of a mark, different patterns can be provided to the space and the mark. As a result, power level control can be performed independently of power level control in a mark area, and on/off control of high-frequency superimposition can be performed according to space length, for example. High-frequency superimposition control can be performed in an edge section corresponding to a high-frequency superimposition.

Incidentally, a reference current generating section 242 for generating a digital high-frequency current value corresponding to the "high-frequency superimposition level" read from the light emission level pattern storing section 230 as well as a current output type DA converting section 244 is desirably provided for power level setting at the time of high-frequency superimposition (OSCE). In addition, it suffices to add the high-frequency changing section 260 for changing current between an L-level and an H-level at high frequency.

The following points are desirably considered in regard to how to configure the reference current generating section 242, the DA converting section 244, and the high-frequency changing section 260. First, in the sequential system, output from the light emission level pattern storing section 230 (level information storing section) is timing pulses for turning on/off switches corresponding to the respective timing pulses. For example, Cool, Erase, and the like shown in the registers 232 within the register sets 231_5 and 231_M shown in FIG. 5F mean that timing pulses corresponding to the respective levels are generated and that the other bits are an L-level.

When Osce is stored in the register set 231_S, for example, there are five levels in total (Cool, Erase, O.D., Peak, and Osce), and all memories of the registers 232_1 to 232_4 have information of five bits. A period when the register 232_3 having Osce set therein is accessed has an H-level only for OSCE timing, and timing of high-frequency superimposition (OSCE) is generated (see FIG. 5D). Incidentally, current information can be retained directly. In this case, a timing pulse of a normal light emission power level is a multi-bit current DAC signal, and Osce generates a multi-bit current DAC signal plus one Osce timing pulse.

In power level setting at the time of high-frequency superimposition, first, digital data of Iosce is retained in the same manner as other power levels. This data corresponds to the amplitude of high-frequency superimposition. At this time, "Ie−Iosce/2" of the reference current generating section 242EO is output from the DA converting section 244EO, and a current switch 252 is turned on/off in OSCE timing. Separately from this, a system for outputting Iosce of the reference current generating section 242O from the DA converting section 244O to the changing switch 264 is prepared for high-frequency superimposition. Further, the high-frequency changing section 260 turns on/off the oscillation of the high-frequency oscillating section 262 in a section of OSCE (same timing as Ie−Iosce/2).

In this example, the H-information of the register 232_3 is notified to SW_2 of the current switch 252 and the high-frequency oscillating section 262 via a readout switch 234 in OSCE timing. Therefore, "Ie−Iosce/2" is supplied to the laser driving section 270 in OSCE timing, and in this state, the high-frequency oscillating section 262 oscillates at a high frequency to turn on/off the changing switch 264. Because Iosce is supplied to the changing switch 264, as shown in FIG. 5E, the laser driving section 270 is consequently supplied with "Ie−Iosce/2" at the off time of the changing switch 264 and "Ie+Iosce/2" at the on time of the changing switch 264. That is, the high-frequency changing section 260 turns on/off the supply of Iosce in a state of "Ie−Iosce/2" being supplied to the laser driving section 270. A high-frequency superimposition is thereby applied with an amplitude of Iosce/2 with Ie as a center in OSCE timing.

In addition, the first embodiment uses two second transmission signals (edge signals ES_1 and ES_2), and thereby decreases a transmission band per transmission signal by two edges and makes provision for high-speed recording. The transmission band per transmission signal is not degraded, and high-speed recording is possible.

[Laser Driving System: Second Embodiment]

FIG. 6A is a diagram of assistance in explaining a first example of setting of setting information of a sampling pulse SP employed in the second embodiment. FIG. 6B is a diagram of assistance in explaining a second example of setting of the setting information of the sampling pulse SP employed in the second embodiment.

The second embodiment is an example of application in the system configuration in the second example shown in FIG. 3B (that is, a configuration in which attention is directed also to a signal for APC control and a method of generating and transmitting a sampling pulse SP).

In order to facilitate understanding of a mechanism of the second embodiment, description will first be made of an example of a basic mechanism of the method of generating and transmitting the sampling pulse SP when the sequential system is used in combination. Then the mechanism of the second embodiment will be described.

[Sampling Pulse Setting: First Example]

The first setting example shown in FIG. 6A sets a sampling pulse SP_1 for a mark (=mark gate MG). The laser light emission waveform has four power levels of Cool, Erase, Peak, and Over Drive. It is considered that of the power levels, power levels for forming a mark are Peak and Over Drive and power levels for forming a space are Cool and Erase.

For example, the sampling pulse SP_1 for a mark which pulse is supplied to a sample-hold circuit 332 is generated by setting a delay time from a certain edge as a starting point for forming the mark, a pulse width, and an overall delay time for delay compensation up to the sample-hold circuit 332.

Description in the following will be made of a case where of Peak and Over Drive for forming the mark, the Peak level having a relatively wide width is sampled and held by the sampling pulse SP_1. The sampling pulse SP_1 is to sample and hold the Peak level of a power monitor signal PM. Thus, timing is set such that the power monitor signal PM can be sampled after becoming statically determinate from the Over Drive level to the Peak level. It is thus desirable to generate the sampling pulse SP_1 with a starting position of the Peak level as a reference because the effect of space width is eliminated. In setting the timing of sampling the Peak level, compensation for the signal band and delay of a signal path from the pulse generating section 202 to the sample-hold circuit 332 is taken into consideration.

For example, when the castle system is applied, as shown in FIG. 6A, timing T12 of a start of the Peak level is set as an edge of a starting point (reference edge) for sampling the Peak level. With the reference edge T12 as a starting point, a rising edge delay time TD1_1 (T12 to T13) defining the rising edge timing T13 of the sampling pulse SP_1 is set. The rising edge delay time TD1_1 is set in consideration of a time for the power monitor signal PM input to the sample-hold circuit 332 to become statically determinate from the Over Drive level to the Peak level.

Further, with the rising edge timing T13 as a starting point, a pulse width PW1 (T13 to T15) defining the period of the active H of the sampling pulse SP_1 and a pulse delay time TD1_2 (T13 to T16) taken for the sampling pulse SP_1 to actually become the active H are set. The pulse delay time TD1_2 is set in consideration of making compensation for a difference between the delay time of the sampling pulse in the signal path from the pulse generating section 202 to the sample-hold circuit 332 and the delay time of the power monitor signal PM. The delay time of the sampling pulse is a time taken for the sampling pulse to be input from the pulse generating section 202 through the sampling pulse generating section 400 to the sample-hold circuit 332. The delay time of the power monitor signal PM is a time taken for the semiconductor laser 41 to emit light in response to a signal input from the pulse generating section 202 through a light emission waveform generating section 203 to the semiconductor laser 41 and for the light to be made incident on a light receiving element 310 and input to the sample-hold circuit 332 through a current-voltage converting section 313 and a variable gain type amplifier 315. Thus, the sampling pulse SP_1 rises after the passage of "TD1_1+TD1_2" from the timing T12, and falls after the passage of the pulse width PW1.

Incidentally, in a case of a short mark having a short mark length, a setting is made so as not to generate the sampling pulse SP_1 for the mark. For example, a period from the reference edge T12 to timing T14 of a start of the Over Drive, which is an end of the Peak level, is set as a sampling pulse output determination setting period DET1. When the sampling pulse output determination setting period DET1 does not reach a predetermined value, the sampling pulse SP_1 is not output. For example, for the waveform of the power monitor signal PM which waveform takes 10 ns to become statically determinate from the Over Drive level to the Peak level, the rising edge delay time TD1_1 is set at 10 ns or more. Thereby a correct Peak level can be sampled and held. At this time, the sampling pulse output determination setting period DET1 is set at 10 ns. Thereby the sampling pulse SP_1 is not generated for the pulse of the Peak level having a width of less than 10 ns.

[Sampling Pulse Setting: Second Example]

The second setting example shown in FIG. 6B sets a sampling pulse SP_2 for a space (=space gate SG). The laser light emission waveform has the same power levels as in FIG. 6A.

The generation of the sampling pulse SP_2 for a space is as follows, and is similar to that for a mark. That is, the sampling pulse SP_2 for a space is generated by setting a delay time from a certain edge as a starting point for forming the space, a pulse width, and an overall delay time for delay compensation up to the sample-hold circuit 334.

Description in the following will be made of a case where of Cool and Erase for forming the space, the Erase level having a relatively wide width is sampled and held by the sampling pulse SP_2. The sampling pulse SP_2 is to sample and hold the Erase level of the power monitor signal PM. Thus, timing is set such that the power monitor signal PM can be sampled after becoming statically determinate from the Cool level to the Erase level. It is thus desirable to generate the sampling pulse SP_2 with a starting position of the Erase level as a reference because the effect of mark width is eliminated. In setting the timing of sampling the Erase level, compensation for the signal band and delay of a signal path from the pulse generating section 202 to the sample-hold circuit 334 is taken into consideration.

For example, when the castle system is applied, as shown in FIG. 6B, timing T32 of a start of the Erase level is set as an edge of a starting point (reference edge) for sampling the Erase level. With the reference edge T32 as a starting point, a rising edge delay time TD3_1 (T32 to T33) defining the rising edge timing T33 of the sampling pulse SP_2 is set. The rising edge delay time TD3_1 is set in consideration of a time for the power monitor signal PM input to the sample-hold circuit 334 to become statically determinate from the Cool level to the Erase level. Further, with the rising edge timing. T33 as a starting point, a pulse width PW3 (T33 to T34) defining the period of the active H of the sampling pulse SP_2 and a pulse delay time TD3_2 (T33 to T37) taken for the sampling pulse SP_2 to actually become the active H are set. The pulse delay time TD3_2 is set in consideration of making compensation for a difference between the delay time of the sampling pulse in the signal path from the pulse generating section 202 to the sample-hold circuit 334 and the delay time of the power monitor signal PM. Thus, the sampling pulse SP_2 rises after the passage of "TD3_1+TD3_2" from the timing T32, and falls after the passage of the pulse width PW3.

Incidentally, in a case of a short space having a short space length, a setting is made so as not to generate the sampling pulse SP_2 for the space. For example, a period from the reference edge T32 to timing T35 of a start of the Over Drive, which is an end of the Erase level, is set as a sampling pulse output determination setting period DET3. When the sampling pulse output determination setting period DET3 does not reach a predetermined value, the sampling pulse SP_2 is not output. For example, for the waveform of the power monitor signal PM which waveform takes 10 ns to become statically determinate from the Cool level to the Erase level, the rising edge delay time TD3_1 is set at 10 ns or more. Thereby a correct Erase level can be sampled and held. At this time, the sampling pulse output determination setting period DET3 is set at 10 ns. Thereby the sampling pulse SP_2 is not generated for the pulse of the Erase level having a width of less than 10 ns.

[Sampling Pulse Change]

Higher speed makes it difficult to perform sampling for APC with a short mark or a short space. On the other hand, the above-described sampling pulse setting examples allow a setting such that no sampling pulse is generated for a short mark or a short space of a specified length or less. This mechanism enables selective sampling only for a long mark or a long space exceeding the predetermined length.

The first example and the second example of setting the sampling pulses determine whether or not to generate the sampling pulses SP_1 and SP_2 on the basis of the values of the sampling pulse output determination setting periods DET1 and DET3. Thus, there is basically no necessity to prepare two pieces of setting information. However, there are two meanings as follows, for example, in changing the settings of the sampling pulses.

1) When a signal indicating whether to output the sampling pulse SP or not can be superimposed on an input signal, it is not necessary to measure the sampling pulse output determination setting period DET1 or DET3 for determining output on the part of the sampling pulse generating section 400, and thus the sampling pulse generating section 400 is simplified.

2) When the level pattern of a short mark is changed with edge consecutiveness, amounts of change in power from Over Drive OD1 to Peak and from Over Drive OD2 to Peak (Peak is the same power) become different, and statically determinate time also becomes different. There accordingly arises a need to vary the rising edge position (rising edge delay time TD1_1) and the falling edge position (pulse delay time TD1_2) of the sampling pulse SP.

In this case, 1) changes only the sampling pulse settings, and 2) supposes combined use of the changing of the power level pattern and the changing of the sampling pulse settings.

A method using a dedicated terminal to change the setting information of the sampling pulse SP is also conceivable, but has problems of an increase in package area and accuracy of changing timing.

In order to deal with this, changing the setting information of the sampling pulse SP in the same manner as power level change is considered. At this time, when a reset pulse RP is generated for a pair of mark length and space length as in the basic configuration, and the setting information of mark sampling and space sampling is changed only by the reset pulse RP, each piece of setting information cannot be changed independently. In particular, when reset is performed in the middle of a space level, a return is made to the reference level of a space, and thus a mark level following the space is not output. That is, the ending level of a space cannot be selected arbitrarily.

Accordingly, as with the first embodiment, the second embodiment triggers reset for marks and spaces independently, and changes the setting information of the sampling pulse SP using each reset timing. At the time of "using reset timing," not only the respective reset pulses RP_S1 and RP_M1 for marks and spaces but also another pulse may be used.

Incidentally, while the following measures are further taken in the second embodiment, these measures are not essential. First, as in the first embodiment, one first transmission signal and N (N is a positive integer of two or more) second transmission signals are supplied to a laser driving circuit 200B, and a semiconductor laser 41 is driven by the write strategy technique, whereby high-speed transmission is enabled.

In addition, information other than information on transition timing itself of the second transmission signals can be transmitted by providing information to whether a same one of the "N second transmission signals" provides transition timing of the second transmission signals immediately before and immediately after transition timing of the first transmission signal. Whether a same one of the "N second transmission signals" provides transition timing of the second transmission signals immediately before and immediately after transition timing of the first transmission signal will hereinafter be referred to also as "whether edges of the second transmission signals before and after the first transmission signal are consecutive or non-consecutive." Information other than the timing information is transmitted by adding information for memory change to whether the edges before and after reset are consecutive or non-consecutive. The "information other than information on transition timing itself of the second transmission signals" is specifically used to select the setting information of a plurality of kinds of sampling pulses SP.

Incidentally, in the second embodiment, independent power level setting for spaces and marks in relation to power levels is also used in combination. At this time, in the second embodiment, the changing of a power level setting is similar to that of the first embodiment, and the setting information of the sampling pulse SP is changed for each of a space and a mark while one independent setting is made for each of the space and the mark.

As for a circuit configuration, the laser driving circuit 200B on an optical pickup 14 side is provided with a storing section for storing the setting information of sampling pulses SP. Suppose that the storing section includes a plurality of auxiliary storing sections (each will be referred to as an auxiliary storing section) for storing the setting information of different sampling pulses SP for each of spaces and marks and a main storing section for selectively storing one of the pieces of setting information stored in the plurality of respective auxiliary storing sections.

A combination of edge timing of N edge signals ES is provided with information for selecting the setting information of the plurality of kinds of sampling pulses SP. The information is decrypted by the laser driving circuit 200B to change the setting information. Specifically, when edges of the same edge signal ES of the N edge signals ES are consecutive edges with an edge of the reset signal RS interposed between the consecutive edges, the setting information stored in another auxiliary storing section is stored in the main storing section. Thus, in the second embodiment, whether edges of the edge signals ES immediately before and immediately after an edge of the reset signal RS are edges of the same edge signal ES is determined (which will be referred to as edge consecutiveness detection for the edge signal ES).

Description will be made below centering on differences from the basic configuration with N=2. Basically, in addition to a reset at a space starting edge, a reset is triggered at a starting edge of a mark, and edge consecutiveness/non-consecutiveness with each of the resets interposed is detected, whereby mark sampling and space sampling are controlled independently of each other. In order to deal with this, the second embodiment changes the setting information of the sampling pulse SP using information of the edge consecutiveness/non-consecutiveness of the edge signals ES.

[Circuit Configuration: Second Embodiment]

Figure 7C:
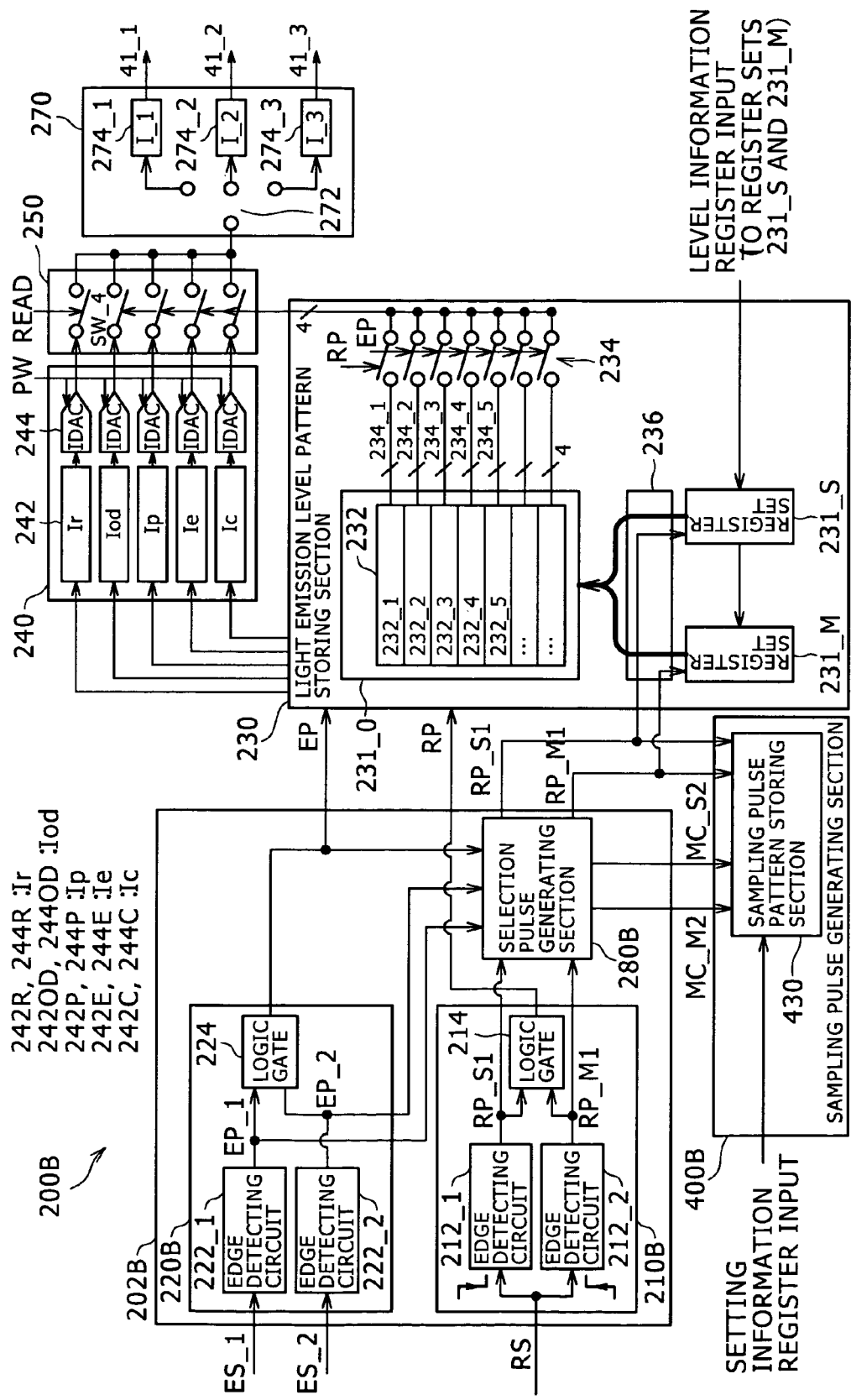
FIG. 7C is a diagram showing a laser driving circuit according to the second embodiment.
Figure 7F:
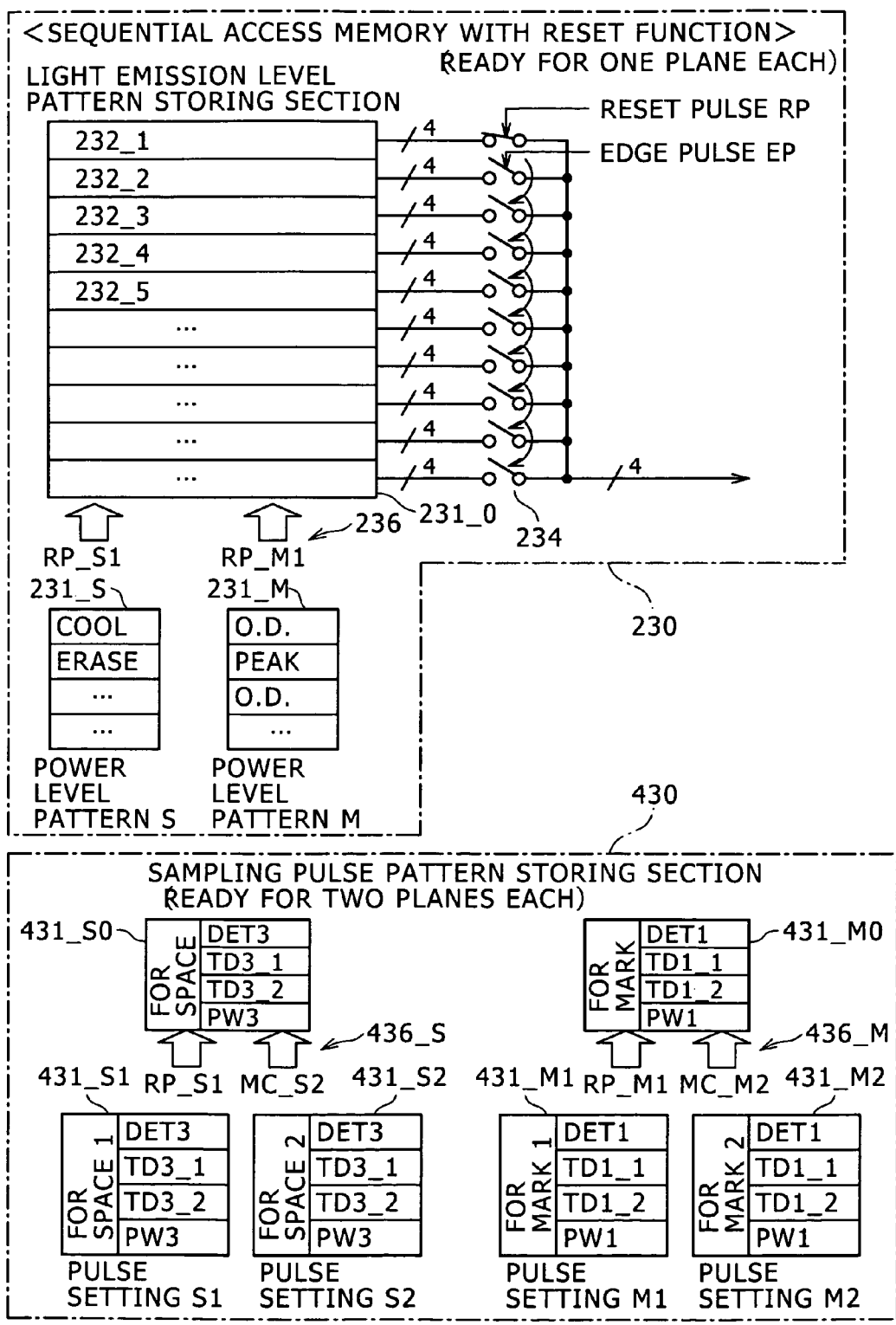
FIG. 7F is a diagram (first example) of assistance in explaining register setting information of sampling pulses.
Figure 7G:
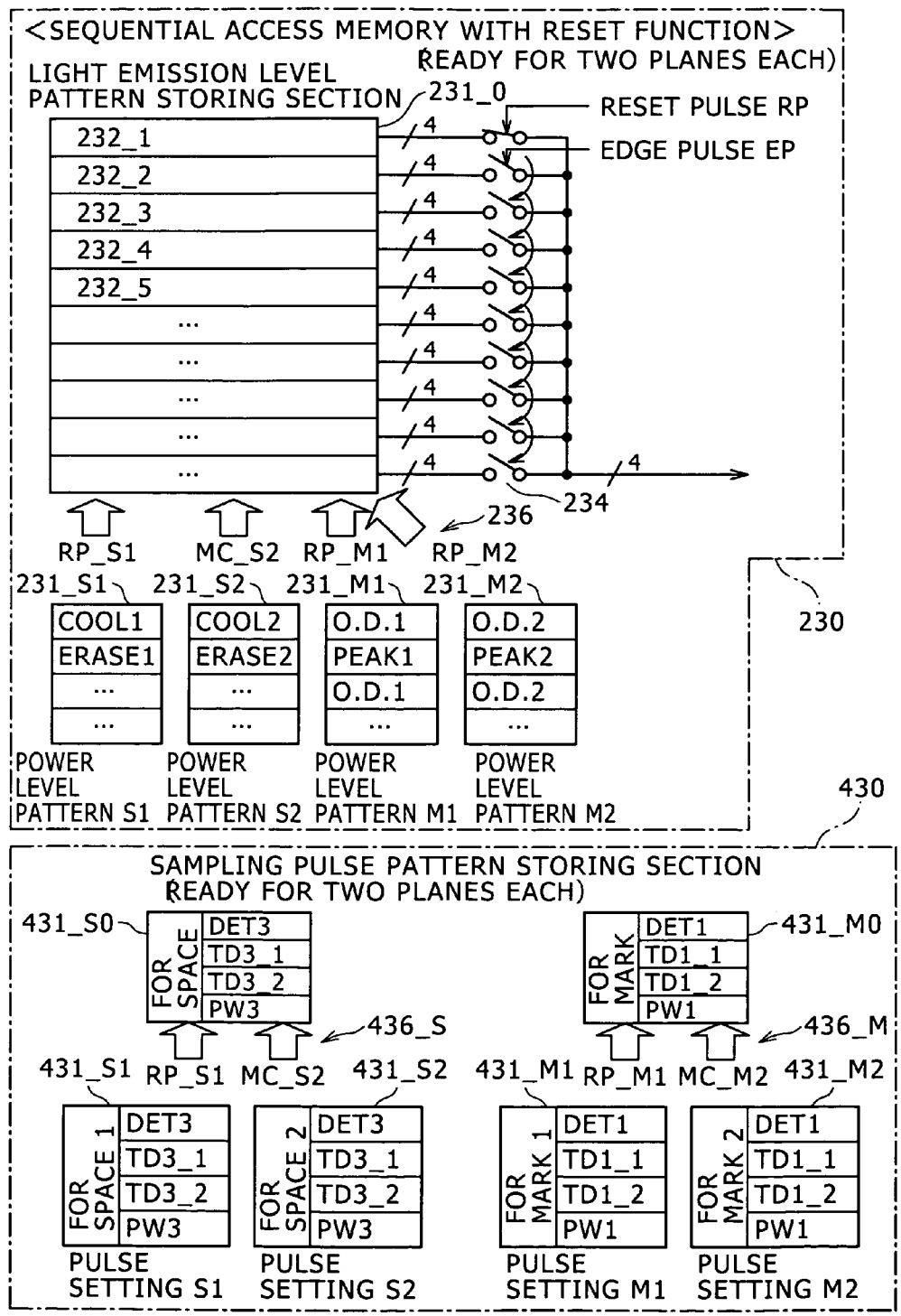
FIG. 7G is a diagram (second example) of assistance in explaining register setting information of sampling pulses.

FIGS. 7A to 7H are diagrams of assistance in explaining a second embodiment of the sequential system. FIG. 7A is a diagram of assistance in explaining an example of configuration of a transmission signal generating section 500B according to the second embodiment. FIG. 7B is a diagram of assistance in explaining operation of the transmission signal generating section 500B according to the second embodiment. FIG. 7C is a diagram showing a laser driving circuit 200B according to the second embodiment. FIG. 7D is a diagram showing a selection pulse generating section 280B according to the second embodiment. FIG. 7E is a diagram of assistance in explaining operation of the laser driving circuit 200B according to the second embodiment. FIGS. 7F to 7H are diagrams of assistance in explaining register setting information of a sampling pulse pattern storing section 430.

As shown in FIG. 7A, the transmission signal generating section 500B on a drive board side has a similar configuration for generating a reset signal RS to that of the first embodiment. The transmission signal generating section 500B has a three-input type OR gate 520, a NOR gate 521, a D-type flip-flop 522, and AND gates 523P and 523N to generate edge signals ES_1 and ES_2. Further, the transmission signal generating section 500B has an MG setting determining section 524M, an SG setting determining section 524S, AND gates 525M and 525S, D-type flip-flops 526 and 527, and a two-input type OR gate 529.

Edge pulses EP2, EP4, and EP5 are supplied to respective input terminals of the OR gate 520. The output terminal of the OR gate 520 is connected to one input terminal of the NOR gate 521, one input terminal of the AND gate 523P, and one input terminal of the AND gate 523N. The output terminal of the NOR gate 521 is connected to the clock input terminal CK of the D-type flip-flop 522. The inverting output terminal xQ of the D-type flip-flop 522 is connected to the D-input terminal of the D-type flip-flop 522, so that a ½ frequency divider circuit is formed. The inverting output terminal xQ of the D-type flip-flop 522 is also connected to the other input terminal of the AND gate 523N. The non-inverting output terminal Q of the D-type flip-flop 522 is connected to the other input terminal of the AND gate 523P.

The output terminal of the AND gate 523P is connected to the clock input terminal CK of the D-type flip-flop 526. The inverting output terminal xQ of the D-type flip-flop 526 is connected to the D-input terminal of the D-type flip-flop 526, so that a ½ frequency divider circuit is formed. An edge signal ES_1 is output from the non-inverting output terminal Q of the D-type flip-flop 526, as will be described later. The output terminal of the AND gate 523N is connected to the clock input terminal CK of the D-type flip-flop 527. The inverting output terminal xQ of the D-type flip-flop 527 is connected to the D-input terminal of the D-type flip-flop 527, so that a ½ frequency divider circuit is formed. An edge signal ES_2 is output from the non-inverting output terminal Q of the D-type flip-flop 527, as will be described later.

The MG setting determining section 524M has an input terminal supplied with a recording mark length determination result, and has an output terminal connected to one input terminal of the AND gate 525M. An edge pulse EP3 is input to another input terminal of the AND gate 525M. The output terminal of the AND gate 525M is connected to one input terminal of the OR gate 529. The SG setting determining section 524S has an input terminal supplied with a recording space length determination result, and has an output terminal connected to one input terminal of the AND gate 525S. An edge pulse EP1 is input to another input terminal of the AND gate 525S. The output terminal of the AND gate 525S is connected to another input terminal of the OR gate 529. The output terminal of the OR gate 529 is connected to another input terminal of the NOR gate 521.

The MG setting determining section 524M is to generate a sampling pulse for a mark (MarkSamplingPulse). The MG setting determining section 524M outputs an L when selecting a first mark sampling setting according to the recording mark length determination result, and outputs an H when selecting a second mark sampling setting according to the recording mark length determination result. The SG setting determining section 524S is to generate a sampling pulse for a space (SpaceSamplingPulse). The SG setting determining section 524S outputs an L when selecting a first space sampling setting according to the recording space length determination result, and outputs an H when selecting a second space sampling setting according to the recording space length determination result.

The edge pulse EP1 is output to the output terminal of the AND gate 525S according to the space sampling setting of the SG setting determining section 524S. At the time of the first space sampling setting and the L-level, the non-inverting output terminal Q and the inverting output terminal xQ of the D-type flip-flop 522 change to an L or an H in order in synchronism with the falling edge of one of the edge pulses EP2, EP4, and EP5. At the time of the second space sampling setting and the H-level, the non-inverting output terminal Q and the inverting output terminal xQ of the D-type flip-flop 522 change to an L or an H in order in synchronism with the falling edge of one of the edge pulses EP1, EP2, EP4, and EP5.

The edge pulse EP3 is output to the output terminal of the AND gate 525M according to the mark sampling setting of the MG setting determining section 524M. At the time of the first mark sampling setting and the L-level, the non-inverting output terminal Q and the inverting output terminal xQ of the D-type flip-flop 522 change to an L or an H in order in synchronism with the falling edge of one of the edge pulses EP2, EP4, and EP5. At the time of the second mark sampling setting and the H-level, the non-inverting output terminal Q and the inverting output terminal xQ of the D-type flip-flop 522 change to an L or an H in order in synchronism with the falling edge of one of the edge pulses EP3, EP2, EP4, and EP5.

The AND gate 523P selectively outputs the edge pulse EP2, EP4, or EP5 as output of the OR gate 520 to the D-type flip-flop 526 when the output of the non-inverting output terminal Q of the D-type flip-flop 522 is an H-level. The AND gate 523N selectively outputs the edge pulse EP2, EP4, or EP5 as output of the OR gate 520 to the D-type flip-flop 527 when the output of the inverting output terminal xQ of the D-type flip-flop 522 is an H.

The non-inverting output terminal Q and the inverting output terminal xQ of the D-type flip-flop 526 change to an L or an H in order in synchronism with the rising edge of the edge pulse selected by the AND gate 523P. The non-inverting output terminal Q and the inverting output terminal xQ of the D-type flip-flop 527 change to an L or an H in order in synchronism with the rising edge of the edge pulse selected by the AND gate 523N.

Supposing that the output pulse of the non-inverting output terminal Q or the inverting output terminal xQ of the D-type flip-flop 526 is an edge signal ES_1, an edge pulse EP_1 is defined by both edges of the edge signal ES_1. Supposing that the output pulse of the non-inverting output terminal Q or the inverting output terminal xQ of the D-type flip-flop 527 is an edge signal ES_2, an edge pulse EP_2 is defined by both edges of the edge signal ES_2.

The edge signals ES_1 and ES_2 alternately perform logical inversion on the basis of the edge pulses EP2, EP4, and EP5 in principle. However, the following changes are added. When the H-level of the second space sampling setting is output from the SG setting determining section 524S, the D-type flip-flop 522 inverts output also with the edge pulse EP1, and in transition timing after the edge pulse EP1, the edge signal that performed logical inversion immediately before the edge pulse EP1 performs logical inversion first rather than alternately. When the H-level of the second mark sampling setting is output from the MG setting determining section 524M, the D-type flip-flop 522 inverts output also with the edge pulse EP3, and in transition timing after the edge pulse EP3, the edge signal that performed logical inversion immediately before the edge pulse EP3 performs logical inversion first rather than alternately.

At the time of the second space sampling setting, edges of a same edge signal ES_1 or ES_2 are consecutive with a falling edge of the reset signal RS, which falling edge corresponds to the edge pulse EP1, interposed between the edges of the same edge signal ES_1 or ES_2, and the edge signals ES_1 and ES_2 have information for changing the setting information of a space sampling pulse SP. At the time of the second mark sampling setting, edges of a same edge signal ES_1 or ES_2 are consecutive with a rising edge of the reset signal RS, which rising edge corresponds to the edge pulse EP3, interposed between the edges of the same edge signal ES_1 or ES_2, and the edge signals ES_1 and ES_2 have information for changing the setting information of a mark sampling pulse SP.

As shown in FIG. 7C and FIG. 7D, the pulse generating section 202 of the laser driving circuit 200B according to the second embodiment includes the selection pulse generating section 280B (third pulse generating section) for generating a selection pulse MC in addition to a reset pulse generating section 210B and an edge pulse generating section 220B. The reset pulse generating section 210B and the edge pulse generating section 220B are the same as in the first embodiment.

Incidentally, as differences from the first embodiment, control related to high-frequency superimposition (OSCE) is not performed, and thus a current switch section 250, registers 232 of register sets 231, and the like are configured so as to correspond to four kinds of current changing pulses SW_1 to SW_4.

The selection pulse generating section 280B has an edge consecutiveness detecting function for determining whether edges of the edge signals ES immediately before and immediately after an edge of the reset signal RS are edges of the same edge signal ES. When edges of the edge signal ES_1 are consecutive with an edge of the reset signal RS interposed between the edges of the edge signal ES_1, or when edges of the edge signal ES_2 are consecutive with an edge of the reset signal RS interposed between the edges of the edge signal ES_2, the selection pulse generating section 280B generates a selection pulse MC_S2 or MC_M2 on the basis of the edge signal ES_1 or ES_2 after the consecutiveness. Reset pulses RP_S1 and RP_M1 are used to select a plurality of kinds of power level patterns and the setting information of a plurality of kinds of sampling pulses SP. The selection pulses MC_S2 and MC_M2 are used to select the setting information of the plurality of kinds of sampling pulses SP.

As a concrete configuration, as shown in detail in FIG. 7D, the selection pulse generating section 280B has three determination signal generating sections 286_E, 286_RS, and 286_RM and six logic gates 287_1, 287_2, 287_3, 287_4, 287_5, and 287_6. The determination signal generating section 286E generates a determination pulse DEP set at an active-H from a falling edge of the edge pulse EP_1 generated in an edge detecting circuit 222_1 to a falling edge of the edge pulse EP_2 generated in an edge detecting circuit 222_2, as well as an inverted signal xDEP of the determination pulse DEP.

The determination signal generating section 286_RS generates a determination pulse DRSP set at an active-H from a rising edge of the reset pulse RP_S1 to a falling edge of an edge pulse EP or the reset pulse RP_M1. The determination signal generating section 286_RM generates a determination pulse DRMP set at an active-H from a rising edge of the reset pulse RP_M1 to a falling edge of the edge pulse EP or the reset pulse RP_S1.

A three-input type AND gate obtaining a logical product of the edge pulse EP_1, the determination pulse DEP, and the determination pulse DRSP is used as the logic gate 287_1. A three-input type AND gate obtaining a logical product of the edge pulse EP_2, the determination pulse xDEP, and the determination pulse DRSP is used as the logic gate 287_2. A two-input type OR gate obtaining a logical sum of the outputs of the logic gates 287_1 and 287_2 is used as the logic gate 287_3. The output of the logic gate 287_3 is set as the selection pulse MC_S2. Unlike the reset pulse RP_μl, the selection pulse MC_S2 does not have a function of a reference pulse indicating changing timing in repetition of spaces, but has a function of selecting a register set 431 for the space sampling pulse SP.

A three-input type AND gate obtaining a logical product of the edge pulse EP_1, the determination pulse DEP, and the determination pulse DRMP is used as the logic gate 287_4. A three-input type AND gate obtaining a logical product of the edge pulse EP_2, the determination pulse xDEP, and the determination pulse DRMP is used as the logic gate 287_5. A two-input type OR gate obtaining a logical sum of the outputs of the logic gates 287_4 and 287_5 is used as the logic gate 287_6. The output of the logic gate 287_6 is set as the selection pulse MC_M2. Unlike the reset pulse RP_M1, the selection pulse MC_M2 does not have a function of a reference pulse indicating changing timing in repetition of marks, but has a function of selecting a register set 431 for the mark sampling pulse SP.

Specifically, the reset pulse RP_S1 is supplied to a register set 231_S and the sampling pulse pattern storing section 430, and the reset pulse RP_M1 is supplied to a register set 231_M and the sampling pulse pattern storing section 430. The selection pulses MC_S2 and MC_M2 are supplied only to the sampling pulse pattern storing section 430.

[Memory Circuit: Second Embodiment]

As in the first embodiment, the light emission level pattern storing section 230 according to the second embodiment is configured to be able to make a level setting for a space and a mark independently. However, in the first embodiment, high-frequency superimposition (OSCE) is not performed in the period of a mark using "making a transition to a mark without outputting all space levels in the period of a mark." The second embodiment has a different object. Reasons therefor will be described later.

A mechanism of storing two kinds of setting information including different sampling pulse output determination setting periods DET1 and DET3 is adopted for the side of a sampling pulse generating section 400B. One has settings for generating the sampling pulse SP irrespective of mark length and space length (settings with long periods DET1 and DET3), and the other has settings for not generating the sampling pulse SP for a short mark or a short space of a predetermined length or less (settings with short periods DET1 and DET3). Alternatively, one has settings for sampling a monitored waveform signal immediately after the monitored waveform signal becomes statically determinate by setting a short rising edge delay time TD_1 at the time of a short mark, and the other has settings for sampling the monitored waveform signal in timing in which the monitored waveform signal becomes statically determinate sufficiently by setting a long rising edge delay time TD_1 at the time of a long mark.

As a basic idea, an idea of preparing a plurality of register sets 231 to change a power level pattern is adopted. At this time, as with the first embodiment, the second embodiment changes the power level pattern for a space and a mark independently according to space length and mark length.

In the present embodiment, the register set 431 is changed using as a trigger the reset pulse RP_S1 generated in starting timing of a space and the reset pulse RP_M1 generated in starting timing of a mark. Thus, the respective settings of mark sampling and space sampling are changed independently of each other. In addition, the register set 431 is changed using as a trigger the selection pulse MC_S2 after the reset pulse RP_S1 and the selection pulse MC_M2 after the reset pulse RP_M1. Thus, two pieces of setting information can be selected for each of a space and a mark.

For example, as shown in FIG. 7F, the sampling pulse pattern storing section 430 stores setting information (such as DET@, TD@_1, PW@, and TD@_2) at the time of generating sampling pulses SP_1 and SP_2 on the basis of a write strategy signal for each of a space and a mark. The sampling pulse pattern storing section 430 is an example of a second storing section, and is different from the light emission level pattern storing section 230.

For example, the sampling pulse pattern storing section 430 has, for the space sampling pulse, a register set 431_S0 functioning as a main storing section, register sets 431_S1 and 431_S2 functioning as auxiliary storing sections, and a stored information controlling section 436_S. Similarly, the sampling pulse pattern storing section 430 has, for the mark sampling pulse, a register set 431_M0 functioning as a main storing section, register sets 431_M1 and 431_M2 functioning as auxiliary storing sections, and a stored information controlling section 436_M. The register sets 431_S0 and 431_M0 have a plurality of registers 432_1 to 432_k. The same is true for the register sets 431_S1, 431_S2, 431_M1, and 431_M2, though not shown in the figure.

The register sets 431_S1, 431_S2, 431_M1, and 431_M2 separately store setting information (DET@, TD@_1, PW@, and TD@_2) at the time of generating the sampling pulses SP_1 and SP_2 according to an instruction of sampling pulse setting information register input from a main controlling section not shown in the figure. The register sets 431_S0 and 431_M0 correspond to the register set 231_0. The stored information controlling section 436_S and the stored information controlling section 436_M correspond to the stored information controlling section 236. The stored information controlling section 436_S reads information stored in one of the register sets 431_S1 and 431_S2 on the basis of the reset pulse RP_S1 and the selection pulse MC_S2, and makes the register set 431_S0 retain the information. The stored information controlling section 436_M reads information stored in one of the register sets 431_M1 and 431_M2 on the basis of the reset pulse RP_M1 and the selection pulse MC_M2, and makes the register set 431_M0 retain the information.

The sampling pulse generating section 400B reads the information of the registers 432 of the register sets 431_S0 and 431_M0, and generates the sampling pulses SP_1 and SP_2 according to the values.

[Operation: Second Embodiment]

As shown in FIG. 7E, because one reset signal RS and two edge signals ES_1 and ES_2 are used as input pulse signals, there are three input pulse signals in total. The reset pulse RP and the reset pulses RP_S1 and RP_M1 are generated on the basis of the reset signal RS, and the selection pulses MC_S2 and MC_M2 are generated when edges of the same edge signals ES_1 and ES_2 make a transition with reset pulses RP_S1 and RP_M1 interposed between the edges.

Specifically, the edge pulse generating section 220B generates edge pulses EP_1 and EP_2 from both edges of the respective edge signals ES_1 and ES_2 on the basis of the edge signals ES_1 and ES_2, obtains a logical sum of the edge pulses EP_1 and EP_2, and sets the logical sum as an edge pulse EP.

The reset pulse generating section 210B generates the reset pulse RP_S1 from the falling edge of the reset signal RS and generates the reset pulse RP_M1 from the rising edge of the reset signal RS on the basis of the reset signal RS, obtains a logical sum of the reset pulses RP_S1 and RP_M1, and sets the logical sum as a reset pulse RP.

When edges of one of the edge signals ES_1 and ES_2 are consecutive with a falling edge of the reset signal RS interposed between the edges of the edge signal, the selection pulse generating section 280B generates the selection pulse MC_S2 with the edge after the consecutiveness. When edges of one of the edge signals ES_1 and ES_2 are consecutive with a rising edge of the reset signal RS interposed between the edges of the edge signal, the selection pulse generating section 280B generates the selection pulse MC_M2 with the edge after the consecutiveness.

As in the first example shown in FIG. 7F, as for the side of the light emission level pattern storing section 230, a similar operation to that of the first embodiment is performed on the basis of the reset pulses RP_S1, RP_M1, and RP, and the edge pulse EP. On the other hand, as for the side of the sampling pulse pattern storing section 430, the stored information controlling section 436_S reads out the information stored in the register set 431_S1 for a space and sets the information in the register set 431_S0 when the reset pulse RP_S1 is an active H. The stored information controlling section 436_S reads out the information stored in the register set 431_S2 for a space and sets the information in the register set 431_S0 when the selection pulse MC_S2 is an active H. That is, in timing in which the reset pulse RP_S1 or the selection pulse MC_S2 becomes an active H, the stored information controlling section 436_S rewrites the memory information of the register set 431_S0 with the setting information for a corresponding space gate SG.

The stored information controlling section 436_M reads out the information stored in the register set 431_M1 for a mark and sets the information in the register set 431_M0 when the reset pulse RP_M1 is an active H. The stored information controlling section 436_M reads out the information stored in the register set 431_M2 for a mark and sets the information in the register set 431_M0 when the selection pulse MC_M2 is an active H. That is, in timing in which the reset pulse RP_M1 or the selection pulse MC_M2 becomes an active H, the stored information controlling section 436_M rewrites the memory information of the register set 431_M0 with the setting information for a corresponding mark gate MG. The setting information of the register sets 431_S2 and 431_M2 can be rewritten in a vacant time by register input.

Incidentally, in the example of FIG. 7F, even when the information of the register set 431_S2 or 431_M2 is set in the main storing section (register set 431_S0 or 431_M0) according to the selection pulse MC_S2 or MC_M2, the information is once rewritten by the information of the register set 431_S1 or 431_M1 in reset timing for a space or a mark (reset pulse RP_S1 or RP_M1). However, no problem is presented in actuality by preventing the sampling pulse generating section 400 from using the setting information at this time.

By thus performing reset at the respective starting edges of a space and a mark and generating the selection pulses MC_S2 and MC_M2 on the basis of presence or absence of edge consecutiveness of the edge signal ES with respect to an edge of the reset signal RS, the setting information of the sampling pulse SP can be selected for the mark and the space independently. In some cases, even a setting can be made so as to generate the sampling pulse SP_1 for the mark but so as not to generate the sampling pulse SP_2 for the space, or conversely so as not to generate the sampling pulse SP_1 for the mark but so as to generate the sampling pulse SP_2 for the space.

The reset signal RS as a signal for selection and control of the setting information of the sampling pulse SP is not increased in number. The transmission band of the reset signal RS is similar to that of non-return-to-zero data NRZI- DATA, and a 2-T mark and a 2-T space represent a shortest cycle, thus presenting no problem. Though edges of one edge signal ES are consecutive, an edge of the reset signal RS is interposed between the consecutive edges of the edge signal ES, and thus an edge interval at the part of edge consecutiveness is not a shortest edge interval of output. That is, a shortest pulse width is not an edge interval. A transmission band per transmission signal is not degraded, high-speed transmission is possible, and high-speed recording can be performed.

Thus, the second embodiment not simply can control mark sampling and space sampling independently of each other but also can change the setting information of the sampling pulse SP using the function of detecting edge consecutiveness of the edge signal ES. Mark sampling and space sampling can be controlled independently of each other by triggering a reset also at the starting edge of a mark in addition to a reset at the starting edge of a space and detecting edge consecutiveness/non-consecutiveness with each reset interposed.

The setting information of the sampling pulse SP can be selected without preparing a control line for changing the setting information. Because there is no need to provide a dedicated terminal for changing the setting information, the setting information of the sampling pulse SP can be changed without an increase in package area. In addition, a signal for changing the setting information of the sampling pulse SP is multiplexed in three transmission lines for transmitting timing information, and a timing skew due to different transmission lines and different transmission systems does not occur. Therefore changing timing can be controlled accurately.

In the second embodiment, independent control for spaces and marks is applied to the generation of the sampling pulse. There is thus no change in level information due to edge consecutiveness. Separate register sets are provided for spaces and marks even when there is no change in level information because reset is performed at a start of a mark. As for the side of the register set 231 for power level settings, changing registers for spaces and marks is not an object, but registers are inevitably changed for spaces and marks (separate registers are necessary).

The present embodiment (and the first embodiment) uses edge consecutiveness as information for setting change. The edge consecutiveness supposes the interposition of a reset (to prevent reduction of an interval between consecutive edges). Further, a rising edge and a falling edge of reset are distinguished from each other to determine whether edge consecutiveness indicates a setting change for a space or a setting change for a mark. That is, the rising edge and the falling edge cannot be interchanged, and reset always needs to be triggered at a coming edge. Edges satisfying such a limitation are space starting edges and mark starting edges, and the register set 231 is inevitably needed separately for power level setting. In addition, the edge relation of the above-described limitation has a 2-T space and a 2-T mark at a minimum, and there is thus no problem in terms of transmission speed, which is also a limiting factor.

However, within such limitations, various modifications are possible without being limited to the configuration shown in the first example. For example, while the first example changes the power level pattern for a space and a mark on the side of the light emission level pattern storing section 230, the respective patterns for a space and a mark may be changed as in a second example shown in FIG. 7G.

For example, the basics of the sequential system shown in FIGS. 4A to 4E handle space levels and mark levels as a set, and assume that level information change and the like are performed with attention directed to the mark levels in particular. On the other hand, the second embodiment assumes that spaces and marks are each controlled independently of each other. In this second example, an application is considered in which the Erase level is changed from Erase 1 to Erase 2 only at the time of a short space length and the Over Drive level is changed from Over Drive 1 to Over Drive 2 only at the time of a short mark length. The second example is effective when level information needs to be changed for each of spaces and marks and power levels are desired to be controlled separately according to length of the section of each of the spaces and the marks.

In addition, while the selection pulses MC_S2 and MC_M2 generated using the function of detecting edge consecutiveness of the edge signal ES is used for memory change in the sampling pulse pattern storing section 430, this is not essential. Using two reset signals RS_1 and RS_2, for example, is conceivable. A reset pulse RP_S1 is generated from a falling edge of the reset signal RS_1. A reset pulse RP_S2 is generated from a falling edge of the reset signal RS_2. A reset pulse RP_M1 is generated from a rising edge of the reset signal RS_1. A reset pulse RP_M2 is generated from a rising edge of the reset signal RS_2. Then, these reset pulses may be used as selection pulses for memory change as in a third example shown in FIG. 7H irrespective of the configuration on the side of the light emission level pattern storing section 230.

[Laser Driving System: Third Embodiment]

Figure 8C:
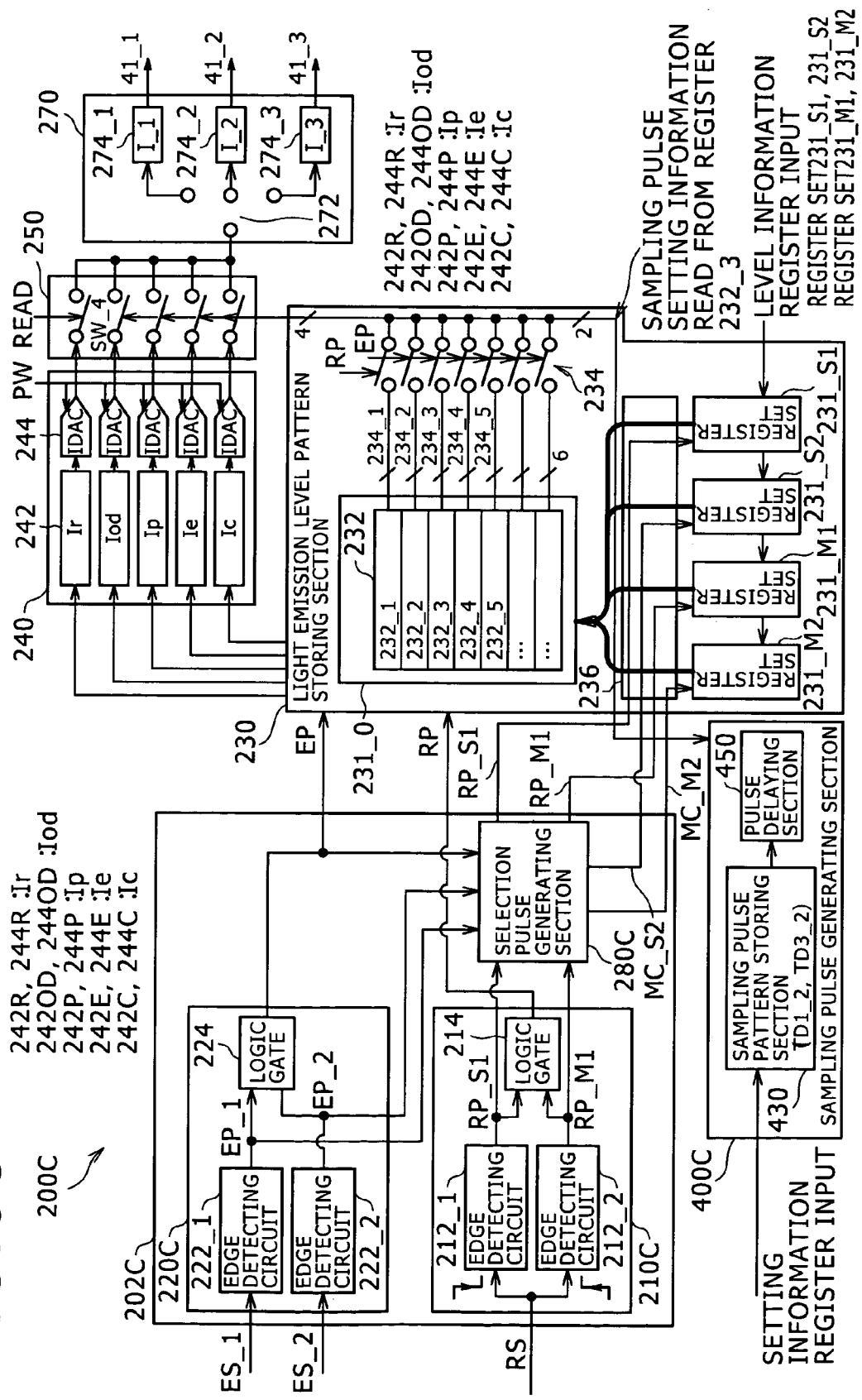
FIG. 8C is a diagram of a laser driving circuit according to the third embodiment.
Figure 8E:
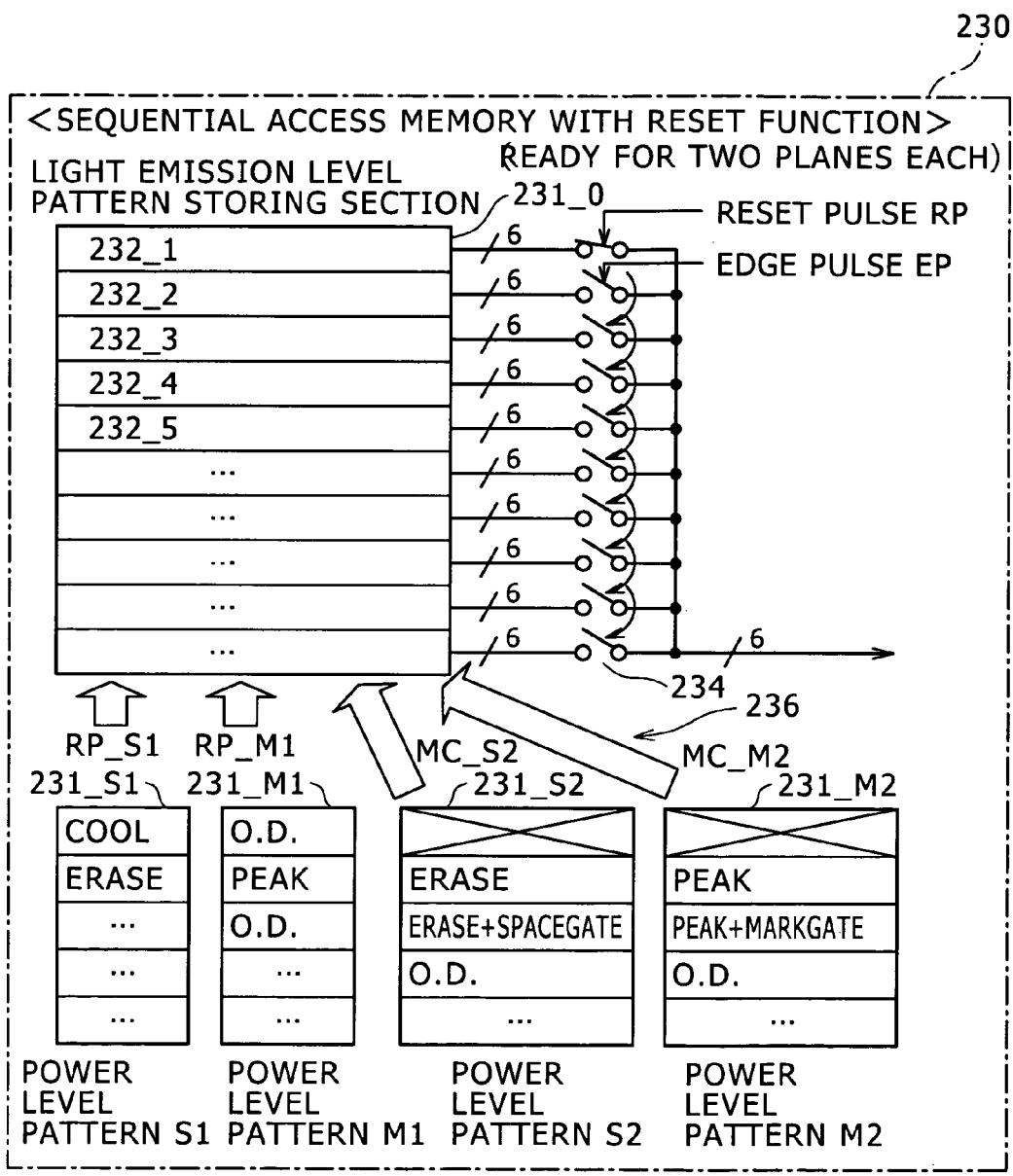
FIG. 8E is a diagram of assistance in explaining register setting information of sampling pulses.

FIGS. 8A to 8E are diagrams of assistance in explaining a third embodiment of the sequential system. FIG. 8A is a diagram of assistance in explaining an example of configuration of a transmission signal generating section 500C according to the third embodiment. FIG. 8B is a diagram of assistance in explaining operation of the transmission signal generating section 500C according to the third embodiment. FIG. 8C is a diagram showing a laser driving circuit 200C according to the third embodiment. FIG. 8D is a diagram of assistance in explaining operation of the laser driving circuit 200C according to the third embodiment. FIG. 8E is a diagram of assistance in explaining register setting information of a sampling pulse pattern storing section 430 according to the third embodiment.

The third embodiment is a modification of the second embodiment such that edge timing of input edge signals ES_1 and ES_2 is provided with timing information of mark sampling and space sampling. In particular, the third embodiment has a feature as a difference from a fourth embodiment to be described later in that starting timing information of mark sampling and space sampling is provided and timing of changing to a next level is used as ending timing. Description will be made in the following centering on differences from the second embodiment.

[Circuit Configuration: Third Embodiment]

As shown in FIG. 8A, the transmission signal generating section 500C on a drive board side has a similar configuration for generating a reset signal RS to that of the first embodiment, but has a different configuration for generating an edge signal ES. The transmission signal generating section 500C is formed by modifying the transmission signal generating section 500B according to the second embodiment such that starting timing information of mark sampling and space sampling is added to edge timing when edge signals ES_1 and ES_2 are generated. Specifically, the three-input type OR gate 520 is changed to a five-input type OR gate 520. The OR gate 520 has a fourth input terminal supplied with an MG starting edge pulse MGP, and has a fifth input terminal supplied with an SG starting edge pulse SGP. Otherwise no change is made.

Incidentally, an MG setting determining section 524M outputs an L when not generating a sampling pulse SP_1 at the time of a short mark and otherwise outputs an H according to a recording mark length determination result. An SG setting determining section 524S outputs an L when not generating a sampling pulse SP_2 at the time of a short space and otherwise outputs an H according to a recording space length determination result.

Thus, as shown in FIG. 8B, based on FIG. 7B of the second embodiment, a D-type flip-flop 522 is logically inverted also in timing of an edge of one of the MG starting edge pulse MGP and the SG starting edge pulse SGP. The effect consequently appears in the logic of the edge signals ES_1 and ES_2. In the present example, the edge signals ES_1 and ES_2 are logically inverted also in timing of rising edges of the MG starting edge pulse MGP and the SG starting edge pulse SGP. Edges of the edge signals ES_1 and ES_2 have starting timing information (setting information defining starting timing) of mark sampling and space sampling.

In addition, as shown in FIG. 8B, it is possible not to superimpose the timing information of a mark gate MG at the time of a short mark, and not to superimpose the timing information of a space gate SG at the time of a short space. In this example, the timing information of a space gate SG is not superimposed when space length is 3 T or less, and the timing information of a mark gate MG is not superimposed when mark length is 4 T or less. The third embodiment is otherwise similar to the second embodiment.

Incidentally, in the third embodiment, unlike a fourth embodiment to be described later, ending timing information (setting information defining ending timing) of mark gates MG and space gates SG is not provided to edges of the edge signals ES_1 and ES_2. Thus, according to principles, a sampling pulse generating section 400 needs to have information for setting "sampling pulse width," as described in the second embodiment. However, in the present embodiment, the ending timing of mark gates MG and space gates SG is the same timing as a start of a next power level in order to reduce information for specifying the "sampling pulse width." For example, in the case of FIG. 8B, the end of a mark gate MG is in the same timing as an edge pulse EP5, and the end of a space gate SG is in the same timing as an edge pulse EP3.

When the H-level of a second space sampling setting is output from an SG setting determining section 524S, the D-type flip-flop 522 inverts output also with an edge pulse EP1, and in transition timing after the edge pulse EP1, the edge signal that performed logical inversion immediately before the edge pulse EP1 performs logical inversion first rather than alternately. When the H-level of a second mark sampling setting is output from an MG setting determining section 524M, the D-type flip-flop 522 inverts output also with an edge pulse EP3, and in transition timing after the edge pulse EP3, the edge signal that performed logical inversion immediately before the edge pulse EP3 performs logical inversion first rather than alternately.

As shown in FIG. 8C, the laser driving circuit 200C according to the third embodiment is based on the laser driving circuit 200B according to the second embodiment, and includes a light emission level pattern storing section 230 changed in configuration. Specifically, the light emission level pattern storing section 230 has four register sets 231_S1, 231_S2, 231_M1, and 231_M2 as auxiliary storing sections. Basically, the register sets 231_S1 and 231_S2 are used to change a power level pattern for a space, and the register sets 231_M1 and 231_M2 are used to change a power level pattern for a mark. In this case, the term "Basically" is used in consideration of use of a part of registers 232 for setting the starting timing of a space gate SG and a mark gate MG.

Reset pulses RP_S1 and RP_M1 and selection pulses MC_S2 and MC_M2 are used to select a plurality of kinds of power level patterns (partly including information for changing the setting information of a sampling pulse SP). Specifically, the reset pulse RP_S1 is supplied to the register set 231_S1. The reset pulse RP_M1 is supplied to the register set 231_M1. The selection pulse MC_S2 is supplied to the register set 231_S2. The selection pulse MC_M2 is supplied to the register set 231_M2.

Incidentally, as a difference from the second embodiment, two kinds of current changing pulses are added to set the starting timing of space gates SG and mark gates MG in the sampling pulse generating section 400. Thus, while a current switch section 250 may be configured so as to correspond to four kinds of current changing pulses SW_1 to SW_4, the registers 232 of the register sets 231 are configured so as to correspond to six kinds of current changing pulses SW_1 to SW_6.

[Memory Circuit: Third Embodiment]

As shown in FIG. 8E, the light emission level pattern storing section 230 according to the third embodiment has the four register sets 231_S1, 231_S2, 231_M1, and 231_M2 as auxiliary storing sections. Of the register sets, the register sets 231_S1 and 231_M1 are similar to the register sets 231_S and 231_M of the first and second embodiments, and are used only to change a power level pattern, whereas the register sets 231_S2 and 231_M2 are used not only to change a power level pattern but also to change the setting information of the sampling pulse SP.

Thus, the register sets 231_S2 and 231_M2 stores sampling pulse information ("MarkGate" and "SpaceGate") in addition to light emission level pattern information. A second storing section is treated as being both the light emission level pattern storing section 230 and the sampling pulse pattern storing section 430, and power level pattern information and the setting information of a sampling pulse SP are stored together in one register 232 of the auxiliary storing sections.

As described above, in the sequential system, output from the light emission level pattern storing section 230 (level information storing section) is timing pulses for turning on/off switches corresponding to the respective timing pulses. For example, Cool, Erase, and the like shown in the registers 232 within the register sets 231_S1, 231_S2, 231_M1, and 231_M2 shown in FIG. 8E mean that timing pulses corresponding to the respective levels are generated and that the other bits are an L-level.

As shown in FIG. 8E, in the present example, the third register 232_3 of the register set 231_S2 stores "SpaceGate" for generating a sampling pulse SP_2 (space gate SG) for a space in addition to information (Erase) defining an Erase level. The third register 232_3 of the register set 231_M2 stores "MarkGate" for generating a sampling pulse SP_1 (mark gate MG) for a mark in addition to information (Peak) defining a Peak level.

In this case, when "Erase+SpaceGate" is stored in the register set 231_S2, for example, a period when the register 232_3 having "Erase+SpaceGate" set therein is accessed has an H-level only for timing of Erase and a space gate SG (see FIG. 8D). When "Peak+MarkGate" is stored in the register set 231_M2, a period when the register 232_3 having "Peak+MarkGate" set therein is accessed has an H-level only for timing of Peak and a mark gate MG (see FIG. 8D).

A sampling pulse generating section 400C needs to retain only the delay time TD1_2 of a mark sampling pulse SP_1 and the delay time TD3_2 of a space sampling pulse SP_2 as the setting information of the sampling pulse SP in the sampling pulse pattern storing section 430. The changing of the setting information with a reset pulse RP or a selection pulse MC is not performed.

The sampling pulse generating section 400C generates the sampling pulses SP_1 and SP_2 in input edge timing while maintaining phase relation of output waveforms of mark gates MG and space gates SG. Thus, the sampling pulse generating section 400C includes a pulse delaying section 450 for obtaining the sampling pulses SP_1 and SP_2 by delaying a generated mark gate MG and a generated space gate SG by the delay times TD1_2 and TD3_2.

The pulse delaying section 450 may employ a phase shift configuration using logic gates (for example a BUF (buffer), an INV (inverter), an AND gate, an OR gate, a NAND gate, a NOR gate and the like) as delay elements, for example. Logic gates (hereinafter referred to also as delay gates) as delay elements are cascaded in multiple stages, a tap (output terminal) is drawn out from each point of connection, and final sampling pulses SP_1 and SP_2 are obtained from taps corresponding with the delay times TD1_2 and TD3_2.

For example, supposing that a delay time per delay gate is a delay time Tdly and that Delay Time TD1_2=N1×Tdly, it suffices to input a reproduced mark gate MG to a first stage and obtain the sampling pulse SP_1 from a point of connection at which the mark gate MG has been passed through the N1 delay elements. Similarly, supposing that a delay time per delay gate is a delay time Tdly and that Delay Time TD3_2=N3×Tdly, it suffices to input a reproduced space gate SG to a first stage and obtain the sampling pulse SP_2 from a point of connection at which the space gate SG has been passed through the N3 delay elements. For example, supposing that Delay Time Tdly=15 psec (0.015 nsec) and that a range of adjustment of the delay times TD1_2 and TD3_2 is 3 nsec, it suffices to provide 200 stages of a delay element and a tap change.

[Operation: Third Embodiment]

As shown in FIG. 8D, because one reset signal RS and two edge signals ES_1 and ES_2 are used as input pulse signals, there are three input pulse signals in total. The reset pulse RP and the reset pulses RP_S1 and RP_M1 are generated on the basis of the reset signal RS, and the selection pulses MC_S2 and MC_M2 are generated when edges of the same edge signals ES_1 and ES_2 make a transition with reset pulses RP_S1 and RP_M1 interposed between the edges. These points are similar to those of the second embodiment.

The third embodiment further provides the starting timing information of mark sampling and space sampling to the edge timing of the edge signal ES, and generates the sampling pulse SP according to the starting timing information of mark sampling and space sampling.

Specifically, an edge pulse generating section 220C generates edge pulses EP_1 and EP_2 from both edges of the respective edge signals ES_1 and ES_2 on the basis of the edge signals ES_1 and ES_2, obtains a logical sum of the edge pulses EP_1 and EP_2, and sets the logical sum as an edge pulse EP.

A reset pulse generating section 210C generates the reset pulse RP_S1 from the falling edge of the reset signal RS and generates the reset pulse RP_M1 from the rising edge of the reset signal RS on the basis of the reset signal RS, obtains a logical sum of the reset pulses RP_S1 and RP_M1, and sets the logical sum as a reset pulse RP.

When edges of one of the edge signals ES_1 and ES_2 are consecutive with a falling edge of the reset signal RS interposed between the edges of the edge signal, a selection pulse generating section 280C generates the selection pulse MC_S2 with the edge after the consecutiveness. When edges of one of the edge signals ES_1 and ES_2 are consecutive with a rising edge of the reset signal RS interposed between the edges of the edge signal, the selection pulse generating section 280C generates the selection pulse MC_M2 with the edge after the consecutiveness.

Overall operation is similar to that of the second embodiment, and timing of generating the reset pulses RP_S1 and RP_M1 and the selection pulses MC_S2 and MC_M2 is not different from the second embodiment. However, because the edge timing of the edge signals ES_1 and ES_2 input to the laser driving circuit 200C includes timing information of mark sampling and space sampling, timing in which the edge pulse EP (EP_1 and EP_2) becomes an H-level is different from the second embodiment. Specifically, timing of reading out the information of "Erase+SpaceGate" and "Peak+MarkGate" stored in the third registers 232_3 of the register sets 231_S2 and 231_M2 is added to the edge pulse EP (EP_1 and EP_2), and the edge pulse EP (EP_1 and EP_2) becomes an H-level also in that timing.

As shown in FIG. 8E, in the light emission level pattern storing section 230, a stored information controlling section 236 reads out information stored in the register set 231_S1 for a space and sets the information in a register set 231_0 when the reset pulse RP_S1 is an active H. The stored information controlling section 236 reads out information stored in the register set 231_S2 for a space and sets the information in the register set 231_0 when the selection pulse MC_S2 is an active H. That is, in timing in which the reset pulse RP_S1 or the selection pulse MC_S2 becomes an active H, the stored information controlling section 236 rewrites the memory information of the register set 231_0 with the corresponding power level pattern information for a space. The setting information of the register sets 231_S2 and 231_M2 can be rewritten in a vacant time by register input.

The stored information controlling section 236 reads out information stored in the register set 231_M1 for a mark and sets the information in the register set 231_0 when the reset pulse RP_M1 is an active H. The stored information controlling section 236 reads out information stored in the register set 231_M2 for a mark and sets the information in the register set 231_0 when the selection pulse MC_M2 is an active H. That is, in timing in which the reset pulse RP_M1 or the selection pulse MC_M2 becomes an active H, the stored information controlling section 236 rewrites the memory information of the register set 231_0 with the corresponding power level pattern information for a mark.

Further, as in the basic configuration and the first and second embodiments, the reset pulse RP output from a logic gate 214 is supplied to the readout switch 234_1 of the light emission level pattern storing section 230. The rest is the same as in the basic configuration and the like. A return is made to an initial level set in the register 232_1 with the reset pulse RP, and each piece of information of the register 232_2 and subsequent registers is thereafter read out in order with the edge pulse EP.

In this case, when the information stored in the register set 231_S2 is applied according to the selection pulse MC_S2, the information of "Erase+SpaceGate" stored in the third register 232_3 is read out in the timing of a space gate SG. When the information stored in the register set 231_M2 is applied according to the selection pulse MC_M2, the information of "Peak+MarkGate" stored in the third register 232_3 is read out in the timing of a mark gate MG.

The light emission level pattern storing section 230 notifies the information of "SpaceGate" and "MarkGate" of "Erase+SpaceGate" and "Peak+MarkGate" to the sampling pulse generating section 400C. The sampling pulse generating section 400C generates the sampling pulses SP_1 (mark gate MG) and SP_2 (space gate SG) according to the notified information of "SpaceGate" and "MarkGate."

For example, when the register 232_3 having "Peak+ MarkGate" set therein is accessed, an H-level is notified from the light emission level pattern storing section 230 to the sampling pulse generating section 400C. The timing of starting the access is the starting timing of a mark gate MG, and the timing of ending the access is timing of changing to Over Drive as a next level. By using the H-level notified from the light emission level pattern storing section 230 as it is, the sampling pulse generating section 400C can reproduce the mark gate MG to be sent in a state of being superimposed on the edge signal ES on the side of a write strategy circuit 290. The sampling pulse generating section 400C generates the sampling pulse SP_1 for a mark by delaying the reproduced mark gate MG by the delay time TD1_2 while maintaining phase relation (respective positions of a rising edge and a falling edge) of waveform of the mark gate MG.

Similarly, when the register 232_3 having "Erase+SpaceGate" set therein is accessed, an H-level is notified from the light emission level pattern storing section 230 to the sampling pulse generating section 400C. The timing of starting the access is the starting timing of a space gate SG, and the timing of ending the access is timing of changing to Over Drive as a next level. By using the H-level notified from the light emission level pattern storing section 230 as it is, the sampling pulse generating section 400C can reproduce the space gate SG to be sent in a state of being superimposed on the edge signal ES on the side of the write strategy circuit 290. The sampling pulse generating section 400C generates the sampling pulse SP_2 for a space by delaying the reproduced space gate SG by the delay time TD3_2 while maintaining phase relation (respective positions of a rising edge and a falling edge) of waveform of the space gate SG.

The third embodiment is based on the second embodiment, and adds information defining timing of generation (a start in particular) of the sampling pulse SP to the edge signals ES_1 and ES_2. Thus the sampling pulses SP_1 and SP_2 can be generated in a state of the starting timing being managed. The positions of the reproduced space gate SG and the reproduced mark gate MG are not different from positions with respect to a light emission level pattern when superimposed on the generating side. Thus, it is not necessary to generate timing of a delay from a waveform monitoring signal on the side of the sampling pulse generating section 400C (within the IC of the sampling pulse generating section 400C).

Further, the third embodiment sets the timing of changing to Over Drive as a next level as ending timing of a mark gate MG and a space gate SG. Specifically, as shown in FIG. 8B, the ending timing of a mark gate MG is the same as the timing of the edge pulse EP5, and the ending timing of a space gate SG is the same as the timing of the edge pulse EP3. Thus, in the third embodiment, because sampling pulse width is determined by setting the starting timing, the sampling pulse width does not need to be set and sampling pulses with small variations and high precision can be generated on the side of the sampling pulse generating section 400C. However, because the sampling pulse width is in effect interlocked with the setting of the starting timing, there is no freedom of setting of the sampling pulse width, unlike the fourth embodiment.

As in the first and second embodiments, a reset is triggered for a space and a mark independently, and timing of each reset is used. Hence, a setting can be made so as to generate the sampling pulse SP_1 for a mark but so as not to generate the sampling pulse SP_2 for a space by generating a mark gate MG but not generating a space gate SG. Conversely, a setting can be made so as not to generate the sampling pulse SP_1 for a mark but so as to generate the sampling pulse, SP_2 for a space by not generating a mark gate MG but generating a space gate SG.

<Laser Driving System: Fourth Embodiment>

Figure 9B:
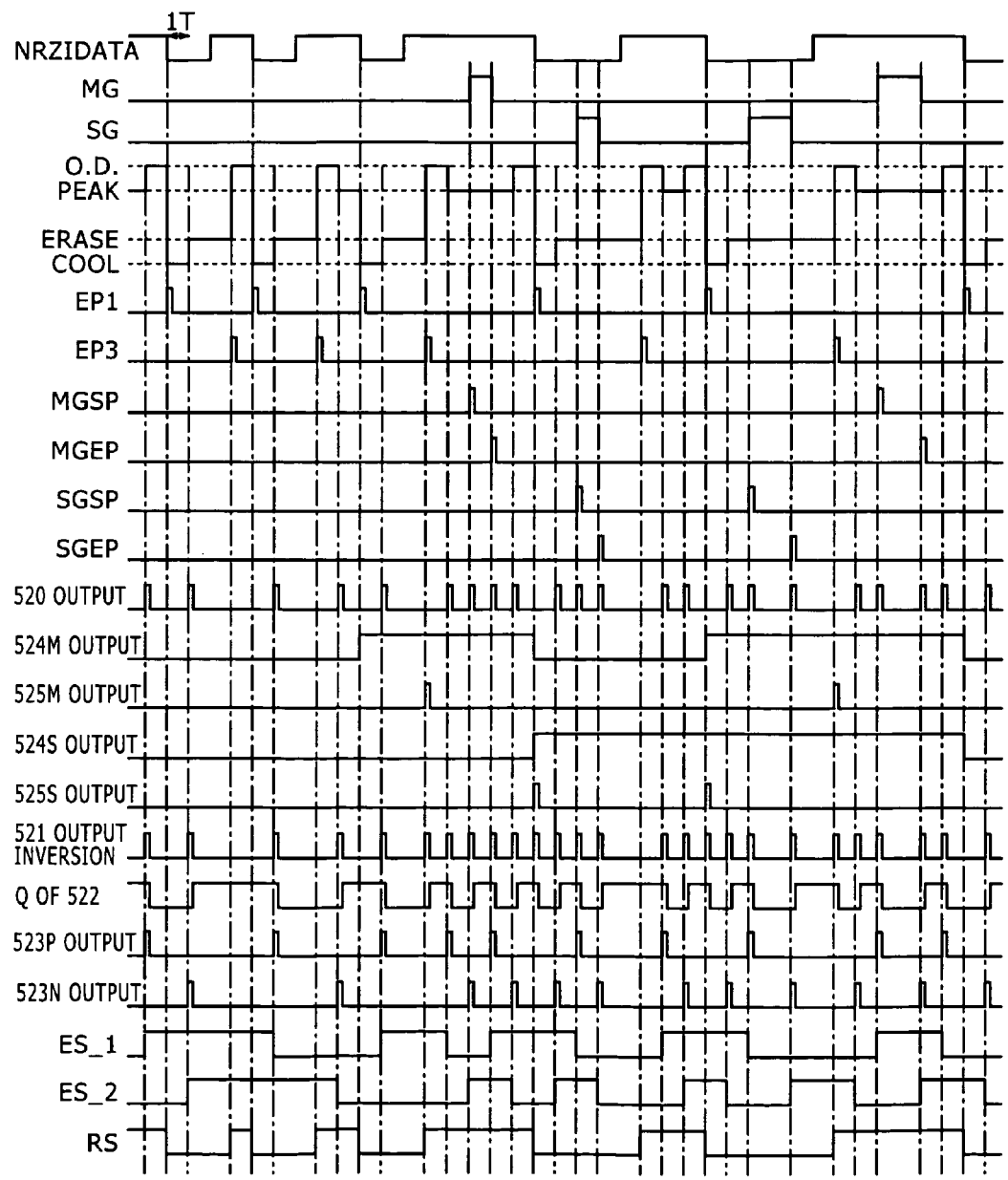
FIG. 9B is a diagram of assistance in explaining operation of the transmission signal generating section according to the fourth embodiment.
Figure 9D:
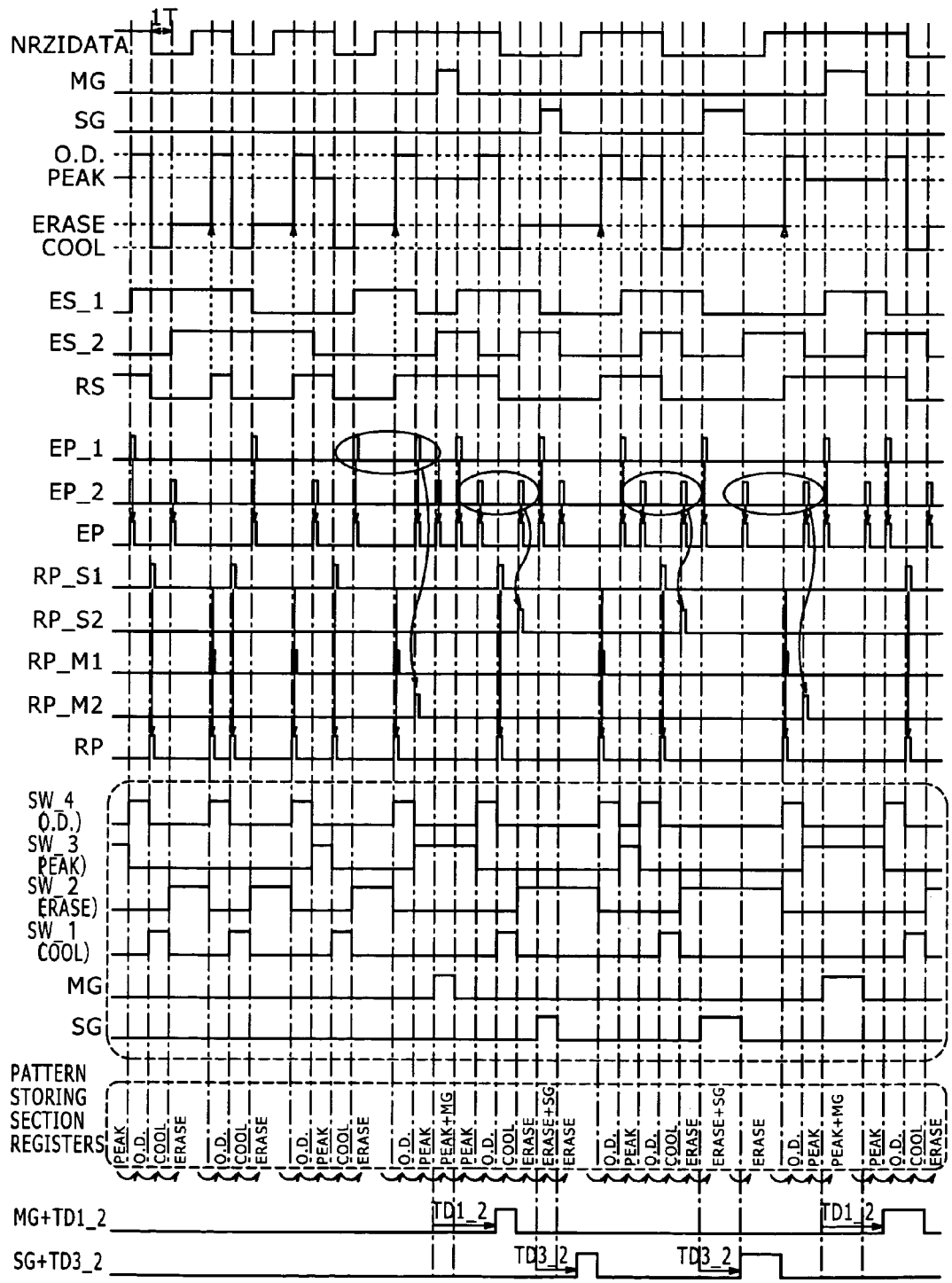
FIG. 9D is a diagram of assistance in explaining operation of the laser driving circuit according to the fourth embodiment.
Figure 9E:
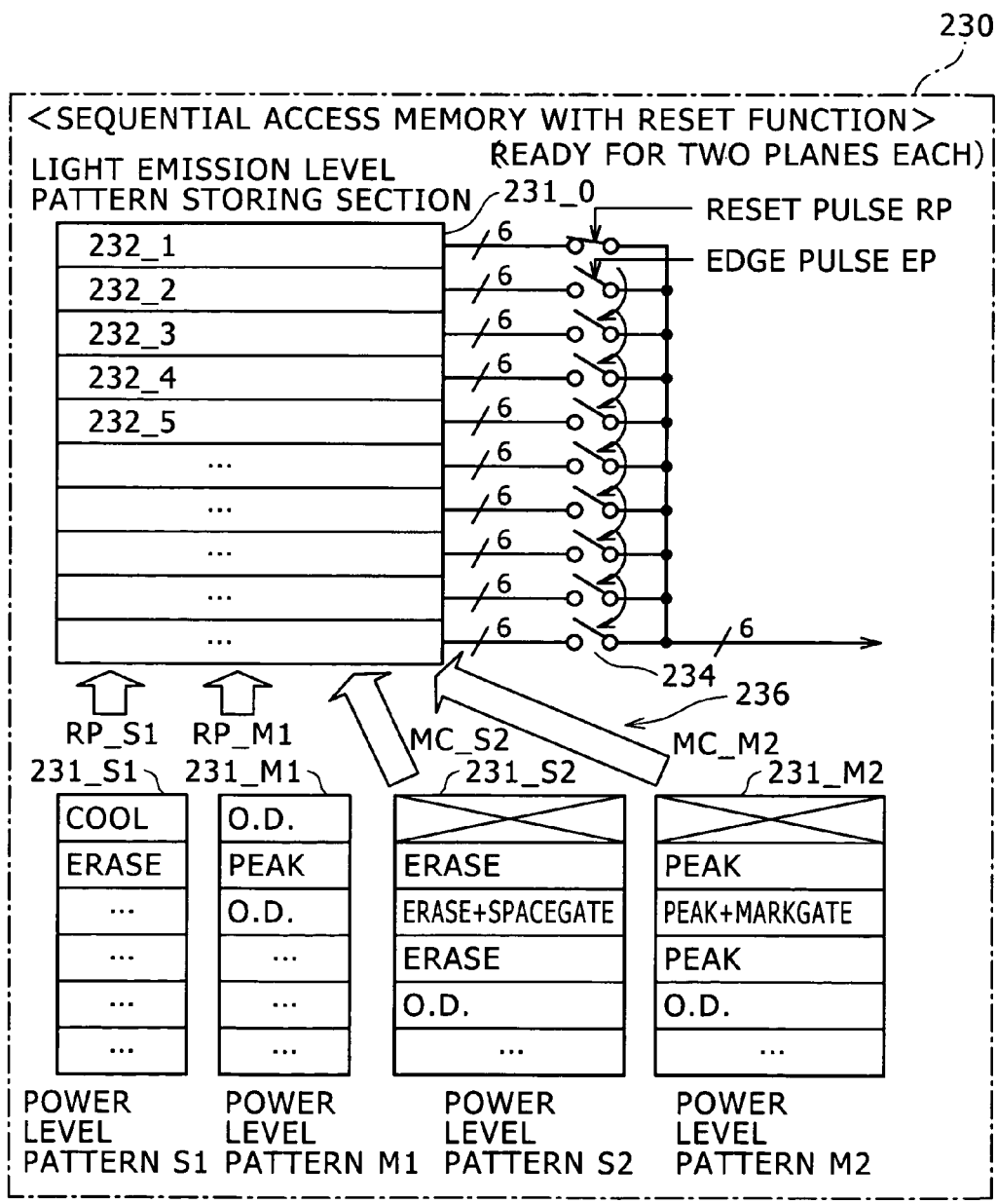
FIG. 9E is a diagram of assistance in explaining register setting information of sampling pulses.

FIGS. 9A to 9E are diagrams of assistance in explaining a fourth embodiment of the sequential system. FIG. 9A is a diagram of assistance in explaining an example of configuration of a transmission signal generating section 500D according to the fourth embodiment. FIG. 9B is a diagram of assistance in explaining operation of the transmission signal generating section 500D according to the fourth embodiment. FIG. 9C is a diagram showing a laser driving circuit 200D according to the fourth embodiment. FIG. 9D is a diagram of assistance in explaining operation of the laser driving circuit 200D according to the fourth embodiment. FIG. 9E is a diagram of assistance in explaining register setting information of a sampling pulse pattern storing section 430 according to the fourth embodiment.

The fourth embodiment is a modification of the second embodiment such that edge timing of input edge signals ES_1 and ES_2 is provided with timing information of mark sampling and space sampling. In particular, the fourth embodiment has a feature as a difference from the foregoing third embodiment in that timing information on starting and ending of mark sampling and space sampling is provided. Description will be made in the following centering on differences from the second and third embodiments.

[Circuit Configuration: Fourth Embodiment]

As shown in FIG. 9A, the transmission signal generating section 500D on a drive board side has a similar configuration for generating a reset signal RS to that of the first embodiment, but has a different configuration for generating an edge signal ES. The transmission signal generating section 500D is formed by modifying the transmission signal generating section 500B according to the second embodiment such that timing information on starting and ending of mark sampling and space sampling is added to edge timing when edge signals ES_1 and ES_2 are generated.

Specifically, the three-input type OR gate 520 is changed to a seven-input type OR gate 520. In other words, on the basis of the transmission signal generating section 500C according to the third embodiment, the OR gate 520 is changed from the five-input type to the seven-input type. The OR gate 520 has a fourth input terminal supplied with an MG starting edge pulse MGSP, has a fifth input terminal supplied with an MG ending edge pulse MGEP, has a sixth input terminal supplied with an SG starting edge pulse SGSP, and has a seventh input terminal supplied with an SG ending edge pulse SGEP. No change is made otherwise. As compared with the third embodiment, the MG starting edge pulse MGP is changed to the MG starting edge pulse MGSP, the SG starting edge pulse SGP is changed to the SG starting edge pulse SGSP, and the ending edge pulses MGEP and SGEP are further added.

The MG starting edge pulse MGSP and the MG ending edge pulse MGEP will be described together as MG starting and ending edge pulses MGSP and MGEP. The SG starting edge pulse SGSP and the SG ending edge pulse SGEP will be described together as SG starting and ending edge pulses SGSP and SGEP. As shown in FIG. 9B, based on FIG. 7B of the second embodiment, a D-type flip-flop 522 is logically inverted also in timing of the MG starting and ending edge pulses MGSP and MGEP and the SG starting and ending edge pulses SGSP and SGEP. The effect consequently appears in the logic of the edge signals ES_1 and ES_2. In the present example, the edge signals ES_1 and ES_2 are logically inverted also in timing of the MG starting edge pulse MGSP, the MG ending edge pulse MGEP, the SG starting edge pulse SGSP, and the SG ending edge pulse SGEP. Edges of the edge signals ES_1 and ES_2 have timing information of mark sampling and space sampling. The fourth embodiment is otherwise similar to the second embodiment.

In the fourth embodiment, unlike the third embodiment, information on ending timing of a mark gate MG and a space gate SG is also provided to edges of the edge signals ES_1 and ES_2. Thus, as shown in FIG. 9B, the ending timing of a mark gate MG can be set separately from the timing of an edge pulse EP5 (second Over Drive), and the ending timing of a space gate SG can be set separately from the timing of an edge pulse EP3 (first Over Drive).

As shown in FIG. 9C, in the laser driving circuit 200D according to the fourth embodiment, the pulse generating section 202C (and 210C and 220C) is changed to a pulse generating section 202D (and 210D and 220D). However, the configuration itself of the laser driving circuit 200D is similar to that of the laser driving circuit 200C according to the third embodiment.

Incidentally, as a difference from the second embodiment, two kinds of current changing pulses are added to set the timing of starting and ending space gates SG and mark gates MG in the sampling pulse generating section 400D. Thus, as in the third embodiment, while a current switch section 250 may be configured so as to correspond to four kinds of current changing pulses SW_1 to SW_4, the registers 232 of register sets 231 are configured so as to correspond to six kinds of current changing pulses SW_1 to SW_6.

[Memory Circuit: Fourth Embodiment]

As shown in FIG. 9E, a light emission level pattern storing section 230 according to the fourth embodiment has four register sets 231_S1, 231_S2, 231_M1, and 231_M2 as auxiliary storing sections. The configuration of the light emission level pattern storing section 230 is similar to that of the third embodiment.

As a difference from the third embodiment, the fourth embodiment employs a mechanism of setting the ending timing of mark gates MG and space gates SG independently of the timing of Over Drive. For example, in the register set 231_S2, a register 232_4 having "Erase" set therein is added following a register 232_3 having "Erase+SpaceGate" set therein, and information to be set in a subsequent register 232_5 and the like is shifted in order. In addition, in the register set 231_M2, a register 232_4 having "Peak" set therein is added following a register 232_3 having "Peak+MarkGate" set therein, and information to be set in a subsequent register 232_5 and the like is shifted in order.

[Operation: Fourth Embodiment]

The fourth embodiment provides information on not only starting timing but also ending timing of mark gates MG and space gates SG to the edge timing of the edge signal ES, and generates a sampling pulse SP according to the starting timing information and the ending timing information.

As shown in FIG. 9D, while overall operation is almost the same as in the third embodiment, the ending timing is set independently of the timing of Over Drive. For example, when the information stored in the register set 231_S2 is applied at a selection pulse MC_S2, the information of "Erase+SpaceGate" stored in the register 232_3 is read out in the timing of a space gate SG, and thereafter the information of "Erase" stored in the register 232_4 is read out. When the information stored in the register set 231_M2 is applied at a selection pulse MC_M2, the information of "Peak+MarkGate" stored in the register 232_3 is read out in the timing of a mark gate MG, and thereafter the information of "Peak" stored in the register 232_4 is read out.

The fourth embodiment adds information defining timing of generation (a start and an end in particular) of the sampling pulse SP to the edge signals ES_1 and ES_2. Thus the sampling pulses SP_1 and SP_2 can be generated in a state of the starting timing and the ending timing being managed. The positions of a reproduced space gate SG and a reproduced mark gate MG are not different from positions with respect to a light emission level pattern when superimposed on the generating side. Thus, on the side of the sampling pulse generating section 400D (within the IC of the sampling pulse generating section 400D), sampling pulse width or timing of a delay from a waveform monitoring signal or the like does not need to be generated, and sampling pulses with small variations and high precision can be generated. Unlike the third embodiment, the starting timing and the ending timing are both set independently of timing of changing to another level, and there is thus a degree of freedom of setting the sampling pulse width.

The present application contains subject matter related to that disclosed in Japanese Priority Patent Application JP 2009-094634 filed in the Japan Patent Office on Apr. 9, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A laser driving device comprising:
   a pattern storing section comprising a sequential access memory having registers for storing level information for portions of a waveform pattern, in order, in each register of the sequential access memory;
   a reset pulse section that generates, based on a detected first transmission signal, a reference pulse with a reset edge to start a sequential selection of the registers of the sequential access memory;
   an edge pulse section that generates, based on a detected second transmission signal, a changing pulse that synthesizes an edge timing of the sequential selection of the registers after the reset edge starts the sequential selection; and
   a waveform section that outputs the level information for each portion of the waveform pattern to the pattern storing section for storage, in order, in each register of the sequential access memory,
   wherein the sequential selection of the registers reads out the level information stored in the pattern storing section during a combined period of a space and a mark.

2. The laser driving device according to claim 1, further comprising
   a second storing section including a plurality of auxiliary storing sections configured to store a plurality of respective different pieces of setting information,
   a main storing section configured to selectively store one of the pieces of setting information stored in said plurality of auxiliary storing sections, and
   a stored information controlling section configured to select one of the pieces of setting information stored in said plurality of auxiliary storing sections, and make said main storing section store the setting information.

3. The laser driving device according to claim 2, wherein said reset pulse section generates said reference pulse for one of a change from said space to said mark and a change from said mark to said space by detecting one of a falling edge and a rising edge of said first transmission signal, and generates said reference pulse for the other of the change from said space to said mark and the change from said mark to said space by detecting the other of the falling edge and the rising edge of said first transmission signal, said edge pulse section generates said changing pulses by detecting each edge of a plurality of said second transmission signals, said laser driving device further includes a third pulse generating section configured to generate a selection pulse on a basis of said changing pulse immediately after said reference pulse when each of said changing pulses immediately before and immediately after said reference pulse are based on an edge of a same said second transmission signal, and said stored information controlling section selects one of the pieces of setting information stored in said plurality of auxiliary storing sections and makes said main storing section store the setting information on a basis of said reference pulse obtained by said reset pulse section and said selection pulse obtained by said third pulse generating section.

4. The laser driving device according to claim 2, wherein said second storing section is used also as said light emission level pattern storing section, wherein level information includes reference level information outputted by the waveform section for the reference pulse, and other level information outputted by the waveform section for the changing pulses, and wherein selection of the registers by the reference and changing pulses reads out the reference level information stored in said main storing section, for each said reference pulse, and reads the other level information stored in said main storing section, following said reference level information in order for each said changing pulse.

5. The laser driving device according to claim 4, wherein said second storing section has said auxiliary storing sections storing recording waveform control signal patterns indicating respective different pieces of level information.

6. The laser driving device according to claim 5, wherein in a period in which one of said two auxiliary storing sections is not used, the setting information of the other of said two auxiliary storing sections is rewritten.

7. The laser driving device according to claim 2, further comprising:
a sample-hold section configured to sample and hold an electric signal based on laser light emitted from a laser element; and
a sampling pulse generating section configured to generate a sampling pulse for sampling and holding said electric signal with an edge of waveform patterns based on said reference pulse and said changing pulse as a reference, and supply the sampling pulse to said sample-hold section, wherein level information includes reference level information outputted by the waveform section for the reference pulse, and other level information outputted by the waveform section for the changing pulses, wherein selection of the registers by the reference and changing pulses reads out the reference level information stored in said pattern storing section, for each said reference pulse, and reads the other level information stored in said pattern storing section, following said reference level information in order for each said changing pulse, said second storing section is used also as a sampling pulse pattern storing section storing setting information defining a pulse pattern of said sampling pulse, said plurality of auxiliary storing sections store setting information defining pulse patterns of said sampling pulse separately for said space and said mark, and said sampling pulse generating section generates said sampling pulse on a basis of said setting information stored in said main storing section.

8. The laser driving device according to claim 7, wherein said second storing section has said auxiliary storing sections storing respective different pieces of setting information defining pulse patterns for each of respective sampling pulses of said space and said mark.

9. A laser driving device comprising:
a first pulse generating section configured to generate a reference pulse indicating timing of changing between a space and a mark by detecting an edge of a first transmission signal indicating, by said edge, information defining timing of obtaining said reference pulse;
a second pulse generating section configured to generate a changing pulse indicating changing timing of divided power levels of respective light emission waveforms of said space and said mark by detecting an edge of a second transmission signal indicating, by said edge, information defining timing of obtaining said changing pulse;
a light emission waveform generating section configured to output reference level information as level information on a level at a position of said reference pulse, said level information being included in power level information on each power level of said light emission waveforms, for each said reference pulse, and output other level information following said reference level information in order for each said changing pulse;
a light emission level pattern storing section configured to store recording waveform control signal patterns indicating the power level information of said light emission waveforms for driving a laser element at the power levels of the respective light emission waveforms of said space and said mark separately for said space and said mark,
wherein the reference level information as level information on the level at the position of said reference pulse, the level information being included in the power level information of the respective light emission waveforms of said space and said mark, the power level information being stored in said light emission level pattern storing section, is read out for each said reference pulse, and the other level information following said reference level information is read out in order for each said changing pulse;
a second storing section including a plurality of auxiliary storing sections configured to store a plurality of respective different pieces of setting information, a main storing section configured to selectively store one of the pieces of setting information stored in said plurality of auxiliary storing sections, and a stored information controlling section configured to select one of the pieces of setting information stored in said plurality of auxiliary storing sections, and make said main storing section store the setting information;
a sample-hold section configured to sample and hold an electric signal based on laser light emitted from a laser element;

a sampling pulse generating section configured to generate a sampling pulse for sampling and holding said electric signal with an edge of light emission waveforms based on said reference pulse and said changing pulse as a reference, and supply the sampling pulse to said sample-hold section, wherein said light emission waveform generating section reads the reference level information as level information on the level at the position of said reference pulse, said level information being included in the level information on each of said light emission waveforms stored in said light emission level pattern storing section, for each said reference pulse, and reads the other level information following said reference level information in order for each said changing pulse, said second storing section is used also as a sampling pulse pattern storing section storing setting information defining a pulse pattern of said sampling pulse, said plurality of auxiliary storing sections store setting information defining pulse patterns of said sampling pulse separately for said space and said mark, and said sampling pulse generating section generates said sampling pulse on a basis of said setting information stored in said main storing section wherein said second pulse generating section generates said changing pulse by detecting an edge of the second transmission signal indicating, by said edge, information defining timing of obtaining said changing pulse indicating changing timing of divided power levels of respective light emission waveforms of said space and said mark and timing of the sampling pulse for sampling and holding said electric signal, said second storing section is used also as said light emission level pattern storing section and the sampling pulse pattern storing section storing the setting information defining the pulse patterns of said sampling pulse, said auxiliary storing sections collectively store the power level information of said light emission waveforms and the setting information of said sampling pulse, and the power levels of said light emission waveforms are set and said sampling pulse is obtained by reading the reference level information as level information on the level at the position of said reference pulse, said level information being included in the power level information of said light emission waveforms of said space and said mark, the power level information being stored in said light emission level pattern storing section, and the setting information of said sampling pulse, for each said reference pulse, and reading the other information following said reference level information in order for each said changing pulse.

10. The laser driving device according to claim 9, wherein said auxiliary storing sections store setting information defining starting timing of said sampling pulse together with one of pieces of power level information excluding said reference level information of said light emission waveforms.

11. The laser driving device according to claim 10, wherein ending timing of said sampling pulse is defined by timing of reading power level information following the starting timing of said sampling pulse excluding said reference level information.

12. The laser driving device according to claim 10, wherein said sampling pulse pattern storing section stores setting information on the ending timing of said sampling pulse.

13. The laser driving device according to claim 9, wherein said sampling pulse pattern storing section stores setting information defining starting timing of said sampling pulse and setting information defining ending timing of said sampling pulse together with one of pieces of power level information excluding said reference level information of said light emission waveforms.

14. The laser driving device according to claim 9, wherein said sampling pulse pattern storing section stores setting information on a delay time for said sampling pulse generated on a basis of the setting information of said pulse pattern, and said sampling pulse generating section has a pulse delaying section configured to delay said sampling pulse on a basis of the setting information on the delay time, the setting information being stored in said sampling pulse pattern storing section.

15. A laser driving method comprising:

storing, in a sequential access memory having registers, level information for portions of a waveform pattern, in order, in each register of the sequential access memory;

generating, based on a detected first transmission signal, a reference pulse with a reset edge to start a sequential selection of the registers of the sequential access memory;

generating, based on a detected second transmission signal, a changing pulse that synthesizes an edge timing of the sequential selection of the registers after the reset edge starts the sequential selection; and outputting, by a waveform section, the level information for each portion of the waveform pattern to the registers for storage in order, wherein the sequential selection of the registers reads out the level information stored in the registers during a combined period of a space and a mark.

16. A light device comprising:

a laser element;

a driving section configured to drive said laser element;

an optical member for guiding laser light emitted from said laser element;

a light emission waveform pulse generating section configured to generate a plurality of pulse signals defining light emission waveforms formed by a combination of driving signals having different levels for a space and a mark on a basis of a recording clock and recording data;

a transmission signal generating section configured to generate a first transmission signal indicating, by an edge, information defining timing of obtaining a reference pulse indicating changing timing of said space and said mark and a second transmission signal indicating, by an edge, information defining timing of obtaining a changing pulse indicating changing timing of said light emission waveforms on a basis of the plurality of pulse signals generated by said light emission waveform pulse generating section;

a pattern storing section comprising a sequential access memory having registers for storing level information for portions of a waveform pattern, in order, in each register of the sequential access memory;

a pulse generating section that generates, based on the first transmission signal, the reference pulse with a reset edge to start a sequential selection of the registers of the sequential access memory and that generates, based on the second transmission signal, a changing pulse that synthesizes an edge timing of the sequential selection of the registers after the reset edge starts the sequential selection where the sequential selection of the registers reads out the level information stored in the pattern storing section during a combined period of said space and said mark; and
a waveform section that outputs the level information for each portion of the waveform pattern to the pattern storing section for storage, in order, in each register of the sequential access memory; and
a transmitting member for transmitting a signal, the transmitting member being interposed between a first mounting section in which said laser element, said driving section, said optical member, said pulse generating section, said waveform section, and said pattern storing section are mounted and a second mounting section in which said light emission waveform pulse generating section and said transmission signal generating section are mounted.

17. The light device according to claim 16, wherein
a photoelectric converting section configured to convert the laser light emitted from said laser element into an electric signal, a sample-hold section configured to sample and hold the electric signal obtained by said photoelectric converting section, a sampling pulse generating section configured to generate a sampling pulse for sampling and holding said electric signal with an edge of said light emission waveforms as a reference, and supply the sampling pulse to said sample-hold section, and a second storing section including a plurality of auxiliary storing sections configured to store a plurality of respective different pieces of setting information, a main storing section configured to selectively store one of the pieces of setting information stored in said plurality of auxiliary storing sections, and a stored information controlling section configured to select one of the pieces of setting information stored in said plurality of auxiliary storing sections, and make said main storing section store the setting information are further mounted in said first mounting section,
an automatic power control controlling section configured to generate a laser power specifying signal for making a power level of said laser light a proper level on a basis of a sample-hold signal obtained by said sample-hold section, and supply the laser power specifying signal to said light emission waveform generating section is further mounted in said second mounting section,
said second storing section is used also as a sampling pulse pattern storing section storing setting information defining a pulse pattern of said sampling pulse, and said plurality of auxiliary storing sections store setting information defining pulse patterns of said sampling pulse separately for said space and said mark, and
said sampling pulse generating section generates said sampling pulse on a basis of said setting information stored in said main storing section.

18. A light device comprising:
a laser element;
a driving section configured to drive said laser element;
an optical member for guiding laser light emitted from said laser element;
a light emission waveform pulse generating section configured to generate a plurality of pulse signals defining light emission waveforms formed by a combination of driving signals having different levels for a space and a mark on a basis of a recording clock and recording data;
a transmission signal generating section configured to generate a first transmission signal indicating, by an edge, information defining timing of obtaining a reference pulse indicating changing timing of said space and said mark and a second transmission signal indicating, by an edge, information defining timing of obtaining a changing pulse indicating changing timing of said light emission waveforms on a basis of the plurality of pulse signals generated by said light emission waveform pulse generating section;
a pulse generating section including a first pulse generating section configured to generate said reference pulse on a basis of the edge of said first transmission signal and a second pulse generating section configured to generate said changing pulse on a basis of the edge of said second transmission signal;
a light emission waveform generating section configured to output reference level information as level information on a level at a position of said reference pulse, said level information being included in power level information on each power level of said light emission waveforms, for each said reference pulse, and output other level information following said reference level information in order for each said changing pulse;
a light emission level pattern storing section configured to store recording waveform control signal patterns indicating the level information for said light emission waveforms separately for said space and said mark;
a transmitting member for transmitting a signal, the transmitting member being interposed between a first mounting section in which said laser element, said driving section, said optical member, said pulse generating section, said light emission waveform generating section, and said light emission level pattern storing section are mounted and a second mounting section in which said light emission waveform pulse generating section and said transmission signal generating section are mounted,
wherein a photoelectric converting section configured to convert the laser light emitted from said laser element into an electric signal, a sample-hold section configured to sample and hold the electric signal obtained by said photoelectric converting section, a sampling pulse generating section configured to generate a sampling pulse for sampling and holding said electric signal with an edge of said light emission waveforms as a reference, and supply the sampling pulse to said sample-hold section, and a second storing section including a plurality of auxiliary storing sections configured to store a plurality of respective different pieces of setting information, a main storing section configured to selectively store one of the pieces of setting information stored in said plurality of auxiliary storing sections, and a stored information controlling section configured to select one of the pieces of setting information stored in said plurality of auxiliary storing sections, and make said main storing section store the setting information are further mounted in said first mounting section; and
an automatic power control controlling section configured to generate a laser power specifying signal for making a power level of said laser light a proper level on a basis of a sample-hold signal obtained by said sample-hold section, and supply the laser power specifying signal to said light emission waveform generating section is further mounted in said second mounting section,
said second storing section is used also as a sampling pulse pattern storing section storing setting information defining a pulse pattern of said sampling pulse,
said plurality of auxiliary storing sections store setting information defining pulse patterns of said sampling pulse separately for said space and said mark, and said sampling pulse generating section generates said sampling pulse on a basis of said setting information stored in said main storing section, said transmission signal generating section generates said second transmission signal also indicating, by an edge, information defining timing of obtaining a changing pulse indicating timing of said sampling pulse, said auxiliary storing sections collectively store the power level information of said light emission waveforms and the setting information of said sampling pulse, said light emission level pattern storing section outputs the reference level information as level information on the level at the position of said reference pulse, said level information being included in the stored power level information of the light emission waveforms of said space and said mark and the setting information of said sampling pulse, for each said reference pulse, and outputs the other information following said reference level information in order for each said changing pulse, and said light emission waveform generating section sets power levels of the light emission waveforms on a basis of the reference level information and the other level information of the power level information of said light emission waveforms, the reference level information and the other level information being output from said light emission level pattern storing section, and said sampling pulse generating section generates said sampling pulse on a basis of the setting information of said sampling pulse, the setting information of said sampling pulse being output from said light emission level pattern storing section.

19. The light device according to claim 18, wherein said transmission signal generating section performs control on whether to indicate the information defining the timing of obtaining the changing pulse indicating the timing of said sampling pulse by an edge of said second transmission signal according to length of said mark and/or said space differently for said mark and said space.

20. An optical unit comprising:
a laser element;
a driving section configured to drive said laser element;
an optical member for guiding laser light emitted from said laser element;
a pattern storing means comprising a sequential access memory having registers for storing level information for portions of a waveform pattern, in order, in each register of the sequential access memory;
a reset pulse means that generates, based on a detected first transmission signal, a reference pulse with a reset edge to start a sequential selection of the registers of the sequential access memory;
an edge pulse means that generates, based on a detected second transmission signal, a changing pulse that synthesizes an edge timing of the sequential selection of the registers after the reset edge starts the sequential selection; and
a waveform means that outputs the level information for each portion of the waveform pattern to the pattern storing section for storage, in order, in each register of the sequential access memory,
wherein the sequential selection of the registers reads out to the driving section the level information stored in the pattern storing section during a combined period of a space and a mark.

21. A laser driving device comprising:
a pattern storing means comprising a sequential access memory having registers for storing level information for portions of a waveform pattern, in order, in each register of the sequential access memory;
a reset pulse means that generates, based on a detected first transmission signal, a reference pulse with a reset edge to start a sequential selection of the registers of the sequential access memory;
an edge pulse means that generates, based on a detected second transmission signal, a changing pulse that synthesizes an edge timing of the sequential selection of the registers after the reset edge starts the sequential selection; and
a waveform means that outputs the level information for each portion of the waveform pattern to the pattern storing section for storage, in order, in each register of the sequential access memory,
wherein the sequential selection of the registers reads out the level information stored in the pattern storing section during a combined period of a space and a mark,
wherein the level information includes reference level information outputted by the waveform section for the reference pulse, and other level information outputted by the waveform section for the changing pulses, and
wherein selection of the registers by the reference and changing pulses reads out the reference level information stored in said pattern storing section, for each said reference pulse, and reads the other level information stored in said pattern storing section, following said reference level information, in order, for each said changing pulse.

* * * * *